United States Patent [19]

Murakami et al.

[11] Patent Number: 5,194,950
[45] Date of Patent: Mar. 16, 1993

[54] VECTOR QUANTIZER

[75] Inventors: Tokumichi Murakami; Koh Kamizawa; Atsushi Itoh; Yoshiaki Kato; Yuri Hasegawa; Kazuhiro Matsuzaki; Takahiro Fukuhara, all of Kanagawa, Japan

[73] Assignee: Mitsubishi Denki Kabushiki Kaisha, Tokyo, Japan

[21] Appl. No.: 316,020

[22] Filed: Feb. 27, 1989

[30] Foreign Application Priority Data

| Feb. 29, 1988 | [JP] | Japan | 63-46391 |
| Mar. 14, 1988 | [JP] | Japan | 63-61415 |
| Apr. 28, 1988 | [JP] | Japan | 63-108145 |
| May 11, 1988 | [JP] | Japan | 63-112602 |
| Jun. 6, 1988 | [JP] | Japan | 63-139655 |
| Jul. 27, 1988 | [JP] | Japan | 63-188801 |
| Nov. 26, 1988 | [JP] | Japan | 63-298724 |
| Jan. 13, 1989 | [JP] | Japan | 1-6801 |
| Jan. 13, 1989 | [JP] | Japan | 1-6807 |

[51] Int. Cl.⁵ .............................. H04N 7/137
[52] U.S. Cl. ............................ 358/133; 358/135; 358/136
[58] Field of Search ................ 358/133, 135, 136

[56] References Cited

U.S. PATENT DOCUMENTS

| 4,670,851 | 6/1987 | Murakami et al. | 358/136 |
| 4,710,812 | 12/1987 | Murakami et al. | 358/136 |
| 4,845,559 | 7/1989 | Labit | 358/133 |
| 4,853,778 | 8/1989 | Tanaka | 358/133 |
| 4,853,779 | 8/1989 | Hammer | 358/133 |

OTHER PUBLICATIONS

Robert M. Gray, "Vector Quantization", IEEE ASSP Magazine, Apr. 1984, pp. 4–29.
T. Murakami et al., "Dynamic Multistage Vector Quantization of Images", Electronics and Communication in Japan, Part 1, vol. 69, No. 3, Scripta Technica, Inc., 1986.
T. Murakami et al., "Vector Quantiser of Video Signals", Electronics Letters 11th, vol. 18, No. 23, Sep. 29, 1982, pp. 1005–1006.

*Primary Examiner*—Howard W. Britton
*Attorney, Agent, or Firm*—Bernard, Rothwell & Brown

[57] ABSTRACT

A vector quantizer which transmits the input vector of the time when the minimum distortion is larger than the preset distortion threshold value and stores such input vector into the second code book as the new quantizing representative vector for the use in the successive vector quantizing processes. Further, since the first and second code book constitute in the form of tree-structure, calculation for search may be executed at a high speed.

17 Claims, 34 Drawing Sheets

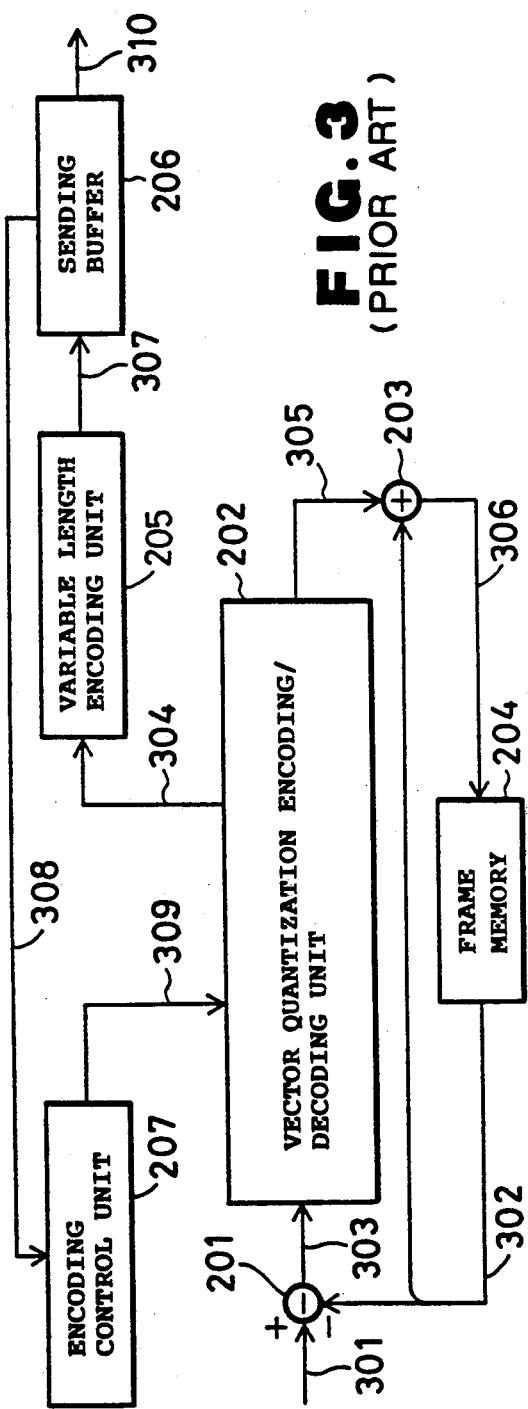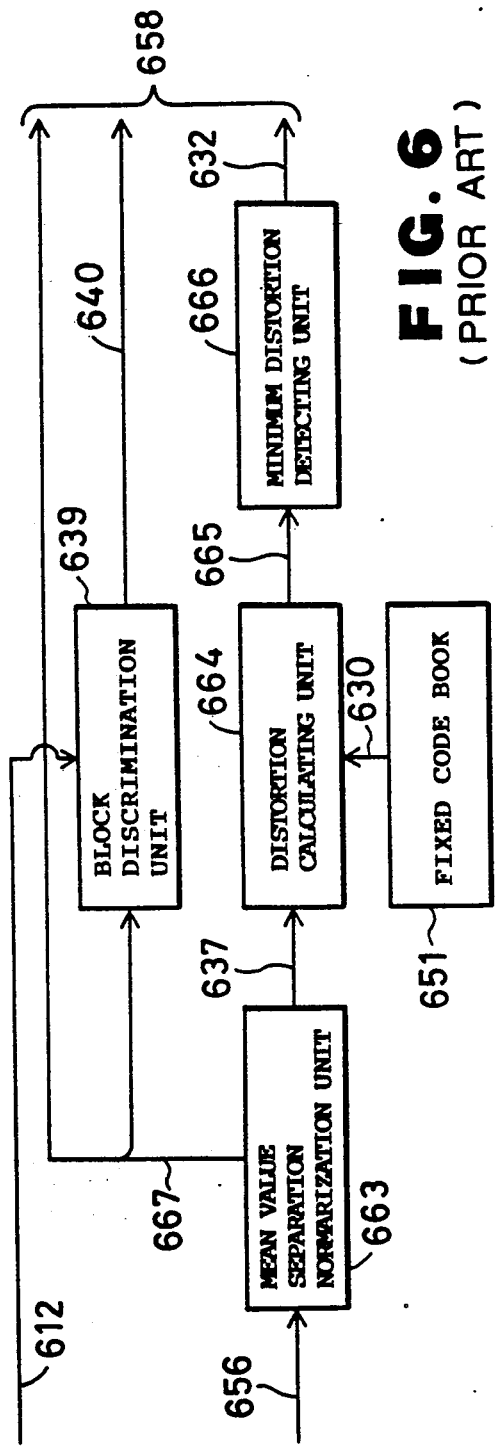

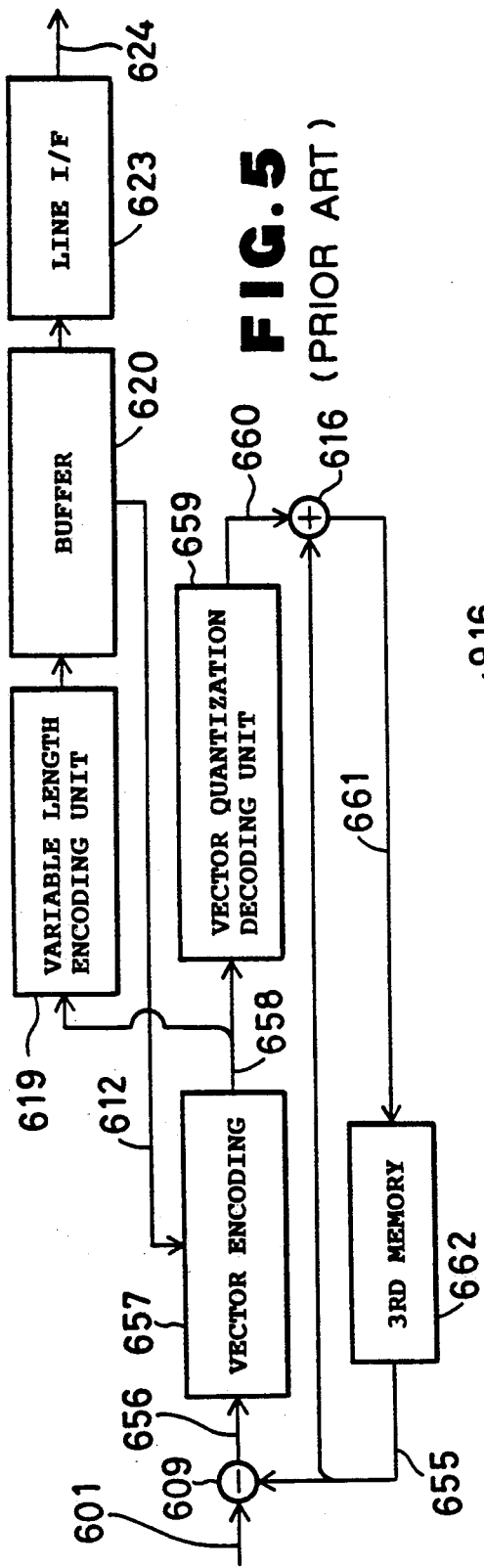
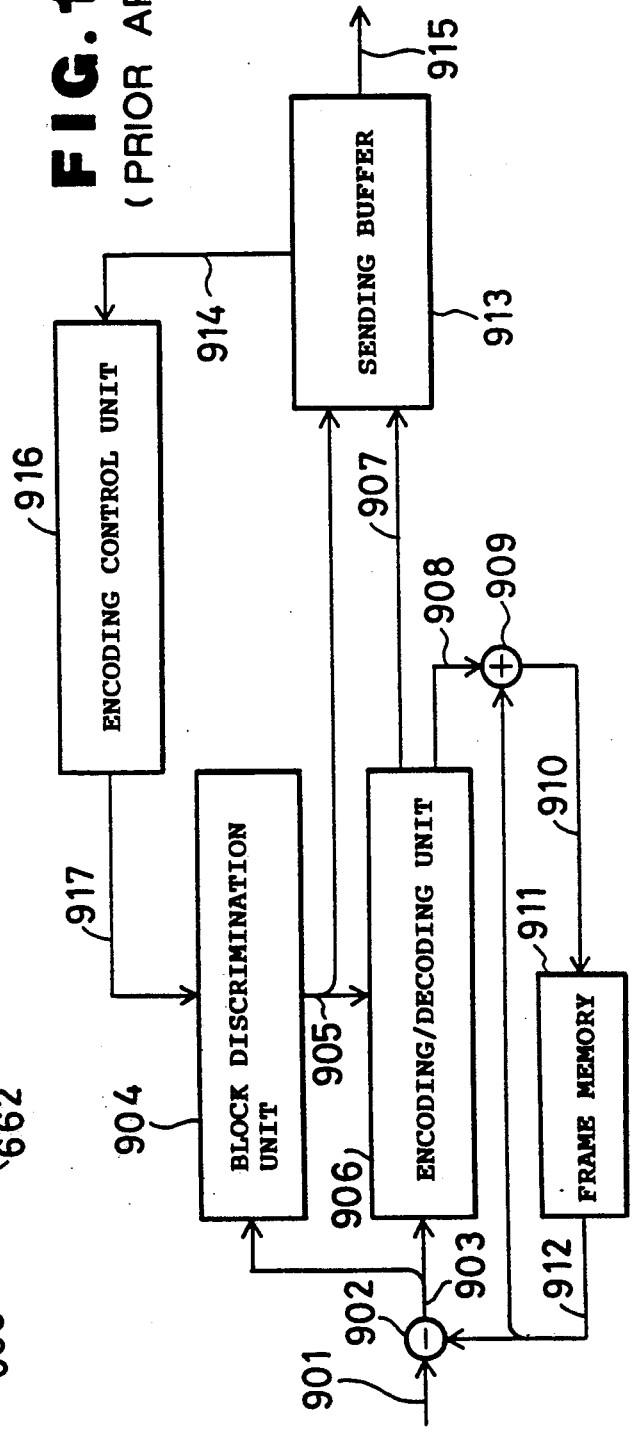
FIG. 5 (PRIOR ART)
FIG. 11 (PRIOR ART)

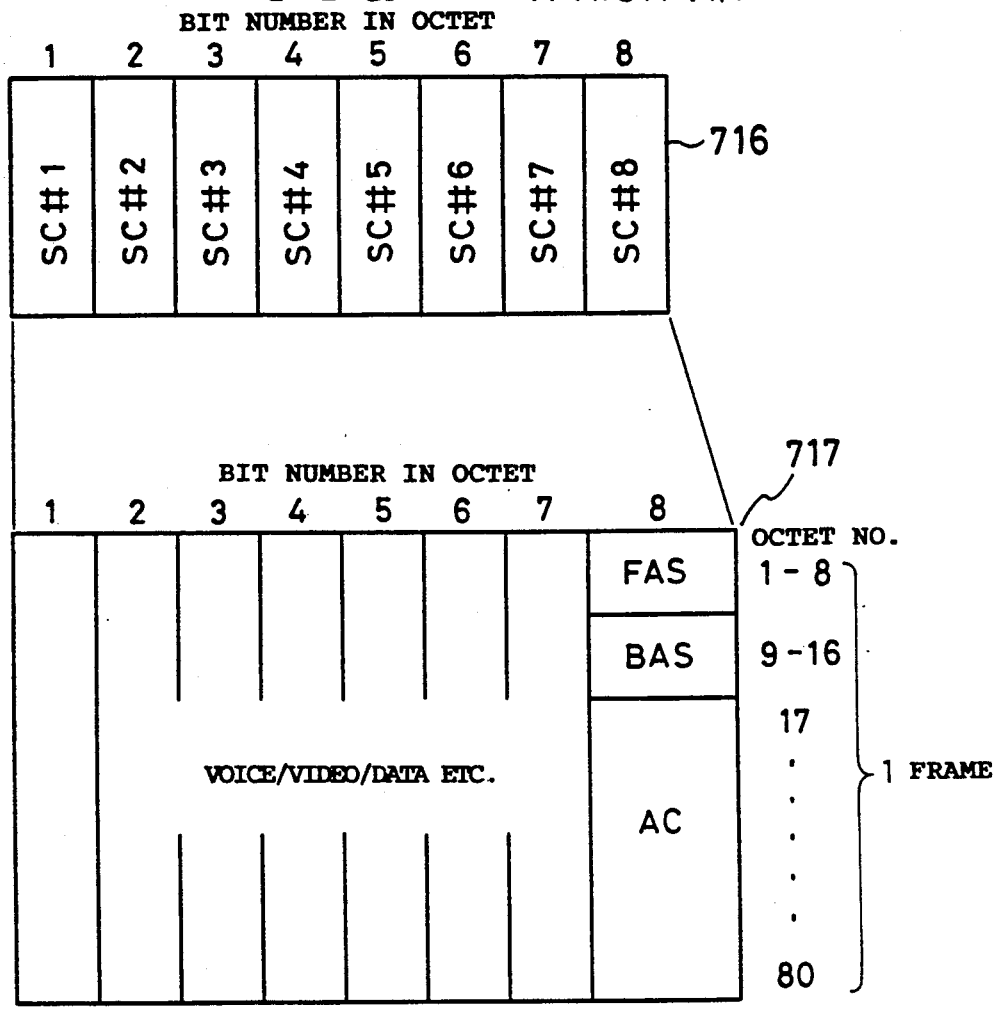

FIG. 9 (PRIOR ART)

| MULTIFRAME | SUB-MULTIFRAME | SUB-MULTIFRAME $M_j$ | CONTENT OF FAS IN EACH FRAME | | | | | | | |
|---|---|---|---|---|---|---|---|---|---|---|
| | | | 1 | 2 | 3 | 4 | 5 | 6 | 7 | 8 |
| | SUB MULTIFRAME 1 | 0 | R1 | 0 | 0 | 1 | 1 | 0 | 1 | 1 |
| | | 1 | 0 | 1 | A | E | C1 | C2 | C3 | C4 |
| | | 2 | R2 | 0 | 0 | 1 | 1 | 0 | 1 | 1 |
| | | 3 | 0 | 1 | A | E | C1 | C2 | C3 | C4 |
| | | 4 | R3 | 0 | 0 | 1 | 1 | 0 | 1 | 1 |
| | | 5 | 1 | 1 | A | E | C1 | C2 | C3 | C4 |
| | | 6 | R4 | 0 | 0 | 1 | 1 | 0 | 1 | 1 |
| | | 7 | 0 | 1 | A | E | C1 | C2 | C3 | C4 |
| | SUB MULTIFRAME 2 | 8 | R5 | 0 | 0 | 1 | 1 | 0 | 1 | 1 |
| | | 9 | 1 | 1 | A | E | C1 | C2 | C3 | C4 |
| | | 10 | R6 | 0 | 0 | 1 | 1 | 0 | 1 | 1 |
| | | 11 | 1 | 1 | A | E | C1 | C2 | C3 | C4 |
| | | 12 | R7 | 0 | 0 | 1 | 1 | 0 | 1 | 1 |
| | | 13 | R8 | 1 | A | E | C1 | C2 | C3 | C4 |
| | | 14 | R9 | 0 | 0 | 1 | 1 | 0 | 1 | 1 |
| | | 15 | R10 | 1 | A | E | C1 | C2 | C3 | C4 |

R1 – R10 : NOT USED '0'

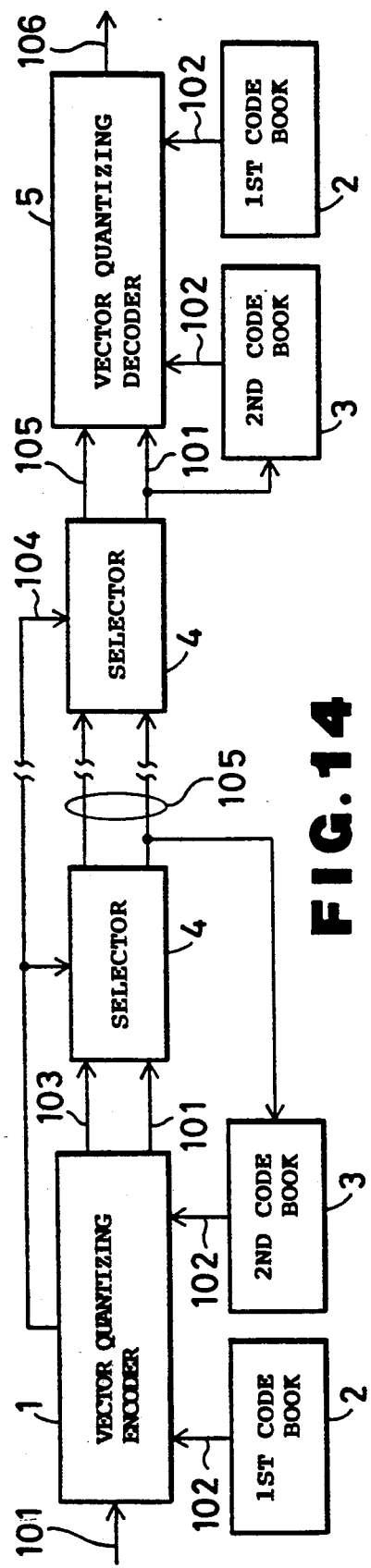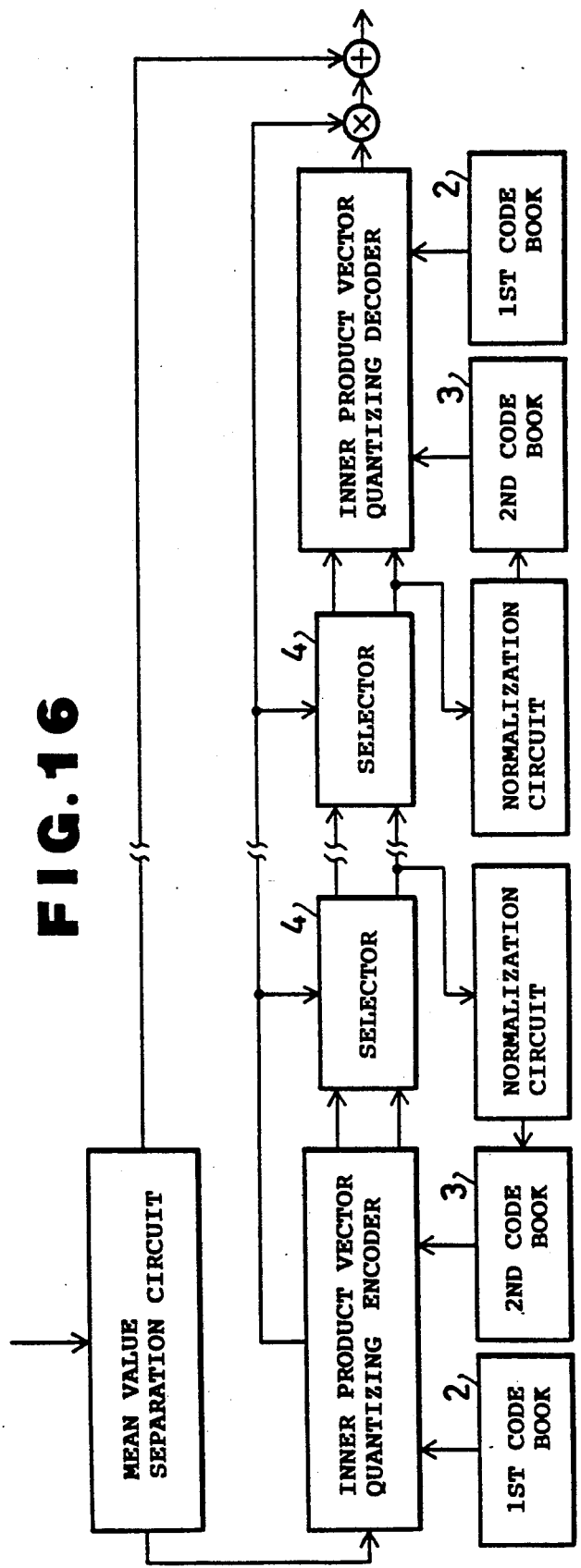
FIG. 14
FIG. 16

FIG. 15
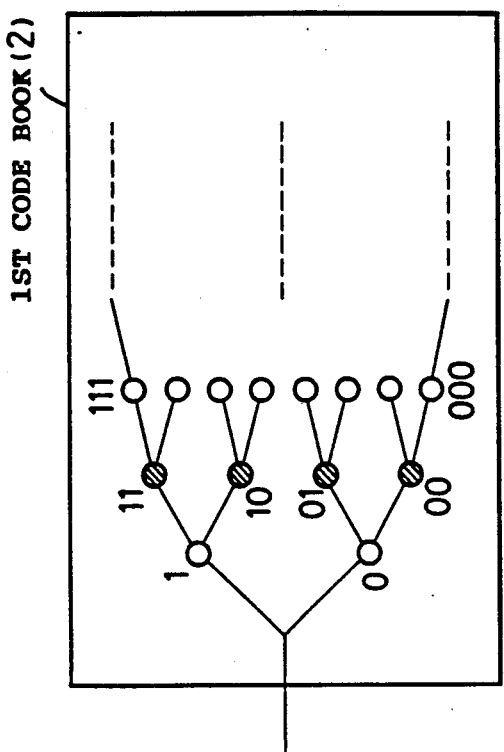
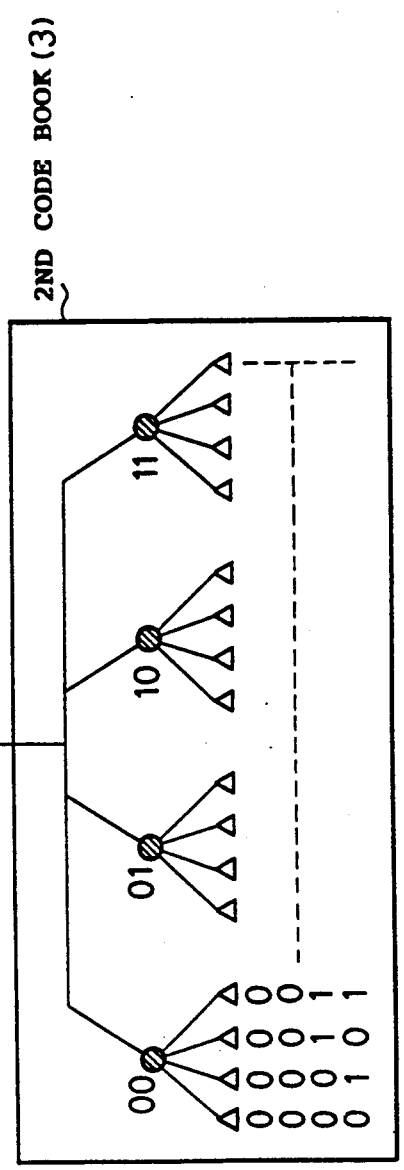
FIG. 18
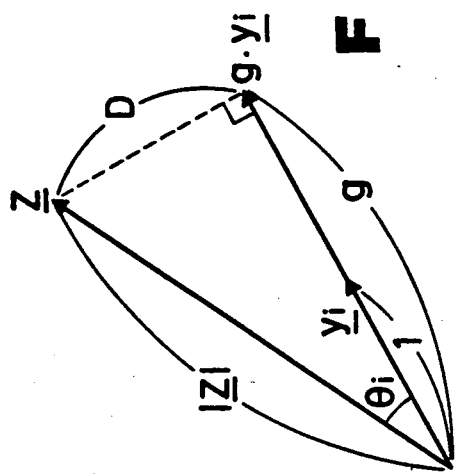
$\underline{Z}$ : MEAN VALUE SEPARATION INPUT VECTOR
$\underline{y_i}$ : NORMALIZATION OUTPUT VECTOR
$g$ : AMPLITUDE GAIN
$|\underline{Z}| = [\sum_{j=1}^{k} Z_j^2]^{1/2}$
$g = |\underline{Z}| \cos \theta_i$
$|\underline{y_i}| = [\sum_{j=1}^{k} y_{ij}^2]^{1/2} = 1$
$D^2 = |\underline{Z}|^2 - g^2$

INITIAL STAGE BLOCK $n_1 \times n_2 = 16 \times 16$

NEXT STAGE BLOCK $m_1 \times m_2 = 4 \times 4$

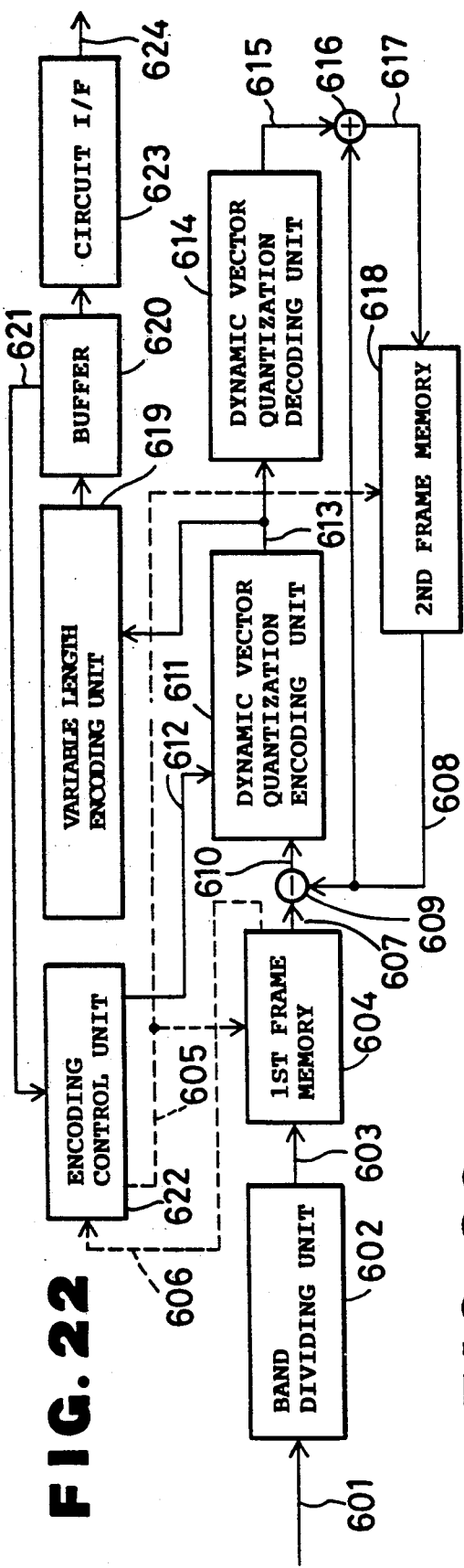
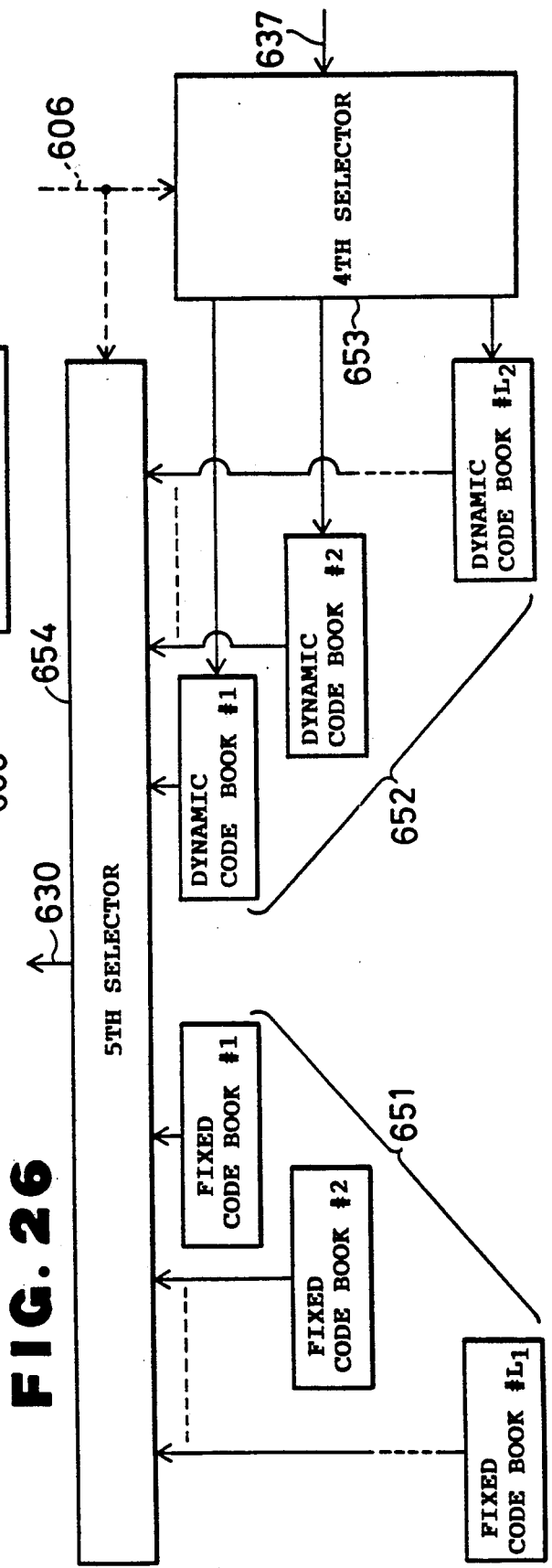

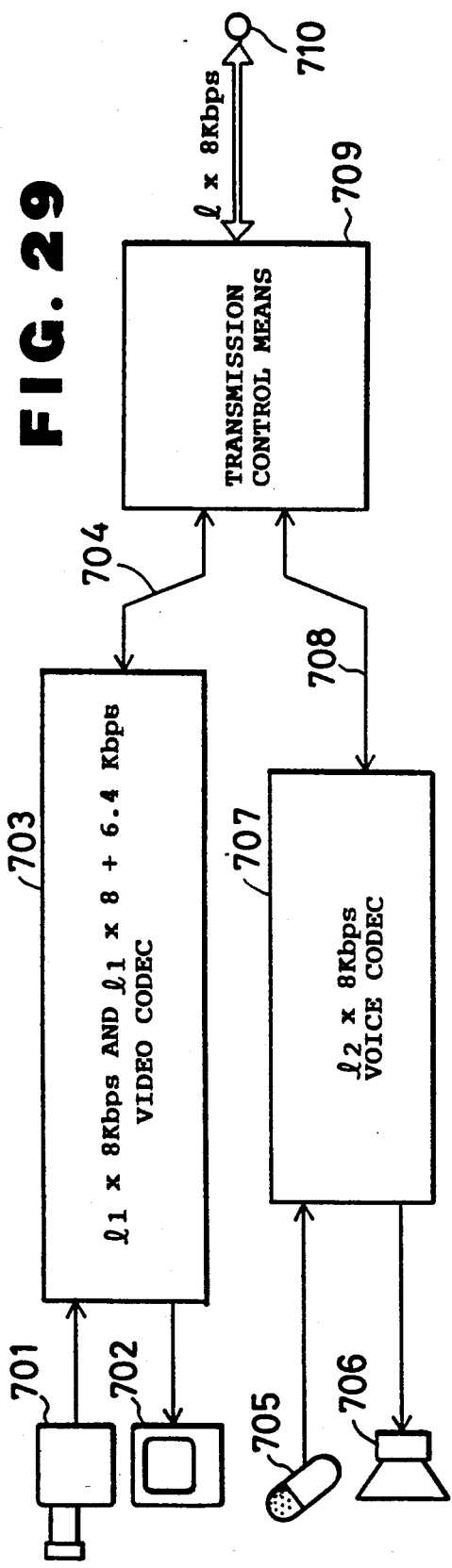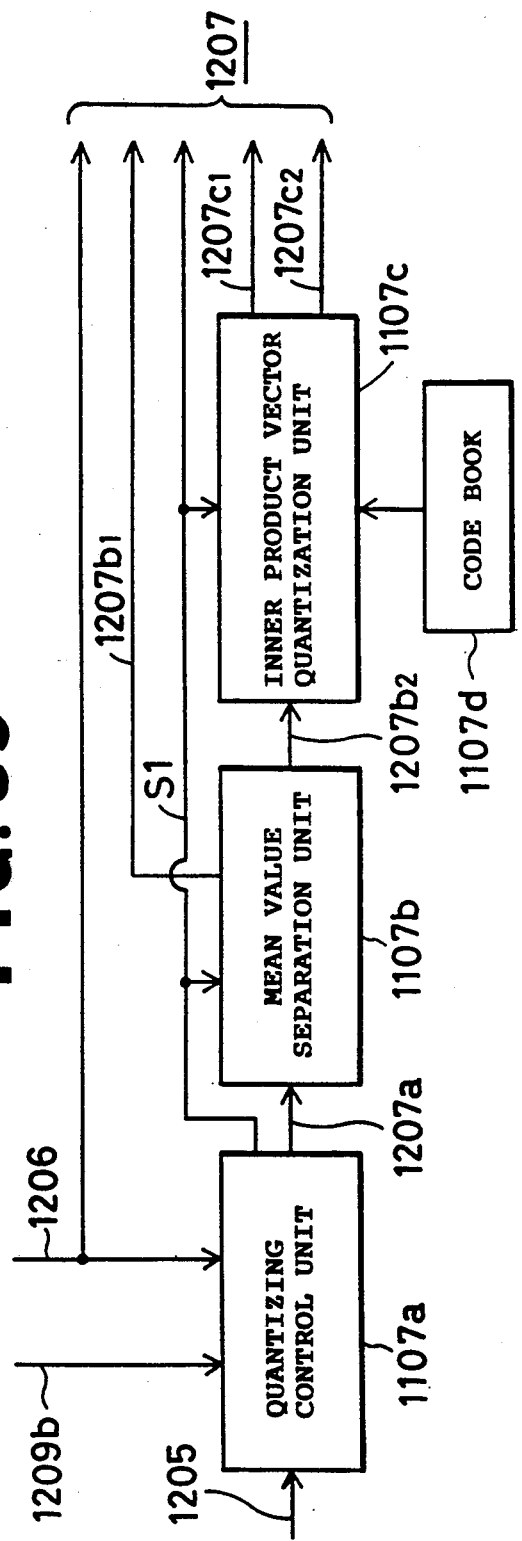

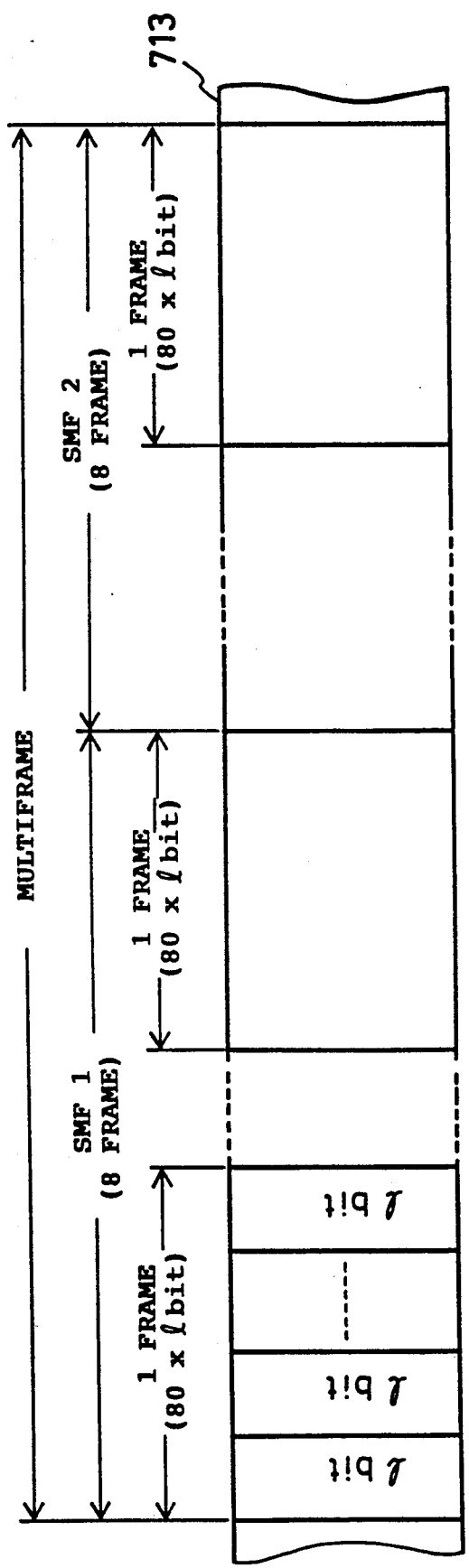

$$\bar{x} = a_1 x + \frac{a_2}{4}(B+D+E+G) + \frac{a_3}{4}(A+C+F+H)$$

$$(a_1 + a_2 + a_3 = 1)$$

| ENCODING ACCURACY | SMOOTHING PROCESS | FILTER COEFFICIENT | | |
|---|---|---|---|---|
| | | $a_1$ | $a_2$ | $a_3$ |
| LOW | STRONG | 0.5 | 0.25 | 0.25 |
| INTERMEDIATE | INTERMEDIATE | 0.75 | 0.125 | 0.125 |
| HIGH | WEAK | 1.0 | 0 | 0 |

| VALUE | (CHARACTERISTIC AMOUNT 1) INDEX NUMBER | | |
|---|---|---|---|
| --- | | | |
| k | $k_1$ | $k_2$ | $k_3$ |
| | $y/k_1$ | $y/k_2$ | $y/k_3$ |
| | --- | --- | --- |

| VALUE | (CHARACTERISTIC AMOUNT 2) INDEX NUMBER | | |
|---|---|---|---|
| --- | | | |
| $\ell$ | $\ell_1$ | $\ell_2$ | $\ell_3$ |
| | $y/\ell_1$ | $y/\ell_2$ | $y/\ell_3$ |
| | --- | --- | --- |

| VALUE | (CHARACTERISTIC AMOUNT P) INDEX NUMBER | | |
|---|---|---|---|
| --- | | | |
| m | $m_1$ | $m_2$ | $m_3$ |
| | $y/m_1$ | $y/m_2$ | $y/m_3$ |
| | --- | --- | --- |

APPEARANCE FREQUENCY : LESS →

FIG. 48

$k_n$ : INDEX NUMBER OF nTH QUANTIZATION VECTOR
( WITH CHARACTERISTIC VALUE OF )

$y/k_n$ : VALUE OF CHARACTERISTIC AMOUNT
AND nTH QUANTIZATION VECTOR

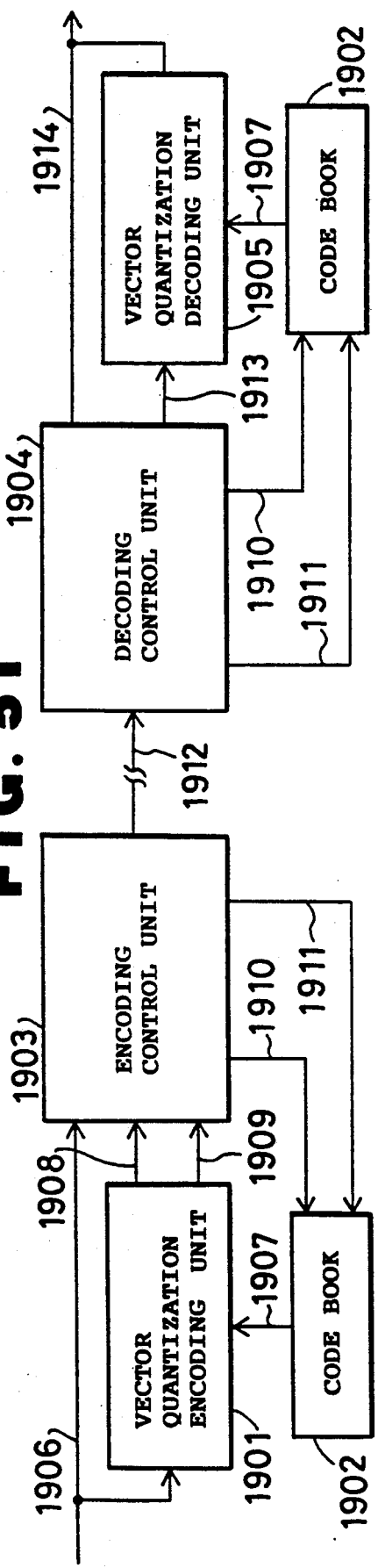

VECTOR QUANTIZER

BACKGROUND OF THE INVENTION

1. Field of the Invention

The present invention relates to a vector quantizer for encoding digital signal at a high efficiency.

2. Prior Art

FIG. 1 is a block diagram of the structure of vector quantizer of the prior art indicated in the Technical Report IT 85-61 of IECE Japan. In the same figure, 1 designates a vector quantizing encoder for vector-quantizing input vectors 101 and outputting indices of quantizing representative vector as the encoded data 105; 2 designates a codebook for storing a plurality of quantizing a representative vectors 102 and 5 designates a vector quantizing decoder for recovering, as the decoded vectors 106, the quantizing representative vectors corresponding to said indices given as the encoded data 105.

Operation will then be explained. The k-dimensional input vector 101 is defined as $\underline{X} = [X_1, X_2, \ldots, X_k]$ and the quantizing representative vector $\underline{Y}_i = [y_1, y_2, \ldots, y_k]$ is set to $[Y] = [\underline{Y}_1, \underline{Y}_2, \ldots, \underline{Y}_N]$ 102. The vector quantizing encoder 1 determines the quantizing representative vector $\underline{Y}_i$ which minimizes the distortion di from the input vector $\underline{X}$ defined by the following formula.

$$di = \|\underline{X} - \underline{Y}_i\|^2 = \sum_{j=1}^{k} (X_j - Y_{ij})^2$$

$$di < d_l \text{ for all } l \neq i$$

As the encoding data 105, the index i for identifying the quantizing representative vector $\underline{Y}_i$ is output and transmitted.

The vector quantizing decoder 5 reads the quantizing representative vector $\underline{Y}_i$ corresponding to the index i given by the encoding data 105 to be input from the codebook 2 and regenerates decoding vector $\hat{\underline{X}}$ 106.

$$\hat{\underline{X}} = \underline{Y}_i$$

In the course of vector quantization described, the tree-searched method indicated hereunder is used for high speed arithmetic operation during the search of quantizing representative vector. FIG. 2 is an example of quantizing representative vectors arranged in the form of binary tree. Preceding design determines that the higher vector is the representative vector of the lower vector.

In each stage, the procedures for selecting a vector from the two vectors where distortion from the input vector $\underline{X}$ becomes smaller are sequentially executed from the highest location to the lowest location to determine the final quantizing representative vector. In the binary tree, '0' or '1' is assigned depending on the branching direction from respective nodes and a stream of binary numbers representing a route up to the quantizing representative vector of the lowest location corresponds to the index i of the quantizing representative vector.

Since the vector quantizer of the prior art is constituted as described, if the number of orders of vector is high, it has been difficult to perfectly optimize a limited number of quantizing representative vectors stored previously within the codebook for all information source input vectors and also it has been a problem to ease excessive quantization error generated in irregular input vectors.

Further, FIG. 3 is a block diagram illustrating constitution of an interframe vector quantization encoding and decoding apparatus in the prior art disclosed, for example, in Murakami et al. "Vector quantization system interframe encoding simulation", report No. 1175 in 1983 whole country symposium of the Institute of Electronics and Communication Engineers of Japan. In FIG. 3, numeral 201 designates a subtractor which performs subtraction between input video signal series 301 and interframe forecast video signal series 302 and outputs interframe difference signal series 303, and numeral 202 designates a vector quantization encoding and decoding unit which inputs the interframe forecast video signal series 303 and encoding control parameter 309 and outputs encoding data 304 and decoding interframe difference signal series 305.

Numeral 203 designates an adder which adds the interframe forecast video signal series 302 and the decoding interframe difference signal series 305, and outputs decoding video signal series 306.

Numeral 204 designates a frame memory which supplies the decoding video signal series 306 with frame delay, and forms the interframe forecast video signal series.

Numeral 205 designates a variable length encoding unit which inputs the encoding data 304 and outputs variable length encoding data 307, and numeral 206 designates a transmission buffer for the speed smoothing which inputs the variable length encoding data 307 and outputs encoding control command signal 308 and transmission data 310.

Numeral 207 designates an encoding control unit which inputs the encoding control command signal 308, and outputs encoding control parameter 309 to the vector quantization encoding and decoding unit 202.

The vector quantization encoding and decoding unit 202 is constituted as shown in FIG. 4. In FIG. 4, numeral 224 designates a mean value separation normalization unit which inputs the interframe difference signal series 303, and outputs separated mean value 401, amplitude gain 402 and normalization vector 501.

Numeral 210 designates a read only code book which stores a plurality of normalization output vectors 411, and numeral 225 designates a vector quantization encoder which selects normalization output vector 411 so as to minimize distortion of the normalization vector 501, and outputs index 409 of the normalization output vector.

Numeral 214 designates a block discrimination unit which inputs encoding control parameter 309, mean value 401 and amplitude gain 403, and outputs block discrimination data 404.

Numeral 215 designates a mean value encoder which inputs encoding control parameter 309 and mean value 401, and outputs mean value encoding data 406.

Numeral 216 designates an amplitude gain encoder which inputs encoding control parameter 309 and amplitude gain 403, and outputs amplitude gain encoding data 406.

Numeral 217 designates a mean value decoder which inputs block discrimination data 404 and mean value encoding data 405, and outputs decoded mean value 407.

Numeral 218 designates an amplitude gain decoder which inputs block discrimination data 404 and amplitude gain encoding data 406, and outputs decoded amplitude gain 408.

The block discrimination data 404, the mean value encoding data 405, the amplitude gain encoding data 406 and the index 409 become the encoding data 304 and are transmitted to the variable length encoding unit 205 in FIG. 3.

Numeral 226 designates a vector quantization decoder which inputs index 409 and normalization output vector 411 outputted from the code book 210, and outputs selected output vector 502, and numeral 227 designates an amplitude reproduction mean value adding unit which inputs the output vector 502 and outputs decoding interframe difference signal series 305.

Next, operation will be described. Input video signal series 301 subtracts interframe forecast video signal series 302 by the subtractor 201 and is converted into interframe difference signal series 303. Since the interframe difference signal series 303 becomes small in power of the whole signal in comparison to the original signal, the encoding with less encoding error is possible in the same encoding quantity.

The interframe difference signal series 303 is subjected to high-efficiency encoding and decoding operation in the vector quantization encoding and decoding unit 202 as hereinafter described, thereby encoding data 304 and decoding interframe difference signal series 305 can be obtained.

In the adder 203, the interframe forecast video signal series 302 and the decoding interframe difference signal series 305 are added thereby decoding video signal series 306 can be obtained.

The decoding video signal series 306 in stored in the frame memory 204 and supplied with delay by prescribed frame time, hereby interframe forecast video signal series 302 for next encoding is formed.

On the other hand, encoding data 304 is converted by the variable length encoding unit 205 into suitable variable length code data (code word) and stored in the transmission buffer 206, and then subjected to speed smoothing and transmitted as transmission data 310 at a constant speed.

Also in the transmission buffer 206, total of the code quantity corresponding to one frame is estimated as encoding control command signal 308 (hereinafter referred to as "encoding information generating quantity") and supplied to the encoding control unit 207.

Based on the encoding information generating quantity 308 and encoding mode signal such as encoding speed, reproduction picture quality or the like fixedly selected in accordance with command from the outside, the encoding control unit 207 adaptively controls encoding control parameter 309 used in the vector quantization encoding and decoding unit 202.

High-efficiency encoding and decoding operation in the vector quantization encoding and decoding unit 202 will be described referring to FIG. 4. Input signal to be subjected to vector quantization is interframe difference signal series 303. The interframe difference signal series 303 is converted into block (vector) in the mean value separation normalization unit 224, and subjected to mean value separation normalization processing.

If the blocked input signal series is expressed by $\underline{\epsilon} = [\epsilon_1, \epsilon_2, \ldots, \epsilon_k]$ ($k = m_1 \times m_2$, $m_1$, $m_2$:natural number), the mean value separation normalization processing can be described, for example, by following formulas.

$$\text{mean value: } m = \frac{1}{k} \sum_{j=1}^{K} \epsilon_j$$

$$\text{amplitude gain: } g = \left[ \sum_{j=1}^{K} (\epsilon_j - m)^2 \right]^{\frac{1}{2}}$$

$$\text{mean value separation normalization: } x_j = (\epsilon_j - m)/a$$

Since all normalization vectors $\underline{x} = [x_1, x_2, \ldots, x_K]$ 301 obtained through the above-mentioned process are distributed on the unit super spherical surface of the k-dimensional signal space, the vector quantization efficiency can be improved in comparison to the case that input vector s before the mean value separation normalization is subjected to vector normalization directly.

A plurality of normalization output vectors $\underline{y}_l$ 411 defined as quantization representative points to the normalization vector $\underline{x}$ are previously stored in the code book 210.

The normalization output vector $\underline{y}_l$ is normalized under condition that $$\frac{1}{k} \sum_{j=1}^{K} y_{lj} = 0, \quad |\underline{y}_l| = \left[ \sum_{j=1}^{K} y_{lj}^2 \right]^{\frac{1}{2}} = 1$$

In the vector quantization encoder 225, the normalization output vector $\underline{y}_i$ is selected so that distortion to the normalization vector $\underline{X}$ becomes minimum, and index i 309 to discriminate the normalization output vector is outputted. That is, calculation of following formulas is executed.

$$\text{distortion: } d = d(\underline{x}, \underline{y}_l) = \sum_{j=1}^{K} (x_j - y_{lj})^2 \text{ or } \sum_{j=1}^{K} |x_j - y_{lj}|$$

$\underline{y}_l = [y_{l1}, y_{l2}, \ldots, y_{lk}]$ is normalization output vector $[Y] = [\underline{y}_1, \underline{y}_2, \ldots, \underline{y}_l, \ldots \underline{y}_N]$ is code book
vector quantization $Q$: $Q(\underline{x}) = \underline{y}_i$ wherein d $(\underline{x}, \underline{y}_j) < $ d $(\underline{X}, \underline{y}_l)$ ($\forall_{l \neq i}$)

On the other hand, the separated mean value m 401 and the amplitude gain g 403 are individually made high efficiency by the mean value encoder 215 and the amplitude gain encoder 216 respectively.

Encoding characteristics such as quantization bit number, quantization width or the like of a scalar quantizer used in the mean value encoder 215 are adaptively controlled based on encoding control parameter 309.

The mean value m 401 and the amplitude gain g 403 are used together with the encoding control parameter 309 for the block discrimination in the block discrimination unit 214.

That is, comparison of amount with threshold value Th corresponding to the encoding control parameter 309 is executed in accordance with following formulas, and block discrimination data v 404 is determined.

|m| ≦ Th and g ≦ Th ... v = 0 (invalid block)

|m| > Th or g > Th ... v = 1 (valid block)

Regarding the valid block, the mean value encoding data 405 corresponding to the block, the amplitude gain encoding data 406, the index 409 together with the block discrimination data 404 are outputted as encoding data 304.

Further, using mean value m 407 and amplitude gain 408 $\hat{g}$ decoded respectively through the mean value decoder 217 and the amplitude gain decoder 218 and normalization output vector $\underline{y_i}$ 502 corresponding to the index 409 read from the code book 210 in the vector quantization decoder 226, following local decoding operation is executed in the amplitude reproduction mean value adding unit 227 thereby decoding vector $\hat{s}$ comprising decoding interframe difference signal 305 can be obtained.

$$\hat{e}_j = \hat{g} \cdot y_{ij} + \hat{m}$$

$$\underline{\hat{e}} = [\hat{e}_1, \hat{e}_2, \ldots \hat{e}_k]$$

Regarding the invalid block, any interframe difference signal value of the block is treated as 0. Consequently, the outputted encoding data 304 may be the block discrimination data 404 only, and the mean value encoding data 405, the amplitude gain encoding data 406 and the index 409 need not be transmitted.

Also in the mean value decoder 217 and the amplitude gain decoder 218, both the decoded mean value $\hat{m}$ 407 and the amplitude gain $\hat{g}$ 408 are outputted as 0 thereby the decoding vector $\underline{\hat{e}}$ is given by $$\underline{\hat{e}} = [0, 0, \ldots, 0]$$

Since the interframe vector quantization encoding and decoding apparatus in the prior art is constituted as above described, there have been problems in that the adaptive encoding processing corresponding to variation of property of the input image cannot be performed effectively, and that the information generating quantity is extremely increased when the block discrimination threshold value is made small to improve the reproduction picture quality.

Still further, FIG. 5 is a block diagram illustrating an interframe vector quantizer in the prior art disclosed, for example, in Murakami et al. "Vector quantization system interframe encoding simulation", report No. 1175 in 1983 whole country symposium of the Institute of Electronics and Communication Engineers of Japan.

In FIG. 5, numeral 601 designates input video signal series, numeral 655 designates interframe forecast signal, numeral 609 designates a subtractor which performs subtraction between the input video signal series 1 and the interframe forecast signal 655, numeral 656 designates interframe difference signal outputted from the subtractor 609, numeral 657 designates a vector quantization encoding unit to which the interframe difference signal 656 is inputted, numeral 658 designates encoding data outputted from the vector quantization encoding unit 657, numeral 659 designates a vector quantization decoding unit to which the encoding data 658 is inputted, numeral 660 designates interframe decoding difference signal outputted from the vector quantization decoding unit 659, numeral 616 designates an adder which adds the interframe decoding difference signal 660 and the interframe forecast signal 655, numeral 661 designates decoding video signal series outputted from the adder 616, numeral 662 designates a third frame memory which supplies the decoding video signal series 661 with frame delay and forms the interframe forecast signal 655, numeral 619 designates a variable length encoding unit to which the encoding data is inputted, numeral 620 designates a buffer which is connected to the variable length encoding unit 619 and performs the speed smoothing, numeral 612 designates threshold value which is transmitted from the buffer 620 to the vector quantization encoding unit 657 and used for the block discrimination, numeral 623 designates a circuit interface (hereinafter referred to as "circuit I/F") connected to the buffer 620, and numeral 624 designates transmission signal outputted from the circuit I/F 623.

FIG. 6 is a block diagram illustrating constitution example of the vector quantization encoding unit 657. In FIG. 6, numeral 663 designates a mean value separation normalization unit to which the interframe difference signal 656 from the subtractor 609 is inputted, numeral 637 designates normalization vector outputted from the mean value separation normalization unit 663, numeral 651 designates a fixed code book which stores normalization output vector, numeral 630 designates the normalization output vector outputted from the fixed code book 651, numeral 664 designates a distortion calculating unit to which the output vector 630 is inputted and which estimates distortion with the normalization vector 637, numeral 665 designates distortion estimated by the distortion calculating unit 664, numeral 666 designates a minimum distortion detecting unit which detects minimum from the distortion 665, numeral 632 designates index of output vector to give the minimum distortion outputted from the minimum distortion detecting unit 666, numeral 667 designates mean value and amplitude separated in the mean value separation normalization unit 663, numeral 639 designates a block discrimination unit to which the mean value and the amplitude and the threshold value 612 from the buffer 620 are inputted, and numeral 640 designates block discrimination information outputted by the block discrimination unit 639. The encoding data 658 outputted from the vector quantization encoding unit 657 is constituted by the block discrimination information 640, the index 632 of the output vector to give the minimum distortion, and the mean value and the amplitude 667 separated in the mean value separation normalization unit 663.

Next, operation will be described. Input video signal series 601 subtracts interframe forecast signal 55 by the subtractor 609 and is converted into interframe difference signal 656. Since the interframe difference signal 656 becomes small in power in comparison to the original signal, the encoding with little encoding error is possible. The interframe difference signal 656 is encoded in the vector quantization encoding unit 657 (The encoding system will be hereinafter described.). Then the threshold value 612 from the buffer 620 is used as parameter. The encoding data 658 encoded in the vector quantization encoding unit 657 is decoded in the vector quantization decoding unit 659, thereby the interframe decoding difference signal 660 can be obtained. In the adder 616, the interframe decoding difference signal 660 and the interframe forecast signal 655 are added thereby the decoding video signal series 661 can be obtained. The decoding video signal series 661 is once stored in the third frame memory 662 and supplied with frame delay thereby the interframe forecast signal 655 is formed. On the other hand, the encoding data 658 outputted from the vector quantization encoding unit 657 is also inputted to the variable length encoding unit 619 and subjected to variable length encoding, and further stored temporarily in the buffer 620 and subjected to the speed smoothing processing, and then transmitted as transmission signal 624 through the circuit I/F 623. Also in the buffer 620, the threshold value 612 proportional to the storage quantity of the variable length encoded data is outputted and supplied to the vector quantization encoding unit 657 thereby the information generating quantity is controlled.

Next, encoding and control of the information quantity in the vector quantization encoding unit 657 will be described. Input signal to be subjected to vector quantization is the interframe difference signal 656. The interframe difference signal 656 is converted into block (vector) in the mean value separation normalization unit 663, and subjected to mean value separation normalization processing and outputted as the normalization vector 637. If the blocked input signal is made $\underline{S}=[s_1, s_2, \ldots, s_K]$ the mean value separation normalization processing can be described, for example, by following formulas.

$$\text{mean value: } m = K^{-1} \sum_{j=1}^{K} s_j$$

$$\text{amplitude: } g = K^{-1} \sum_{j=1}^{K} |s_j - m|$$

$$\text{mean value separation normalization: } x_j = (s_j - m)/g$$

In the normalization vector $\underline{X}=[x_1, x_2, \ldots, x_K]$ obtained as above described, the scalar quantity being the mean value and the amplitude is separated thereby the probability distribution is made uniform in comparison to the vector $\underline{S}$ before the mean value separation normalization and efficiency of the vector quantization as hereinafter described can be improved. Distortion between the normalization vector 637 and the normalization output vector 630 read from the fixed code book 651 is estimated in the distortion calculating unit 664. In the minimum distortion detecting unit 666, the minimum value among the distortion 665 between the normalization output vector 630 stored in the fixed code book 651 and the inputted normalization vector 637 is detected, and the index 632 of the output vector to give the minimum distortion is outputted. This process is the vector quantization. This is expressed by following formulas.

$$\text{distortion: } D = d(\underline{X}, \underline{y_i}) = \sum_{j=1}^{K} |X_j - y_{ij}|$$

(where, $\underline{y_i} = [y_{i1}, y_{i2}, \ldots, y_{iK}]$ is normalization output vector
$Y = y_1, y_2, \ldots, y_i, \ldots y_N$ is code book content)
vector quantization: $Q(\underline{X}) = y_i$
wherein $d(\underline{X}, \underline{y_i}) < d(\underline{X}, \underline{y_m})$ for $\forall m \neq i$ In this case, the encoding processing is image from $\underline{X}$ to i, and image from i to $\underline{y_j}$ (read of the fixed code book 651) becomes decoding processing. i corresponds to the index 632. On the other hand, the mean value and the amplitude 667 are used for the block discrimination together with the threshold value 612 in the block discrimination unit 639. If the threshold value 612 in the block discrimination unit 639. If the threshold value 612 in the block discrimination unit 639. If the threshold value 612 is made Th, the block discrimination is expressed, for example, by following formulas.

$|m| \leq \text{Th and } g \leq \text{Th} \ldots$ invalid block $|m| > \text{Th or } g > \text{Th} \ldots$ valid block Regarding the invalid block, interframe difference signal of the block is treated as 0. Consequently, the mean value and the amplitude 667 and the index 632 need not be transmitted as the encoding data 658 then. The encoding data 658 outputted from the vector quantization encoding unit 657 comprises the mean value and the amplitude 667, the block discrimination signal 640 and the index 632. However, in the case of the invalid block, since the block discrimination signal 640 only has meaning, control of the information generating quantity becomes possible by the threshold value 612.

Since the interframe vector quantizer in the prior art is constituted as above described, there have been problems in that the input video signal series with low space frequency and being sensitive in the visual sense and the input video signal series with high space frequency and being insensitive in the visual sense must be encoded without distinction and therefore the effective encoding taking in consideration of the visual sense characteristics is difficult.

Still further, FIG. 7 indicates a frame structure of the multimedia data transmission system of the prior art indicated in the Technical Report ICS87-7 of IECE Japan, 1987, by Juji Matsumoto, entitled "Structure and Application of Interface in 64 Kbps System Multimedia Communication System". In the same figure, 716 designates octet frame comprised of eight subchannels of 1 bit having the repetition frequency of 8 kHz; 717 designates transmission frame comprised of 80 octet frames 716.

FIG. 8 is a table for explaining assignment of frame synchronous signal (FAS) in FIG. 7.

FIG. 9 is a table embodying content of frame synchronous signal (FAS) in the multiframe formed by 16 transmission frames 717 in FIG. 8.

FIG. 10 is a profile for sending the transmission frame shown in FIG. 8 to the transmission path with the bit rate of 64 Kbps. In this figure, 718 designates a bit string to be sent to the 64 Kbps transmission path.

Operation will then be explained. In FIG. 8, the octet frame 716 has the 8-bit length. The period $T_{oct}$ of the octet frame 716 in case it is sent to the line with transmission rate of 64 Kbps is given by $T_{oct} = 64 \text{ Kbps}/8\text{-bit} = 8 \text{ kHz}$ and transmission capacity $C_s$ per subchannel of 1 bit is indicated by $C_s = 1 \text{ bit} \times T_{oct} = 8 \text{ Kbps}$ Namely, in case the subchannel in the octet frame 716 is individually assigned to the voice, video signal and data, each assigning rate becomes an integer time of 8 Kbps. It provides an advantage that matching with voice encoding and decoding apparatus (voice codec) usually having the sampling frequency of 8 kHz can be obtained easily. The transmission frame 717 is formed by 80 octet frames 716 with the frame bits occupying the 8th subchannel (service channel) in the octet frame 716 for identifying the subchannel in the octet frame 716 and also identifying assignment of subchannel to each media. The 8th subchannel (service channel) in the transmission frame 716 makes a cycle in use in the 80 octet frames 716.

The 8th subchannel (service channel) is formed by 8-bit frame synchronous signal FAS, 8-bit rate assigning signal BAS and 64-bit application channel AC. A content shown in FIG. 8 is arranged as the frame synchronous pattern in the FAS to decide the frame synchronization and the multiframe synchronization formed by collecting 16 transmission frames 717. In the receiving side, the synchronization of transmission frame 717 is first set by detecting unique pattern. Next, the multiframe synchronization is set on the basis of the Hi bit shown in FIG. 8. FIG. 9 is a table indicating content of Mi bit indicated in FIG. 8 and the unique pattern and additional information are arranged by assigning 16 bits to the Mi bit in the one multiframe.

BAS in the transmission frame 717 is dynamically changing the assigning information for each of 8 transmission frames SMF1, FMS2 717 which is equal to ½ of the multiframe shown in FIG. 9 and the same BAS information is transmitted 8 times in total, with each transmission directed to the transmission frame 717 of SMF1 and SMF2. In the receiving side, an error protecting means for identifying bit rate assignment in the next SMF based on the BAS information which is matched in content for 5 times or more among 8 times in total is applied.

The application channel AC is assigned to a command data for inter-terminal negotiation during the initial setting but it is assigned to user data during communication for effective use of lines. The bit capacity $CA_c$ of AC is given according to the following relation.

$$CA_c = T_{oct} \times 64/80 = 64 \text{ Kbps}$$

FIG. 10 shows practical structure of the transmission frame 717 to be transmitted to the 64 Kbps line in accordance with the above description.

The transmission frame structure is based on the bit rate assignment for each subchannel having the capacity of 8 Kbps and it is apparent that this frame structure cannot directly be applied to the 56 Kbps line which is generally employed in the US or to the 32 Kbps line which is often used for the communication networks in the private companies.

Since the multimedia data transmission system of the prior art has been constituted as described above, it is difficult to apply this system to the line of $1 \times 8$ Kbps (1 is an integer of 1 or larger). For instance, there is a problem that amount of H/W increases and transmission capacity cannot be used effectively for the necessity of setting individual frame formats corresponding to each transmission rate in order to provide the function suitable for the $1 \times 8$ Kbps line with the same apparatus.

Still further, FIG. 11 is a block diagram indicating a configuration of an interframe encoding apparatus of the prior art using an encoding control system, introduced in the Technical Report CS85-3 of IECE Japan, 1986 by Murakami, Itoh and Kamizawa, entitled "Colored Dynamic Video Signal Transmission System for TV Conference".

In this figure, 902 designates a subtractor for making subtraction between input video signal series 901 and a preceding frame recovery video signal series 912 and outputting an interframe difference signal series 903. 906 designates an encoding and decoding means (CODEC) for inputting an interframe difference signal series 903 and a block recognition data 905 and outputting an encoding data 907 and an interdecoded frame difference signal series 908.

In addition, 909 designates an adder for adding such preceding frame recovery video signal series 912 and interdecoded frame difference signal 908 and outputting a recovered video signal series 910.

911 designates a frame memory for storing such recovered video signal series 910 as much as one frame.

913 designates a sending buffer for inputting an encoding data 907 to obtain amount of information generated and outputting an encoding control signal 914 and a sending data 915.

916 designates an encoding control means for inputting an encoding control signal 914 and outputting encoding control parameter 917 to a block discrimination means 904.

904 designates a block discrimination means for inputting an encoding control parameter 917 and an interframe difference signal series 903 and outputting a block discrimination data 905.

FIG. 12 is an example of structure of the block discrimination means 904 shown in FIG. 11.

1001 designates a threshold value control means for outputting a threshold value Th 1002 corresponding to the encoding control parameter 917 and 1003 designates a block decision means for deciding blocks depending on the threshold value Th 1002.

Operation will then be explained.

The input video signal series 901 subtracts the preceding frame recovery video signal series 912 with a subtractor 902 and converts it into an interframe difference signal series 902. This interframe difference signal series executes more minute encoding with less encoding error in the same amount of encoding since the total signal power thereof is smaller than the original signal.

The interframe difference signal series 903 is encoded and decoded with high performance in the codec 906 in order to obtain the encoded data 907 and inter-decoded frame difference signal series 908.

The adder 909 addes the preceding frame recovery video signal series 912 and inter-decoded frame difference signal series 908 to obtain a recovered video signal series 910.

This recovered video signal series 910 is stored in the frame memory 911 to give delay of the predetermined frame period and form preceding frame recovery video signal series for the encoding of next frame.

Meanwhile, the encoding data 907 is once stored in the sending buffer 913 and is then transmitted as the sending data 915.

Moreover, the sending buffer 913 obtains a total sum of the amount of codes as much as one frame as the encoding control signal 914 (amount of information generated) and then supplies it to the encoding control means 916.

With such amount of information generated 914 and instruction from external circuit, the encoding control means 916 adaptively controls the encoding control parameters 917 to be used in the block discrimination means 904 for each frame on the basis of the encoding rate which is uniquely selected and an encoding mode signal such as quality of recovered signal.

Since the block discrimination means 904 decides the block of the frame as a whole with the threshold value Th corresponding to the encoding control parameter 917, the threshold value Th 1002 is output from the threshold value control means 1001, allowing comparison between Th and data value in the block decision means 1003 depending on the following formula and thereby determining the block discrimination data 905.

$$\text{Data value} \begin{cases} \leq Th\ v = 0,\ \text{invalid block} \\ > Th\ v = 1,\ \text{valid block} \end{cases}$$

For the valid block, a data value corresponding to the block is output as the encoded data 907 along with the block discrimination data v905, while for the invalid block, a data value corresponding to the block is considered as 0 and only the block discrimination data v905 is output as the encoded data 907.

The encoding control system used in the interframe encoding apparatus of the prior art is executed as described previously, there rises a problem that if the block discrimination threshold values are all lowered in unit of frame in the same degree when an input image becomes stationary image, the number of valid blocks in unit of one frame increases, and amount of information generated becomes extremely large.

Still further, FIG. 13 is a block diagram of the image encoding transmission apparatus disclosed in the "Adaptive Quality Control in Dynamic Encoding" by Atsuya Itoh (draft of Image Encoding Symposium, Jun. 3, 1986).

As shown in the same figure, the image encoding transmission apparatus is comprised of a preprocessing means (A), a motion compensating means (B), a vector quantizing encoding means (C) and a vector quantizing decoding means (D).

The processing means (A) comprises an A/D converter 1101 for generating a pixel signal 1201 through analog/digital conversion (hereinafter referred to as A/D conversion) by reading the video signal for each frame and a block divider 1102 for grouping the adjacent pixels on the image into blocks each of which is composed of the predetermined number of pixels and generating the image vector signal 1202 consisting of pixel signal 1201 group for each block.

Moreover, the motion compensating means (B) comprises a frame memory 1103 for storing the decoded recovery signal 1212 of preceding frame and a motion compensating processing means 1204 for producing a plurality of reference blocks 1203 with reference to the current block position from the decoded recovery signal 1212 of the preceding frame stored in the frame memory 1103 and outputting, by searching, the reference block 1204a which is most approximated to the image vector signal 1202 and movement position information 1204b.

The vector quantizing encoding means (C) comprises a subtractor 1105 for obtaining difference between the image vector signal 1202 and selected reference block 1204a by subtraction and outputting a difference vector signal 1205, a valid/invalid block discriminating means 1106 for calculating an evaluation value which indicates magnitude of the difference vector signal 1205, executing comparison between the evaluation value and threshold value, and appreciating the block discrimination information as the invalid information under the decision that the image vector signal 1202 is identical to the reference block 1204a when the evaluated value is within the range of threshold value or the block decision information as the valid information considering it as the block to be transmitted when the evaluated value is out of the range of threshold value, a vector quantizing encoding means 1107 for vector-quantizing and encoding only the difference vector 1205 decided as the valid information in the valid/invalid block discriminating means 1106 to output the encoded vector signal 1207 and a variable length encoding means 1108 for encoding, in variable length, the encoded vector signal 1207 and movement location information 1204b through the multiplexing.

A multiplex encoded data 1208 output from the variable length encoding means 1108 is output to the communication line through the send buffer 1109.

The vector quantizing decoding means (D) comprises a vector quantizing decoding means 1110 for outputting a decoded vector signal 1210 by decoding the encoded vector signal 1207 and an adder 1111 for adding the decoded vector signal 1210 and searched reference block 1204a to output the decoded reproducing vector signal 1211.

A space filter 1112 executes the smoothing process of the decoded reproducing signal 1211.

Next, operations of image encoding transmission apparatus of the prior art will be explained.

First, the dynamic video signal 1200 of the first frame is input to the A/D converter, then converted to the pixel signal 1201 and input to the block divider 1102.

The block divider 1102 produces the video vector signal 1202 by blocking the predetermined number of the adjacent pixel signals 1201 on the image and then outputs such signal.

Next, the video vector signal 1202 passes directly the subtractor 1105 and is then input to the vector quantizing encoding means 1107.

Thereafter, the vector quantizing encoding means 1107 performs the vector quantizing and encoding of the video vector signal 1202 as explained below.

A mean value m of the video vector signal 1202 is first calculated. Separation of mean value is carried out on the basis of mean value m and the mean value separating vector is output.

The vector most approximated to the mean value separating vector is searched from the code-book storing a plurality of pattern vectors to be output as the encoded vector 1207 of the vector signal 1202.

The vector quantized and encoded vector signal 1207 is output to the communication line as the send encoded data 1209a through the send buffer 1009 after it is encoded to the code in variable length.

Meanwhile, the encoded vector signal 1207 is input to the vector quantizing encoding means 1110 and then decoded. Thereafter, it passes the adder 1111 and is then written into the frame memory 1103 after the smoothing processing by the space filter 1112.

A dynamic video signal 1200 of the second frame is converted to the video vector signal 1202 in the preprocessing circuit (A) and is then output and the video vector signal 1202 is input to the subtractor 1105.

Moreover, this vector signal 1202 is input to the motion compensating processing means 1104.

On the other hand, a plurality of reference block signals 1203 including the vector signal in the same position as the input block is produced from the decoded reproducing signal 1212 stored in the frame memory 1103 and is then input to the motion compensating processing means 1104.

In the motion compensating processing means, distortion between the vector signal 1202 and the reference block signal 1203 is calculated, the reference block which gives minimum distortion is selected and the reference block signal 1204a thereof and movement position information 1204b are output respectively.

The subtractor 1105 calculates difference between the vector signal 1202 and reference block signal 1204a to produce the difference vector signal 1205 and then outputs such signal to the vector quantizing encoding means 1107 and valid/invalid block discrimination means 1106.

The valid/invalid block discrimination means 1106 makes decision expressed by the following formula.

$$d = \frac{1}{I} \sum_{i=1}^{I} |\epsilon_i| \qquad (1)$$

d : evaluated value
$\epsilon_i$: difference vector signal element
When d≧Th, valid
When d<Th, invalid In case decision by the valid/invalid block discrimination means 1106 is valid, the difference vector signal 1205 is subject to the vector quantizing and encoding as the information to be sent.

Moreover, in case decision by the valid/invalid block discrimination means 1106 is invalid, the selected reference block 1204a is considered as identical to the video vector signal 1202 and only the movement position information 1204b is transmitted.

Next, the encoding vector signal 1207 is multiplexed in the variable length encoding means 1108 together with the movement position information 1204b through the variable length encoding, wherein the shorter code is assigned for the signal having high generation probability and the longer code to the signal having low generation probability, and is then output to the send buffer 1109.

Meanwhile, the encoded vector signal 1207 is converted to the decoded vector signal 1210 in the vector quantizing decoding means 1110, then added to the reference block signal 1204a in the adder and is converted to the decoded reproducing vector signal 1211.

Further, the decoded reproducing vector signal 1211 is subject to the smoothing process in case the movement position information 1204b is large and is then stored in the frame memory 1103. Here, the smoothing process of space filter 1112 is carried out on the basis of the movement position information 1204b obtained by the motion compensation and the control is carried out so that the smoothing process is executed only to the same region, but to the stationary region.

With the configuration as described, the video encoding transmission apparatus of the prior art also carries out the smoothing process with a filter to the region to which the encoding with high accuracy has been conducted to produce the decoded image approximated to the input dynamic image signal and on the other hand, is accompanied by a problem as deteriorating quality of decoded image because the smoothing process is not carried out to the stationary region to execute the on-off control of filter with the motion vector information and thereby encoding noise to the roughly encoded region is accumulated.

SUMMARY OF THE INVENTION

Firstly the present invention has been proposed to solve such problems described above and it is therefore an object of the present invention to provide a vector quantizer which provides sufficiently small quantization error even for irregular input vectors.

A vector quantizer of the present invention comprises a first code-book including a plurality of reference quantizing representative vectors and a second codebook self-produced by sequentially storing irregular input vectors extracted based on the minimum distortion as the new quantizing representative vectors, transmits such irregular input vectors and constitutes such first and second codebooks in the form of tree-structure.

Secondly in order to solve the above-mentioned problems in the prior art, an object of the invention is to provide an interframe vector quantization encoding and decoding apparatus wherein wave form distortion between input/output vectors in the interframe vector variation quantity can be suppressed to a definite value or less, the adaptive control to the encoding information generating quantity and the reproduction picture quality in wide range becomes possible by varying the threshold value to the wave form distortion, and the code-book depending on local property of the input image can be generated and updated while being encoded.

Another object of the invention is to provide an interframe vector quantization encoding and decoding apparatus wherein generation of the valid block in the interframe vector quantization can be suppressed, and the encoding information generating quantity can be reduced.

In an interframe vector quantization encoding and decoding apparatus according to the invention, an inner product vector quantization encoder having a plurality of code books is installed in a vector quantization encoding and decoding unit of an interframe encoding loop, or interframe difference signal series is converted into vector and a mean value separation normalization unit and a vector quantization encoder to perform the mean value separation normalization processing and quantization are installed respectively.

In another interframe vector quantization encoding and decoding apparatus according to the invention, interframe difference signal series is converted into vector in output stage of a frame memory, and an initial stage vector quantization encoding and decoding unit to output the initial stage vector quantization decoding signal series and the initial stage vector quantization encoding data is installed.

Thirdly in order to solve the above-mentioned problems in the prior art, an object of the invention is to provide an interframe vector quantizer wherein the effective encoding taking in consideration of the visual sense characteristics is possible, and the subjective quality of the encoding reproduction image is high.

An interframe vector quantizer according to the invention is provided with a band dividing unit for performing the band dividing of input video signal series, a frame memory for storing the input video signal series in frequency band separation, a dynamic vector quantization encoding unit and a dynamic vector quantization decoding unit for performing encoding/decoding processing corresponding to characteristics of prescribed frequency band input video signal series, and an encoding control unit for generating control signals to change accuracy of the encoding processing based on level of the space frequency of the input video signal series.

Fourthly the present invention has been proposed to solve the problem described to provide the frame format to be applicable to the 1×8 Kbps with the integrated frame format and resultant multimedia data transmission system to be applied to various transmission rates in the same H/W.

The multimedia data transmission system of the present invention can be applied with the same transmission frame format on the basis of the frame of one bit length having the repetition frequency of 8 kHz in the 1×8 Kbps.

Fifthly the present invention has been proposed to eliminate such problems and it is therefore an object of the present invention to attain the encoding control system which suppresses sudden increase in the number of valid blocks and lowers amount of information generated.

The encoding control system of the present invention does not lower the block discrimination threshold values in the same degree to the predetermined value in unit of frame when an input image becomes stationary image but lowers the threshold value of the frame as a whole to the predetermined value while widening the region to lower the threshold value to the predetermined value after the constant period on time, and gradually step by step in space.

Sixthly the image encoding transmission apparatus of the present invention has been proposed to overcome the problems described and it is therefore an object of the present invention to provide an image encoding transmission apparatus which effectively suppresses encoding noise and realizes local quality control of reproduced image.

In order to attain the object described above, the image encoding transmission apparatus of the present invention comprises an encoding accuracy control means for changing the encoding accuracy of the vector quantizing encoding means at the predetermined period in accordance with the amount of send encoding information of the encoded image vector signal to be temporarily stored in the send buffer, a space adaptive filter for executing the smoothing process of the decoded recovery signal to use the pixel values including, at the predetermined ratio, the pixel values approximated to each pixel value of the decoded recovery signal, and a smoothing characteristic control means for controlling ON/OFF conditions of smoothing process of the adaptive space filter on the basis of the movement position information, enhancing a degree of smoothing operation of adaptive space filter in case the encoding accuracy is low and lowering the degree of smoothing operation in case the encoding accuracy is high.

Seventhly this invention has been proposed to solve such problems and therefore it is an object of the present invention to provide a vector quantizing encoding transmission apparatus which assures sufficiently small quantizing error even for peculiar input vector.

In view of attaining such object the present invention comprises an encoding control means for measuring selection frequency of representative vector for quantization, executing code assigning control to assign the short code length index data sequentially to the vectors from the representative vector for quantization having a high selection frequency depending on the result of measurement, comparing the minimum distortion value of the representative vector for quantization selected at the time of vector quantization and the input vector with a threshold value for vector updata, and rewriting the input vector, when said minimum distortion value is larger than the threshold value, to the representative vector for quantization with low selection frequency to send update discrimination information, index data and update representative vector, and an encoding control means for rewriting the representative vector for quantization of code-book in the receiving side in accordance with the update discrimination information received, measuring selection frequency of the representative vector for quantization from the index data received and assigning a short index data sequentially from the representative vector for quantization with high selection frequency on the basis of the result of measurement, wherein the index data of representative vector for quantization and the representative vector for quantization in the code book are updated in accordance with the transmitting image.

Eighthly the present invention has been accomplished for solving the problem explained above and has an aim to obtain a vector quantizer capable of not only reducing the quantization error even for specific input vectors, but also suppressing the production of information to the least extent.

Each of the two vector quantizers according to the present invention comprises a first vector quantization encoder for vector-quantizing inputted image signals by using a fixed code book and a second vector quantization encoder for vector-quantizing image signals transmitted without being processed by the first vector quantization encoder by using a variable code book, the first and the second vector quantization encoders being connected in series.

Ninthly the present invention has been accomplished for solving the problem explained above and has an aim to obtain a vector quantizer capable of reducing the quantization error even for specific inputted vectors.

The vector quantizer according to the present invention is constructed so that a specific vector is extracted from the input ones based on the minimum distortion and is transmitted to replace the oldest representative quantization vector among those stored in the code book as a new representative quantization vector, thereby renewing the content of the code book.

BRIEF DESCRIPTION OF THE DRAWINGS

FIG. 3 is a block diagram of an interframe vector quantization encoding and decoding apparatus in the prior art;

FIG. 5 is a block diagram illustrating constitution of an interframe vector quantizer in the prior art;

FIG. 6 is a block diagram illustrating constitution of the vector quantization encoding unit in FIG. 5;

FIG. 7 is a frame format of multimedia data transmission system of the prior art;

FIG. 8 is illustration for indicating content of FAS in the multimedia data transmission system of the prior art;

FIG. 9 is a multiframe format of the multimedia data transmission system of the prior art;

FIG. 11 is a block diagram indicating a configuration of the block discrimination means of the prior art;

FIG. 14 is a block diagram indicating the structure of a vector quantizer depending on an embodiment of the present invention;

FIG. 15 is an example of structure of code book used for vector quantizer depending on an embodiment of the present invention;

FIG. 16 is a block diagram indicating another embodiment of the present invention;

FIG. 17 is a block diagram illustrating constitution of a vector quantization encoding and decoding unit of an interframe vector quantization encoding and decoding apparatus as an embodiment of the invention;

FIG. 18 is an explanation diagram illustrating operation of a vector quantization encoding and decoding unit of an interframe vector quantization encoding and decoding apparatus as an embodiment of the invention;

FIG. 22 is a block diagram illustrating constitution of an interframe vector quantizer as an embodiment of the invention;

FIG. 26 is a block diagram illustrating constitution example of the code book in FIG. 24 and FIG. 25;

FIG. 29 is a structure of video communication terminal having a multimedia data transmission system depending on an embodiment of the present invention;

FIG. 31 is illustration for explaining sending of a bit string to transmission line by the multimedia data transmission system depending on an embodiment of the present invention;

FIG. 39 is a detail block diagram of the vector quantizing encoding means of the embodiment shown in FIG. 38;

FIG. 48 is an explanatory diagram showing an operation for reading-out and writing of a quantized vector with respect to a variable code book;

FIG. 51 is a block diagram showing an example of the construction of a vector quantizer according to the present invention; and FIG. 52 shows the content of tables in which history of transmitted indexes are indicated.

PREFERRED EMBODIMENT OF THE INVENTION

Figure 1:
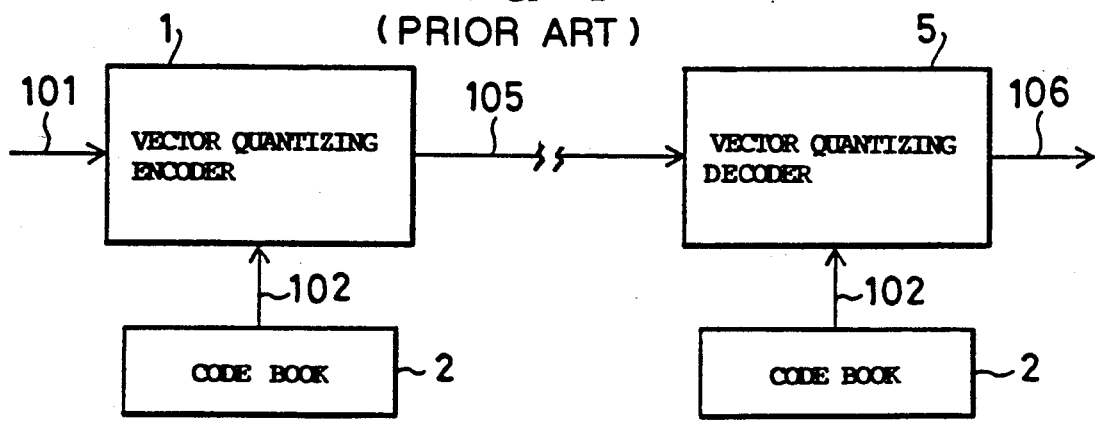
FIG. 1 is a block diagram indicating a structure of vector quantizer of the prior art.
Figure 2:
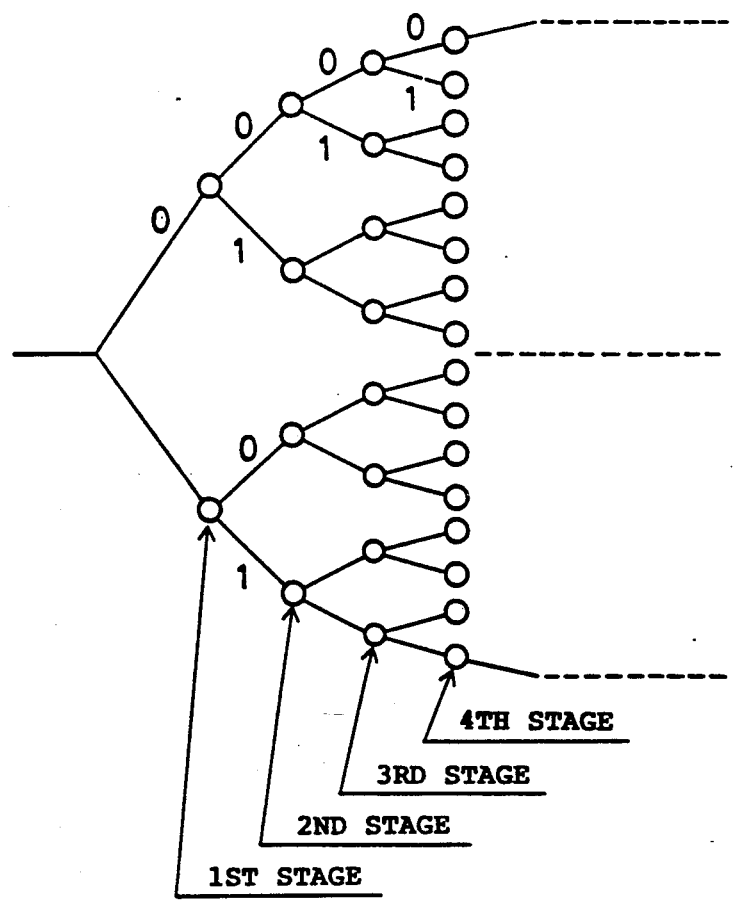
FIG. 2 is an example of structure of code book used in the vector quantizer of the prior art.

A first embodiment of the present invention will be explained hereunder with reference to FIGS. 14–16. 2 designate a first code book formed in the same manner as the prior code book. 3 designates a random access second code book. 4 designates selectors for selecting encoded data to be sent. Other elements may be the same as those of prior art.

Operation will be explained. The input vector $\underline{X}$ 101 is converted to the index i 103 of the quantizing representative vector $\underline{Y}_i$ for giving the minimum distortion through the processing same as that of prior art using the first code book 2 in the vector quantizing encoder 1 and this index 103 is input to the selector 4. Since the second code book is already cleared at the beginning of encoding, the quantizing representative vector $\underline{Y}_j$ is selected from the first code book. Here, the minimum distortion di is compared with the distortion threshold value T preset freely and processing is divided to the two kinds of processing in accordance with the result of comparison. A select signal 104 for identifying the process is supplied to the selector 4 and is then transmitted.

Processing I: When $d_i \leq T$

The select signal 104 is set to '0'. The index i 103 described previously is output, as the encoding data 105, from the selector 4 and is then transmitted.

Processing II: When $d_i > T$

The select signal 104 is set to '1'. The input vector $\underline{X}$ 101 is output through the encoding data 105 through the selector 104 and is then transmitted. Simultaneously, the input vector $\underline{X}$ 101 is written into the predetermined address of the second code book 3.

The input vectors are sequentially stored in the second code book when the minimum distortion di has exceeded the threshold value T by repeatedly executing such processings and a code book having the attribute different from that of the first code book is self-created.

In the case of such processing I, the prefix of a bit indicating to which code book of the first and second ones the quantizing representative vector $\underline{Y}_j$ belong is added to the leading edge of index i.

The address for writing the input vector $\underline{X}$ 101 is controlled to cycle from the address zero to the maximum address in order to prevent overflow of the second code book.

In above processing, the tree-structure is used for executing, at a high speed, the search of quantization representative vector $\underline{Y}_j$. Example of the first and second code books in the tree-structure is shown in FIG. 15. The first code book has the binary tree-structure like that of the prior art, while the second code book has the doubled hierarchical level divided into four classes. The higher quantizing representative vectors corresponding to four classes are respectively set in the same way as four quantizing representative vectors of the second stage of the first code book and four quantizing representative vectors are stored to the lower location of each class. Therefore, 16 quantizing representative vectors in the second code book are searched by tree-search in two levels of quaternary. For execution of such processing II, the input vector $\underline{X}$ 101 is written onto the predetermined address corresponding to the class indicated by the higher 2 bits of index i of the quantizing representative vector $\underline{Y}_j$ giving the minimum distortion selected from the first or second code book. The higher 2 bits of index are transmitted together with the input vector $\underline{X}$ 101.

In above embodiment, a square distortion to the input vector is used as the evaluation value for determining the quantizing representative vector, but for example, as shown in FIG. 16, it can be realized easily to attain the effect same as that of the embodiment described by calculating an inner product of the input vector and the quantizing representative vector normalized to mean value zero and magnitude 1 after separating the input vectors to the mean values and applying the second code book to the inner product vector quantization for searching the quantizing representative vector which gives maximum inner product with the input vector having mean value zero. In this case, the mean values separated and gain element of input vector given as the maximum inner product value can be transmitted independently. Moreover, when the select signal is not transmitted and the processing II is executed, the gain assigning the special code is transmitted.

A second embodiment of the invention will now be described referring to FIGS. 17-21. In FIG. 17, numeral 208 designates a mean value separator which inputs interframe difference signal series 303 and outputs mean value separation input vector 402 and mean value 401, and numeral 209 designates an inner product vector quantization encoder which inputs the mean value separation input vector 402, normalization output vector 411, encoding control parameter 309, and outputs mean value separation input vector 402 and index 409.

A first code book 210 being the same as the code book 210 in the prior art, and a second code book 211 to enable write/read at any time respectively output the normalization output vector 411, and normalization input vector 410 is inputted to the second code book 211.

A scalar quantizer 212 inputs the mean value separation input vector 402, and outputs scalar quantization 412 and also mean value separation input vector 414 subjected to scalar quantization per sample.

A normalization circuit 213 inputs the mean value separation input vector 414 outputted from the scalar quantizer 212, and outputs normalization input vector 410 to the second code book 211.

A first selector 219 inputs index 409 outputted from the inner produce vector quantization encoder 209 and scalar quantization value 412 outputted from the scalar quantizer 212, and outputs vector encoding data 413.

A second selector 220 inputs the vector encoding data 413, and outputs index 409 and scalar quantization value 412.

A inner product vector quantization decoder 221 inputs amplitude gain 408 outputted from an amplitude gain decoder 218, index 409 and normalization output vector 411, and outputs selected normalization output vector 416.

A scalar quantization decoder 222 inputs scalar quantization value 412 outputted from the second selector 220, and outputs means value separation input vector 414 subjected to scalar quantization per sample.

Figure 4:
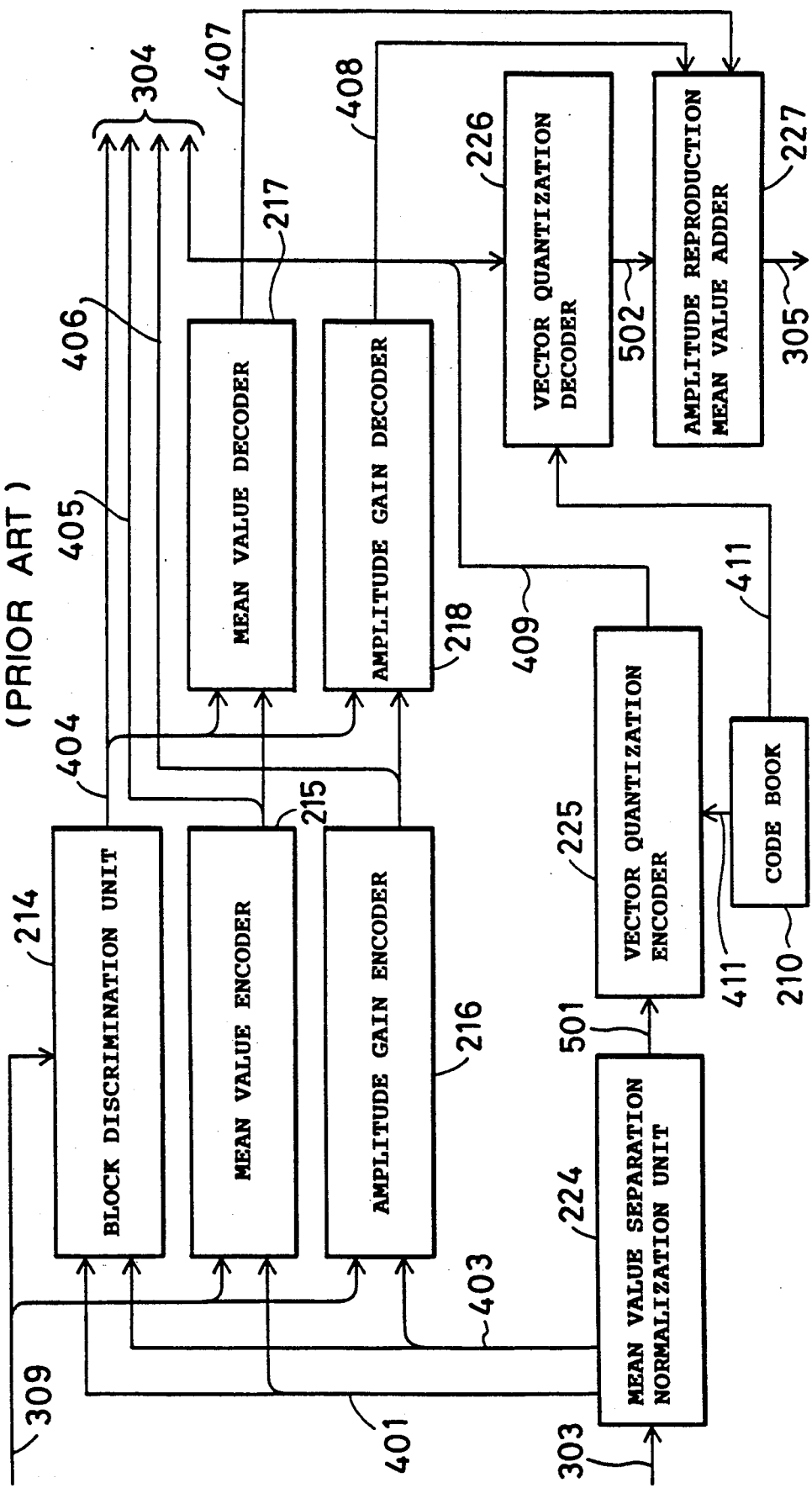
FIG. 4 is a block diagram of a vector quantization encoding and decoding unit in the interframe vector quantization encoding and decoding apparatus of FIG. 3.
Figure 10:
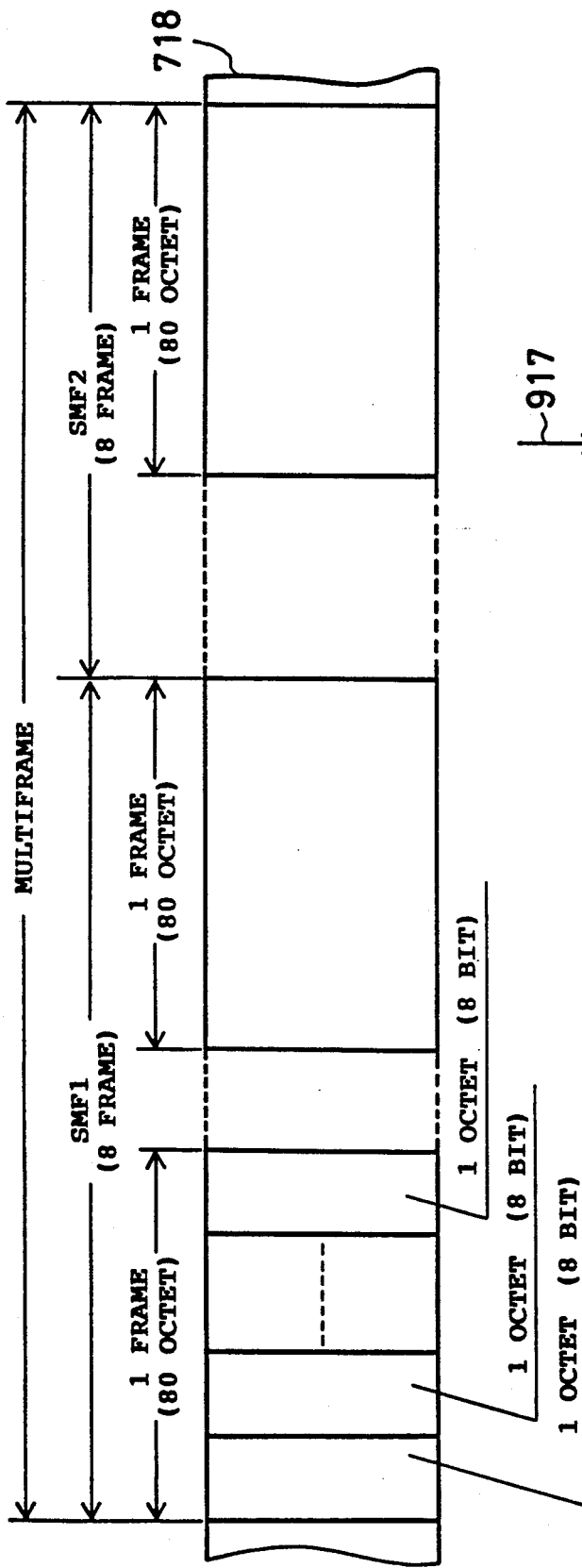
FIG. 10 is illustration for explaining a profile of transmission of a bit string to the transmission line in the multimedia data transmission system of the prior art.

A mean value adder 223 inputs normalization output vector 416 and mean value separation input vector 414, and outputs decoding interframe difference signal series 305. Other constitution is similar to that in FIG. 4, and FIG. 17 shows constitution of a vector quantization encoding and decoding unit of an interframe vector quantization encoding and decoding apparatus according to the invention and corresponds to the vector quantization encoding and decoding unit 202 in FIG. 3. Consequently, other parts are similar to those in FIG. 3.

Next, operation will be described. Interframe difference signal series 303 supplied from the subtractor 206 shown in FIG. 3 is inputted to the mean value separator 208 and converted into block (vector).

In the mean value separator 208, means value m 401 of the input signal series $\underline{\epsilon}$ converted into vector is separated, and means value separation input vector $\underline{Z}$ 402 is outputted. This process is expressed by following formulas.

input signal series: $\underline{\epsilon} = [\epsilon_i, \epsilon_2, \ldots, \epsilon_K]$ mean value: $m = \frac{1}{K} \sum_{j=1}^{K} \epsilon_j$ mean value separation input vector: $Z_j = (\epsilon_j - m)$,
$\underline{Z} = [Z_1, Z_2, \ldots, Z_K]$ In the inner product vector quantization encoder 209, the inner product operation is performed between the mean value separation input vector Z 402 and normalization output vector yl written in the first code book 210 and the second code book 211, and the normalization output vector $y_i$ to make the inner product maximum is detected and the maximum inner product value then is given approximately as the amplitude gain g. That is, the amplitude gain g 403 and the index i 409 are simultaneously obtained through the processing of following formulas.

$$\text{inner product: } (\underline{Z}, \underline{y}_l) = \left( \sum_{j=1}^{K} Z_j y_{lj} \right)$$

$$\text{maximum inner product: } (\underline{Z}, \underline{y}_i) > (\underline{Z}, \underline{y}_l) \ (l \neq i)$$

$$\text{amplitude gain: } g = (\underline{Z}, \underline{y}_i) = |\underline{Z}| \cdot |\underline{y}_i| \cos \theta_i$$
$$= |\underline{Z}| \cos \theta_i$$

where $\frac{1}{k} \sum_{j=1}^{K} y_{ii} = 0, |\underline{y}_i| = 1$, $$|\underline{Z}| = \left[ \sum_{j=1}^{K} Z_j^2 \right]^{\frac{1}{2}}$$

The amplitude gain g is limited to value of zero or more.

In this case, using amount $|\underline{Z}|$ of the mean value separation input vector Z and the amplitude gain g approximated by the maximum inner product, wave form distortion D by the vector quantization is defined by following formula.

$$D = [|\underline{Z}|^2 - g^2]^{\frac{1}{2}}$$

FIG. 18 shows relation of the mean value separation input vector Z, the normalization output vector $y_i$, the amplitude gain g and the wave form distortion D. Based on results of comparison of amount between the wave form distortion D and the allowable distortion threshold value $T_D$ assigned by the encoding control parameter 309, the encoding processing is classified into two following cases.

Processing I : $D \leq T_D$

The amplitude gain g 403 and the index i 403 obtained in the above-mentioned process are outputted as they are.

Processing II : $D > T_D$

Value of the amplitude gain g 403 is made negative definite value (for example, $-1$) and outputted, and the mean value separation input vector $\underline{Z}$ 402 is supplied to the scalar quantizer 212.

The scalar quantizer 212 quantizes the mean value separation input vector $\underline{Z}$ 402 in accordance with quantization characteristics assigned by the encoding control parameter 309 per sample, and the mean value separation input vector $\hat{\underline{Z}}$ 414 in scalar quantization and K pieces of the scalar quantization values 412 are outputted.

The mean value separation input vector $\hat{\underline{Z}}$ 414 in scalar quantization is subjected to following normalization processing in the normalization circuit 213, and converted into normalization input vector $\hat{\underline{X}}$ 410.

$$|\hat{\underline{Z}}| = \left[ \sum_{j=1}^{K} \hat{z}_j^2 \right]^{\frac{1}{2}}$$

$$\hat{x}_j = \hat{z}_j / |\hat{\underline{Z}}|$$
$$\hat{\underline{X}} = [\hat{x}_1, \hat{x}_2, \ldots \hat{x}_K]$$

The normalization input vector $\hat{\underline{X}}$ 410 is written onto prescribed address of the second code book 211, and read as normalization output vector yl in the inner product vector quantization encoding processing.

The prescribed address starts from the zero address, and is counted up in sequence in accordance with the write operation and controlled to be reset to the zero address when it exceeds the final address.

The block discrimination unit 214, the mean value encoder 215, the amplitude gain encoder 216, the mean value decoder 217 and the amplitude gain decoder 218 execute the same operation as that of the prior art shown in FIG. 4.

The index 409 or the K pieces of the scalar quantization values 412 and the amplitude gain 408 decoded from the amplitude gain decoder 218 are inputted to the first selector 219. If the decoded amplitude gain 408 is 0 or more, the first selector 219 selects the index 409, and if the amplitude gain 408 is less than 0, the selector 219 selects the K pieces of the scalar quantization values 412 respectively and outputs the vector encoding data 413.

Consequently, regarding the encoding data 304, if the block discrimination data v404 outputted from the block discrimination unit 214 is 1, that is, if the valid block is indicated, the block discrimination data 404, the mean value encoding data 405, the amplitude gain encoding data 406 and the vector encoding data 413 are outputted.

If the block discrimination data v404 is 0, that is, if the invalid block is indicated, only the block discrimination data v404 is outputted.

The decoded amplitude gain ĝ 408 and the vector encoding data 413 are inputted to the second selector 220. If the decoded amplitude gain ĝ 408 is 0 or more, the vector encoding data 413 is supplied as the index 409 to the inner product vector quantization decoder 221, and if the amplitude gain is less than 0, it is supplied as the K pieces of the scalar quantization values 412 to the scalar quantization decoder 222.

In the inner product vector quantization decoder 221, the amplitude gain ĝ 408 decoded from the amplitude gain decoder 218 corresponding to the index 409 is multiplied with the normalization output vector $\underline{y}_i$ read from the first code book 210 and the second code book 211 and selected thereby the output vector $g \cdot \underline{y}_i$ 216 in amplitude reproduction is obtained.

In the scalar quantization decoder 222, based on the K pieces of the scalar quantization values 412 and the quantization characteristics assigned from the encoding control parameter 309, the scalar quantization decoding operation is executed thereby the mean value separation input vector $\hat{\underline{Z}}$ 414 in scalar quantization is obtained.

In the mean value adder 223, the decoded mean value m 407 supplied from the mean value decoder 217 is added to the output vector $g \cdot \underline{y}_i$ 416 in amplitude reproduction or the mean value separation input vector $\hat{\underline{Z}}$ 414 in scalar quantization, that is, operation of following formulas is executed, thereby the decoding vector $\underline{s}$ comprising the decoding interframe difference signal 305 can be estimated.

$$\hat{e}_j = \begin{cases} \hat{z}_j + m \\ \hat{g} \cdot y_i + m \end{cases}$$

$$\underline{\hat{e}} = [\hat{e}_1, \hat{e}_2, \ldots, \hat{e}_K]$$

If the block discrimination data $v404$ is 0, in similar manner to the prior art, the decoding vector $\underline{\hat{e}}$ is given by $$\underline{\hat{e}} = [0, 0, \ldots, 0]$$

In the embodiment, the wave form distortion between the input/output vectors in the interframe vector quantization can be suppressed to a definite value or less, the threshold value to the wave form distortion is varied thereby the encoding information generating quantity and the reproduction picture quality can be adapted in wide region.

Also the code book depending on the local property of the input image can be generated and updated while it is encoded.

In the embodiment, in the vector quantization encoding and decoding unit of the interframe vector quantization encoding and decoding apparatus, although the inner product vector quantization is performed using the code book updated in sequence based on the wave form distortion, in similar manner to the prior art, the mean value separation normalization vector quantization is performed, and the code book may be updated in sequence based on value that the minimum distortion obtained in the quantization process is weighted with the amplitude gain. If a vector quantizer is used in place of the scalar quantizer, similar effect can be obtained.

In the output stage of the frame memory 204, using a plurality of output vectors comprising the block image cut out of prescribed address of the frame memory 204, a plurality of output vectors comprising uniform pattern of prescribed level, and a plurality of output vectors comprising the mean value pattern per plural samples of the past input video signal series, the multistage vector quantization constitution with the quantization encoding and decoding unit to perform the vector quantization of the input video signal series directly may be taken.

Figure 19:
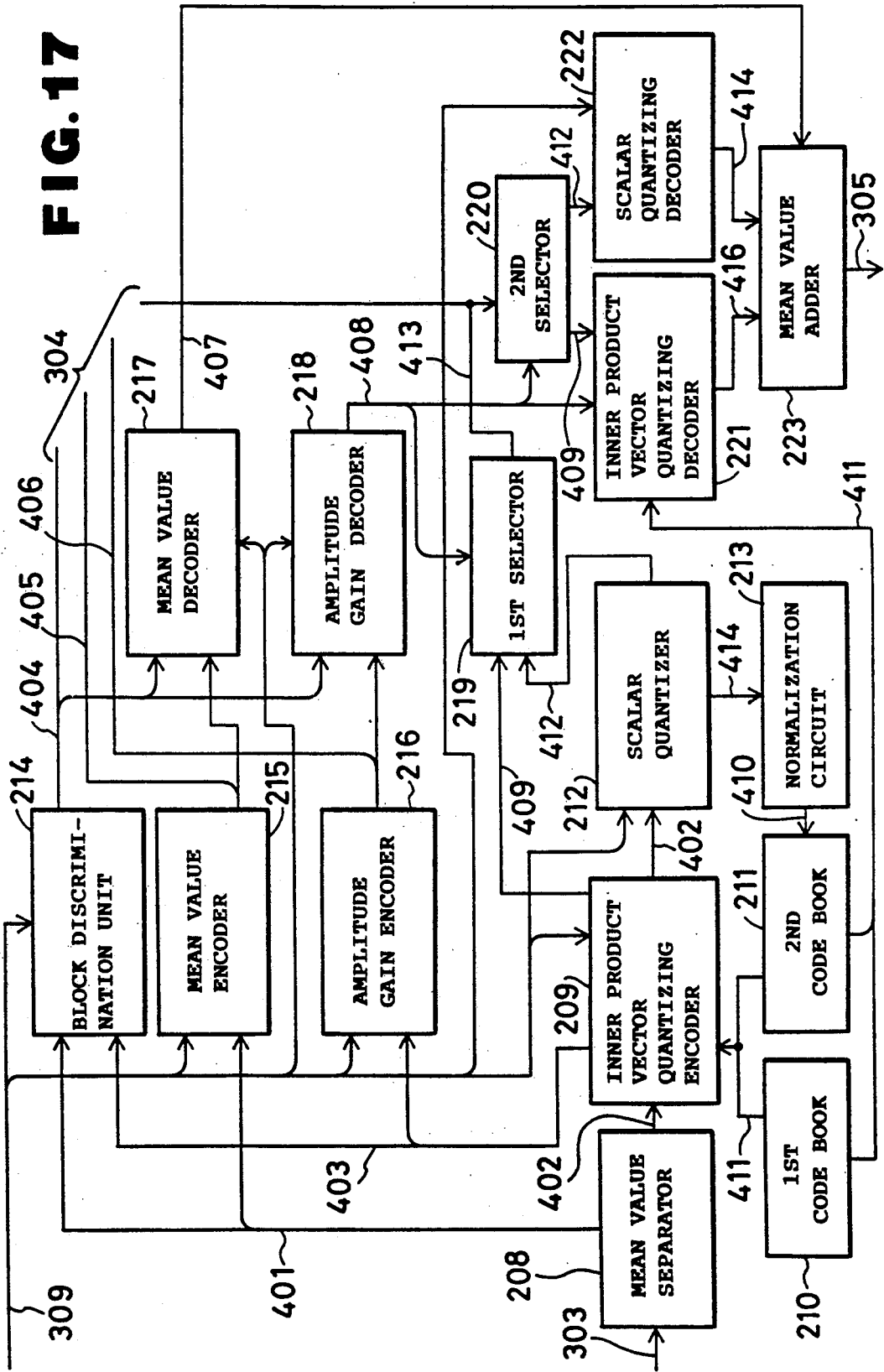
FIG. 19 is a block diagram of an interframe vector quantization encoding and decoding apparatus in multi-stage vector quantization constitution as another embodiment of the invention.

FIG. 19 is a block diagram of an interframe vector quantization encoding and decoding apparatus based on the multistage vector quantization constitution. In FIG. 19, numeral 230 designates an initial stage vector quantization encoding and decoding unit which converts the input video signal series 301 together with the encoding control parameter 309 into block per horizontal sample and vertical sample by the interframe forecast video signal series 302 read from the frame memory 204, and outputs the initial stage vector quantization decoding signal series 321 to the subtractor 201 and the adder 203 and also outputs the initial stage vector quantization encoding data 320 to the variable length encoding unit 205. Other constitution is similar to that in FIG. 3.

Figure 20:
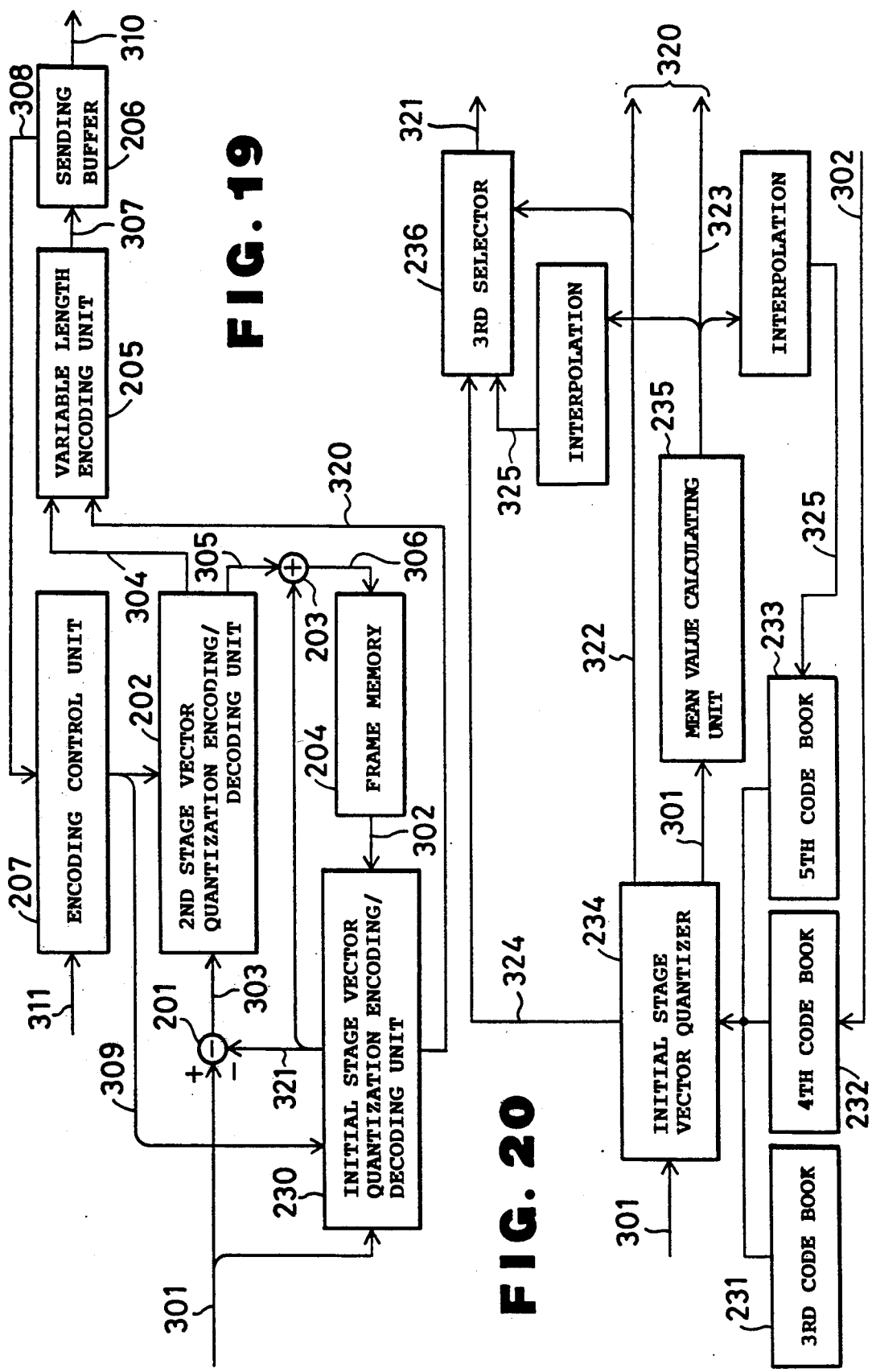
FIG. 20 is a block diagram illustrating constitution of an initial stage vector quantization encoding and decoding unit in the interframe vector quantization encoding decoding apparatus of FIG. 19.
Figure 21:
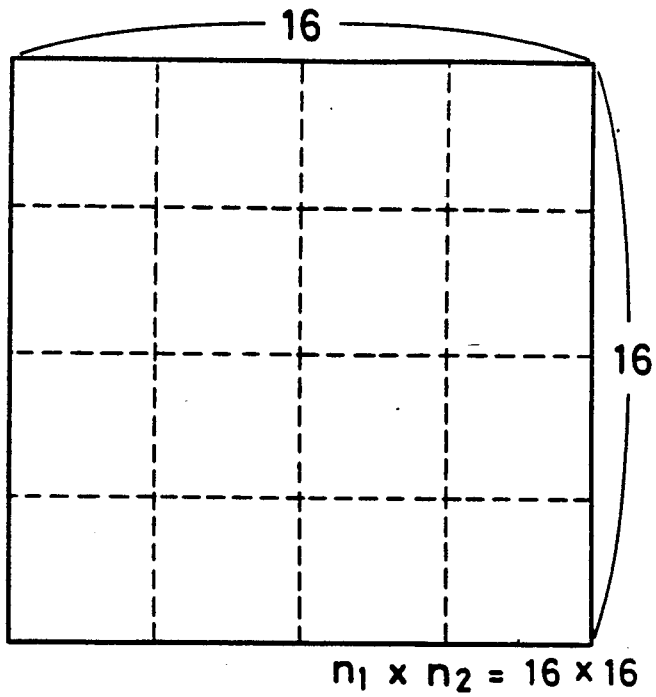
FIG. 21(a) is an explanation diagram illustrating size of initial stage block when multistage vector quantization in the embodiment of FIG. 20 is executed.
FIG. 21(b) is an explanation diagram illustrating size of next stage block when multistage vector quantization in the embodiment of FIG. 20 is executed.
Figure 21:
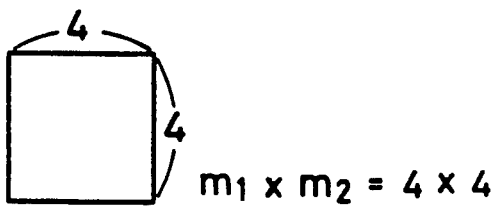

Detailed block constitution of the initial stage vector quantization encoding and decoding unit 230 is shown in FIG. 20. In FIG. 20, numeral 234 designates an initial stage vector quantizer which inputs the input video signal series 301 and a plurality of normalization output vectors read from third through fifth code books 231–233, and outputs initial stage index 322, input video signal series 301 and output vector 324.

Figure 23:
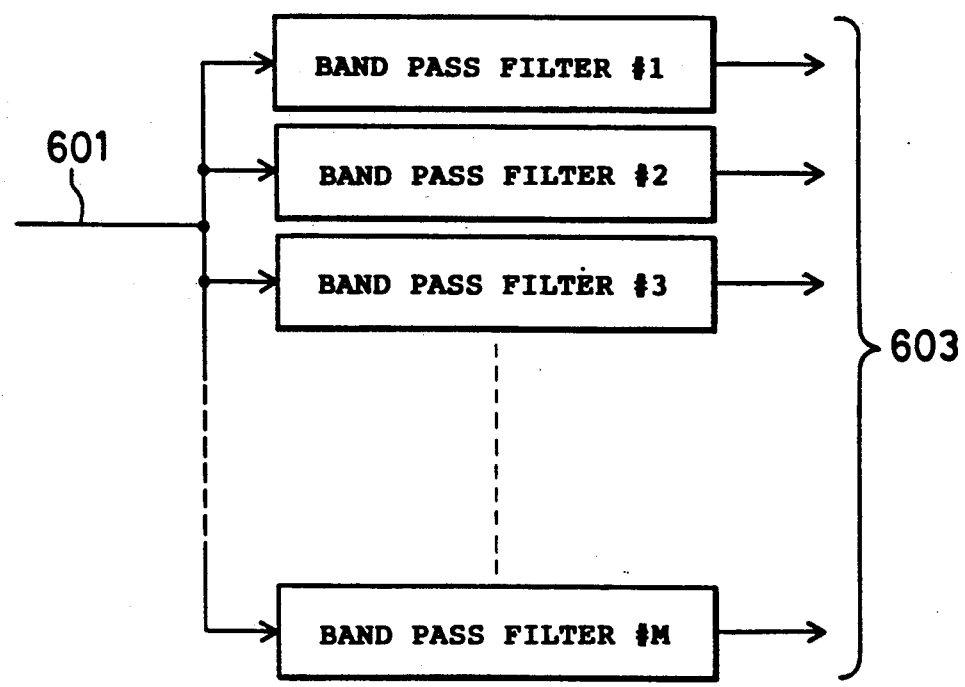
FIG. 23 is a block diagram illustrating constitution example of the band dividing unit in FIG. 22.

The third code book 231 is one to enable write/read at any time which stores dynamic output vectors obtained from a plurality of blocks cut out of prescribed address of the frame memory 204 of FIG. 23 in the initial stage vector quantizer 234.

The fourth code book 232 is one for ead only which stores a plurality of fixed value output vectors of uniform level and to which the interframe forecast video signal series 302 is inputted.

The fifth code book 233 is one to enable write/read which stores output vectors 325 to interpolate a plurality of mean values.

Numeral 235 designates a mean value calculating unit which estimates mean values per small block on two-dimensional image sample arrangement and outputs initial stage mean values 323 if the minimum distortion $D_s$ is larger than the initial stage vector quantization threshold value, and the output vectors 325 to interpolate the initial stage mean values are outputted to the fifth code book 233 and a third selector 236.

The third selector 236 outputs the interpolated output vector 325 as the initial stage vector quantization decoding signal series 321 if the index 322 is not special code, and outputs the output vector $\hat{S}_p$ 324 as the initial stage vector quantization decoding signal series 321 if the initial stage index 322 is special code.

FIG. 21(a) shows relation of size of a block as processing unit of initial stage vector quantization, and the block size of the initial stage is $n_1 \times n_2 = 16 \times 16$. FIG. 21(b) shows relation of size of a block as processing unit of next stage vector quantization, and the block size of the next stage is $m_1 \times m_2 = 4 \times 4$.

Next, operation of the initial stage vector quantization encoding and decoding unit 230 will be described referring to FIG. 20. The initial stage vector quantizer 234 estimates distortion between input vector $$S = [s_1, s_2, \ldots, s_r]$$

$r = n_1 \times n_2$ ($n_1$, $n_2$ multiples of $m_1$, $m_2$)

obtained by blocking the input video signal series 301 and a plurality of output vectors $\underline{\hat{S}}_g = [\hat{S}_{g1}, \hat{S}_{g2}, \ldots, \hat{S}_{gr}]$ read from the third–fifth code books 231–233, and retrieves output vector $\hat{S}_p$ to give the minimum distortion. The distortion $D_s$ is defined, for example, by following formulas.

$$D_s = \sum_{j=1}^{r} (s_j - \hat{S}_{gj})^2 \text{ or}$$

$$D_s = \sum_{j=1}^{r} |s_j - \hat{S}_{gj}|$$

If the minimum distortion $D_s$ is less than the prescribed initial stage vector quantization threshold value, the initial stage index 322 to discriminate the selected output vector $\hat{S}_p$ is outputted.

On the contrary, if the minimum distortion $D_s$ is larger than the initial stage vector quantization threshold value, it is inputted to the mean value calculating unit 235 per plural samples within the input vector, i.e., per small block on the two-dimensional image sample arrangement and the initial stage mean value 232 is estimated, and special code is assigned to the initial stage index 322.

The vector comprising the initial stage mean value 323 is interpolated to have the same dimension number as that of the input vector, and becomes the interpolated vector 325 and is stored in the fifth code book 233.

The fifth code book 233 stores a plurality of interpolated vectors 325, and every time the interpolated vector 325 is inputted to the fifth code book 233, the vector stored in the oldest time is replaced thereby updating is performed in sequence.

The fourth code book 232 stores a plurality of output vectors obtained by cutting a block in prescribed position of the past decoding video signal series stored in the frame memory. The storage content is updated together with the content of the frame memory.

The third code book 231 previously stores a plurality of output vectors comprising uniform patterns at prescribed level.

When the special code is assigned to the initial stage index 322 in the mean value calculating unit 235 as above described, the output vector $\hat{S}_p$ 324 is selected by changing the third selector 236 and outputted as the initial stage vector quantization decoding signal series 321.

When the special code is not assigned to the initial stage index 322, the interpolated vector 325 is selected by the third selector 236 and outputted as the initial stage vector quantization decoding signal series 321.

If the initial stage index 322 is special code, the plurality of initial stage mean values 323 are added and the initial stage index 322 is outputted as the initial stage vector quantization encoding data 320.

In the embodiment of FIG. 19 and FIG. 20, generation of the valid block in the interframe vector quantization can be suppressed and the encoding information generating quantity can be reduced.

In the second code book 211 of FIG. 17 and the fifth code book 233 of FIG. 20, every time the prescribed vector is inputted, the write address is counted up by one address in sequence, and control is effected so that the write address is reset at the time of exceeding the final address in the upper limit, thereby the second code book 211 and the fifth code book 233 may be updated in sequence.

In such constitution, a finite number of output vectors produced based on the past input block at the newest time to the input block to be encoded in the second code book 211 and the fifth code book 233 can be normally stored.

A third embodiment of the invention will now be described referring to FIGS. 22-28. FIG. 22 is a block diagram illustrating constitution of a transmission unit of an interframe vector quantizer as an embodiment of the invention. In FIG. 22, numeral 601 designates input video signal series, numeral 602 designates a band dividing unit constituted by a plurality of band pass filters for dividing band of the input video signal series 601, numeral 603 designates frequency band separation input video signal series divided in space frequency band by the band dividing unit 602, numeral 604 designates a first frame memory for storing the frequency band separation input video signal series 603, numeral 605 designates data read signal, numeral 606 designates frequency band discrimination signal outputted from the first frame memory 604, numeral 607 designates prescribed frequency band input video signal series read from the first frame memory 604 in accordance with input of the data read signal 605, numeral 608 designates prescribed frequency band interframe forecast signal, numeral 609 designates a subtractor which performs subtraction between the prescribed frequency band input video signal series 607 and the prescribed frequency band interframe forecast signal 608, numeral 610 designates prescribed frequency band interframe difference signal outputted from the subtractor 609, numeral 611 designates a dynamic vector quantization encoding unit to which the prescribed frequency band interframe difference signal is inputted, numeral 612 designates threshold value inputted to the dynamic vector quantization encoding unit 611, numeral 613 designates prescribed frequency band encoding data outputted from the dynamic vector encoding unit 611, numeral 614 designates a dynamic vector quantization decoding unit to which the prescribed frequency band encoding data 613 is inputted, numeral 615 designates prescribed frequency band interframe decoding difference signal outputted from the dynamic vector quantization decoding unit 614, numeral 616 designates an adder which adds the prescribed frequency band interframe decoding difference signal 615 and the prescribed frequency band interframe forecast signal 608, numeral 617 designates prescribed frequency band decoding video signal series outputted by the adder 616, numeral 618 designates a second frame memory to which the data read signal 605 is inputted and which supplies the prescribed frequency band decoding video signal series 617 with frame delay and generates the prescribed frequency band interframe forecast signal 608, numeral 619 designates a variable length encoding unit to which the prescribed frequency band encoding data 613 is inputted, numeral 620 designates a buffer for the speed smoothing connected to the variable length encoding unit 619, numeral 621 designates information generating quantity data outputted from the buffer 620, numeral 622 designates an encoding control unit to which the information generating quantity data 621 and the frequency band discrimination signal from the first frame memory 604 are inputted and which outputs the threshold value 612 to the dynamic vector quantization encoding unit 11 and also outputs the data read signal 605 to the first and second frame memories 604, 618, numeral 623 designates a circuit I/F connected to the buffer 620, and numeral 624 designates transmission signal outputted from the circuit I/F 623.

FIG. 23 is a block diagram illustrating constitution example of the band dividing unit 602 composed of M pieces of band pass filters to which the same input video signal series 601 is inputted.

Figure 24:
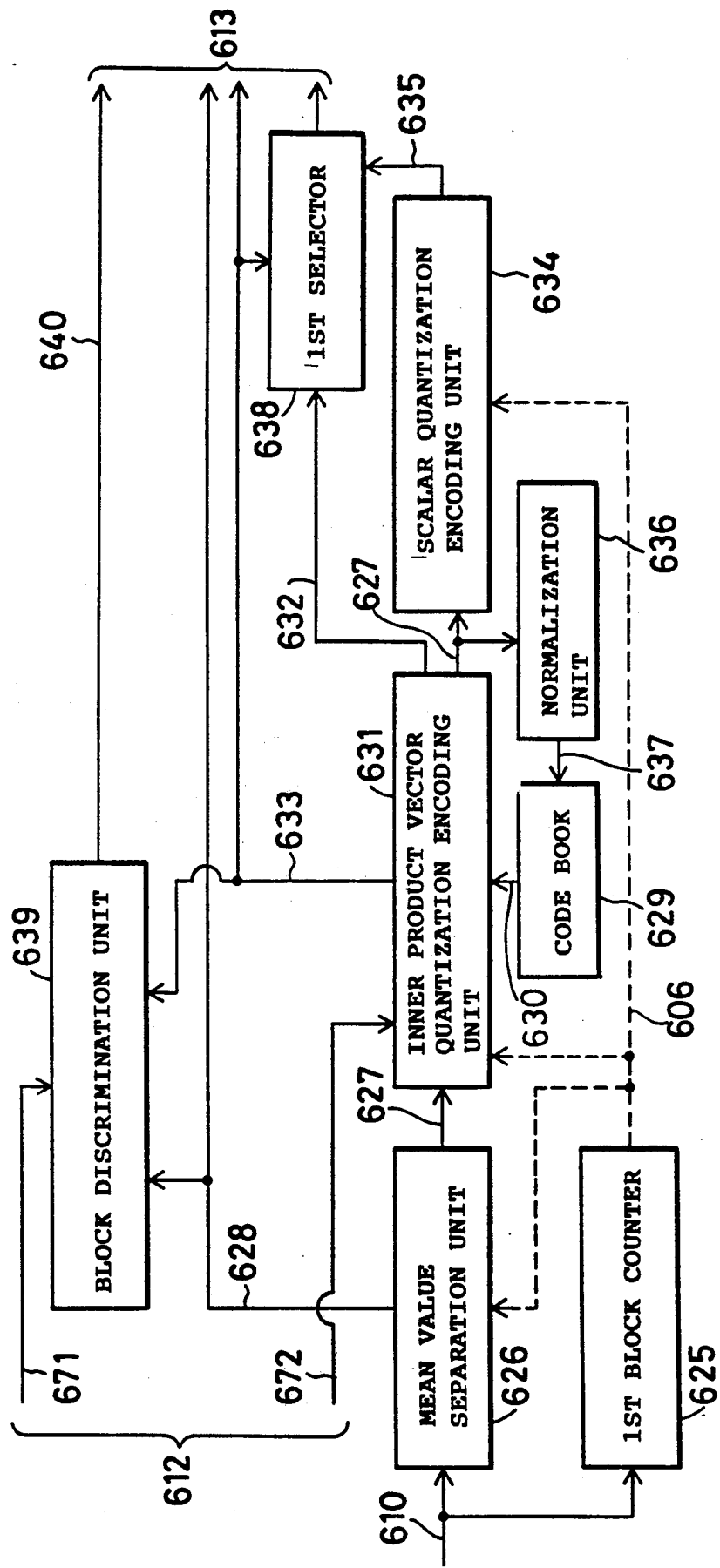
FIG. 24 is a block diagram illustrating constitution example of the dynamic vector quantization encoding unit in FIG. 22.

FIG. 24 is a block diagram illustrating constitution example of the dynamic vector quantization encoding unit 611. In FIG. 24, numeral 625 designates a first block counter which generates the frequency band discrimination signal 606 based on the prescribed frequency band interframe difference signal 610 from the subtractor 609, numeral 626 designates a mean value separation unit to which the prescribed frequency band interframe difference signal 610 and the frequency band discrimination signal 606 are inputted, numeral 627 designates mean value separation input vector outputted by the mean value separation unit 626, numeral 628 designates mean value encoding data outputted also by the mean value separation unit 626, numeral 629 designates a code book which stores normalization output vector and to which the frequency band discrimination signal 606 is inputted, numeral 630 designates normalization output vector outputted by the code book 629, numeral 631 designates an inner product vector quantization encoding unit to which the normalization output vector 630, the mean value separation input vector 627, the frequency band discrimination signal 606 and distortion threshold value 672 from the encoding control unit 622 are inputted, numeral 632 designates index of normalization output vector outputted by the inner product vector quantization encoding unit 631, numeral 633 designates amplitude encoding data outputted from the inner product vector quantization encoding unit 631, numeral 634 designates a scalar quantization encoding unit to which the frequency band discrimination signal 606 is inputted and which corresponds to the mean value separation input vector 627 passing through the inner product vector quantization encoding unit 631 without assigning the normalization output vector 630, numeral 635 designates mean value separation vector encoding data outputted from the scalar quantization encoding unit 634, numeral 636 designates a normalization unit to which the mean value separation vector 627 passing through the inner product vector quantization encoding unit 631 is inputted, numeral 637 designates normalization vector outputted from the normalization unit 636 to the code book 629, numeral 638 designates a first selector for selecting the index 632 from the inner product vector quantization encoding unit 631 and the mean value separation vector encoding data 635 from the scalar quantization encoding unit 634 based on the amplitude encoding data 633 from the inner product vector quantization encoding unit 631, numeral 639 designates a block discrimination unit to which the amplitude encoding data 633, the mean value encoding data 628 from the mean value separation unit 626, and the threshold value 612 from the encoding control unit 622 are inputted and numeral 640 designates block discrimination signal outputted by the block discrimination unit 639. The prescribed frequency band encoding data 613 outputted from the dynamic vector quantization encoding unit 611 is constituted by the block discrimination signal 640, the mean value encoding data 628, the amplitude encoding data 633 and output of the first selector 638.

Figure 25:
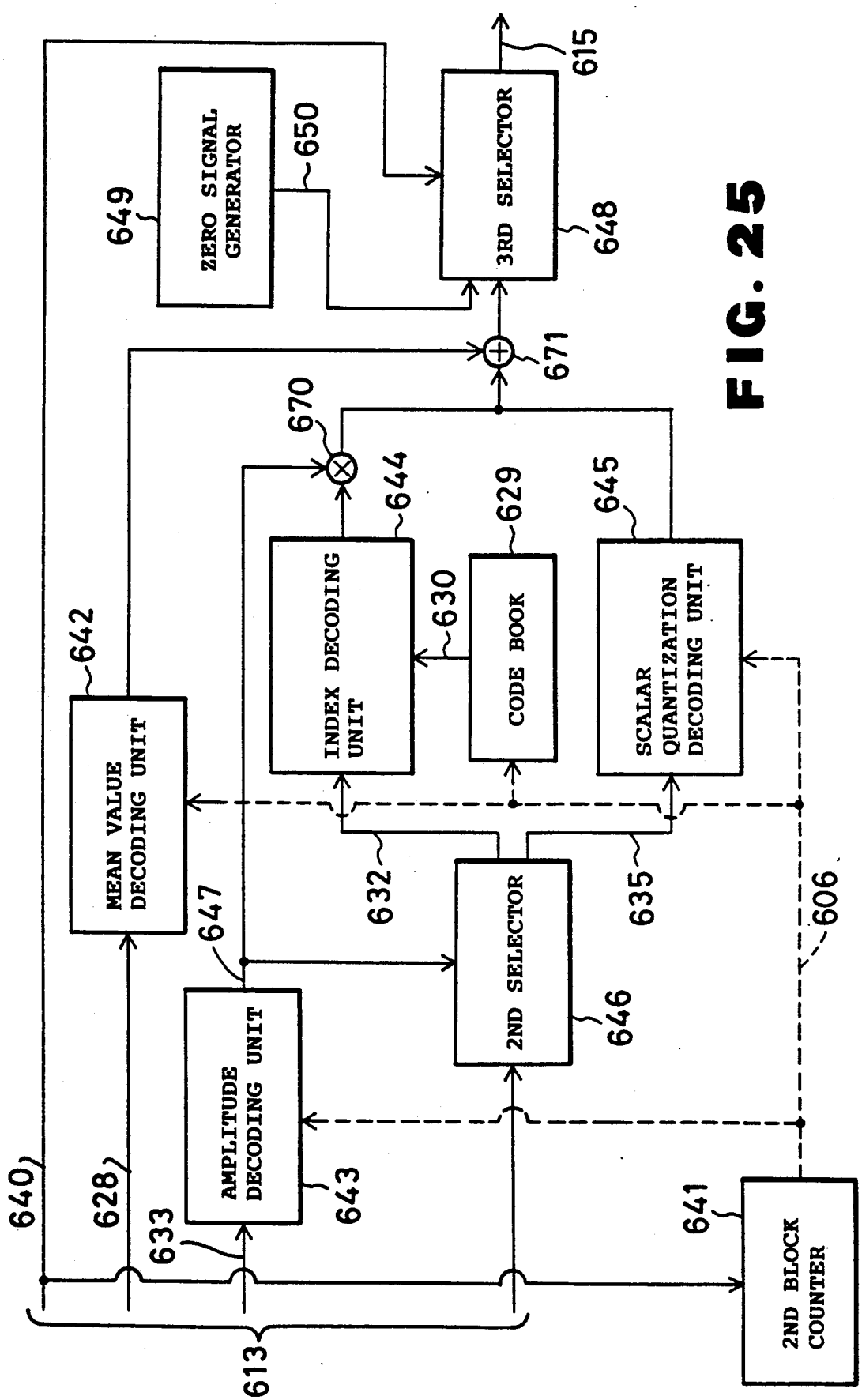
FIG. 25 is a block diagram illustrating constitution example of the dynamic vector quantization decoding unit in FIG. 22.

FIG. 25 is a block diagram illustrating constitution example of the dynamic vector quantization decoding unit 614. In FIG. 25, numeral 641 designates a second block counter to which the block discrimination signal 640 in the prescribed frequency band encoding data 613 is inputted and which outputs the frequency band discrimination signal 606, numeral 642 designates a mean value decoding unit to which the frequency band discrimination signal 606 and the mean value encoding data 628 in the prescribed frequency band encoding data 613 are inputted, numeral 643 designates and amplitude decoding unit to which the frequency band discrimination signal 606 and the amplitude encoding data 633 in the prescribed frequency band encoding data 613 are inputted, numeral 647 designates amplitude decoding data outputted from the amplitude decoding unit 643, numeral 646 designates a second selector which distributes signals transmitted from the first selector 638 as a part of the prescribed frequency band encoding data corresponding to the polarity of the amplitude decoding data 647, numeral 632 designates index of the normalization output vector distributed by the second selector 646, numeral 635 designates the mean value separation vector encoding data distributed also by the second selector 646, numeral 629 designates a code book similar to that in the dynamic vector quantization encoding unit 611, numeral 630 designates normalization output vector outputted by the code book 629, numeral 644 designates an index decoding unit to which the normalization output vector 630 and the index 632 from the second selector 646 are inputted, numeral 670 designates a multiplyer which multiplys the output of the index decoding unit 644 and the amplitude decoding data 647, numeral 645 designates a scalar quantization decoding unit to which the mean value separation vector encoding data 635 from the second selector 646 and the frequency band discrimination signal 606 are inputted, numeral 671 designates an adder which adds one of output of the scalar quantization decoding unit 645 and output of the multiplyer 670 to output of the mean value decoding unit 642, numeral 649 designates a zero signal generator, numeral 650 designates zero signal outputted from the zero signal generator 649, numeral 648 designates a third selector which selects output of the adder 671 and the zero signal 650 based on the block discrimination signal 640 in the prescribed frequency band encoding data 613, and numeral 615 designates prescribed frequency band interframe decoding difference signal outputted from the third selector 651.

FIG. 26 is a block diagram illustrating constitution example of the code book 629. In FIG. 26, numeral 651 designates a plurality of fixed code books, numeral 652 designates a plurality of dynamic code books, numeral 653 designates a fourth selector which selects the dynamic code book 652 in accordance with the frequency band discrimination signal 606, and numeral 654 designates a fifth selector which selects the fixed code book 651 and the dynamic code book 652.

Figure 27:
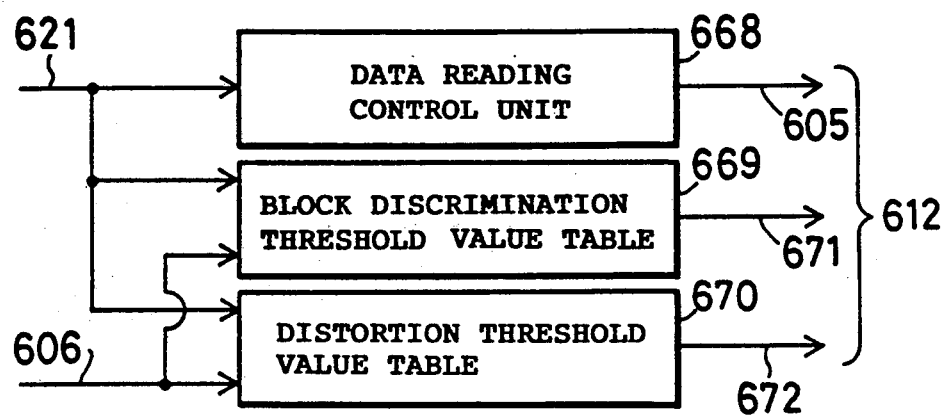
FIG. 27 is a block diagram illustrating constitution example of the encoding control unit in FIG. 22.

FIG. 27 is a block diagram illustrating constitution example of the encoding control unit 622. In FIG. 27, numeral 668 designates a data read control unit which outputs the data read signal 605 for the data read start command based on the information generating quantity data 621, numeral 669 designates a block discrimination threshold value table which determines block discrimination threshold value 671 based on the frequency band discrimination signal 606 supplied from the first frame memory 604 and the information generating quantity data 621, and numeral 670 designates a distortion threshold value table which determines distortion threshold value 672 based on the frequency band discrimination signal 606 and the information generating quantity data 621. The threshold value 612 outputted from the encoding control unit 622 is constituted by the block discrimination threshold value 671 and the distortion threshold value 672.

Next, operation will be described. Input video signal series 601 is converted by a band dividing unit 602 hereinafter described in detail into a plurality of frequency band separation input video signal series 603 divided in space frequency band. Individual frequency band separation input video signal series 603 are stored in a first frame memory 604, and prescribed frequency band input video signal series 607 is read from the first frame memory 604 in prescribed order and in time division in accordance with data read signal 605 supplied from an encoding control unit 622. The first frame memory 604 outputs frequency band discrimination signal 606 at the same time. The prescribed frequency band input video signal series 607 read from the first frame memory 604 is transmitted to a subtractor 609, and prescribed frequency band interframe forecast signal 608 corresponding to the prescribed frequency band input video signal series 607 from a seconds frame memory 618 is subtracted thereby conversion to prescribed frequency band interframe difference signal 610 is performed. Since the prescribed frequency band interframe difference signal 610 becomes small in power in comparison to the prescribed frequency band input video signal series 607, the encoding with little encoding error is possible. In a dynamic vector quantization encoding unit 611, as hereinafter described in detail, the prescribed frequency band interframe difference signal 610 inputted in prescribed order is changed adaptively in quantization characteristics in accordance with level of space frequency and the encoding is performed. That is, taking in consideration of the visual sense characteristics of human beings, the encoding with low accuracy is performed to the prescribed frequency band interframe difference signal 610 with high space frequency, and the encoding with high accuracy is performed to the prescribed frequency band interframe difference signal 610 with low space frequency. Also in the dynamic vector quantization encoding unit 611, in accordance with threshold value 612 supplied from the encoding control unit 622, decision of valid block/ invalid block and selection of vector quantization and scalar quantization are performed. Prescribed frequency encoding data 613 encoded in the dynamic vector quantization encoding unit 611 is decoded in a dynamic vector quantization decoding unit 614 and converted into prescribed frequency band interframe decoding difference signal 615. In an adder 616, prescribed frequency band interframe forecast signal 608 outputted by the second frame memory 618 and the prescribed frequency band interframe decoding difference signal 615 are added thereby prescribed frequency band decoding video signal series 617 is obtained. The prescribed frequency band decoding video signal series 617 is temporarily stored in the second frame memory 618 and supplied with frame delay, and read in accordance with data read signal 605 from the encoding control unit 622 and outputted as the prescribed frequency band interframe forecast signal 608. On the other hand, the prescribed frequency band encoding data 613 is subjected to variable length encoding in a variable length encoding unit 619 and temporarily stored in a buffer 620 and subjected to the speed smoothing processing, and then transmitted as transmission signal 624 through a circuit I/F 623. Also in the buffer 620, information generating quantity data 621 obtained from storage quantity of the variable length encoded data is supplied to the encoding control unit 622. In the encoding control unit 622, in accordance with the information generating quantity data 621 and the frequency band discrimination signal 606, data read signal and threshold value 612 constituted by block discrimination threshold value 671 and distortion threshold value 672 are generated, and the data read signal 605 is supplied to the first frame memory 604 and the second frame memory 618 and the threshold value 612 is supplied to the dynamic vector quantization encoding unit 611 thereby the information generating quantity is controlled.

Next, referring to FIG. 23, operation of the band dividing unit 602 will be described. As shown in FIG. 23, the band vididing unit 602 is constituted by M pieces of band pass filters #1—#M respectively being different in pass band, and the input video signal series 601 is inputted in parallel to these band pass filters. Consequently, from respective band pass filters, M sorts of the video signal series having different prescribed space frequency bands are obtained and outputted as the frequency band separation input video signal series 603.

Referring to FIG. 24, operation of the dynamic vector quantization encoding unit 611 will be described. The prescribed frequency band interframe difference signal 610 is converted into vector in the mean value separation unit 626, and the mean value is separated and it is outputted as the mean value separation input vector 627. On the other hand, the separated mean value is changed in quantization characteristics and quantized based on the frequency band discrimination signal 606, and then outputted as the mean value encoding data 628 separately. In the first block counter 625, the prescribed frequency band interframe difference signal 610 inputted in definite order is counted in block unit thereby the frequency band discrimination signal 606 is generated and outputted. In the inner product vector quantization encoding unit 631, among the inner product between the mean value separation input vector 627 and the normalization output vector 630 stored in the code book 629, the normalization output vector 630 to give the maximum inner product is detected and the index i 632 is outputted to the first selector 638. Since the amplitude g is equal to the maximum inner product value, it is detected simultaneously with the index i 632. If the mean value separation input vector 627 is made $\underline{Z}=[z_1, z_2, \ldots, z_K]$ and the normalization output vector 630 to give the maximum inner product is made $y_i$, the inner product vector quantization processing is described, for example, by following formulas.

maximum inner product: $P\,\text{max} = |\underline{Z}| \cdot |y_i| \cos\theta$
$\phantom{\text{maximum inner product: } P\,\text{max}} = |\underline{Z}| \cos\theta$ amplitude: $g = P\,\text{max}$
mean value separation output vector: $g \cdot y_i$
distortion between input/output vectors:
$D = d(Z, g \cdot y_i)$
$\phantom{D} = \sqrt{|\underline{Z}|^2 - |g \cdot y_i|^2}$
$\phantom{D} = \sqrt{|\underline{Z}|^2 - |g|^2}$ The amplitude g estimated by the above formula is quantized in that quantization characteristics are changed corresponding to the space frequency band based on the frequency band discrimination signal 606, and then outputted as amplitude encoding data 633 from the inner product vector quantization encoding unit 631. However, if the distortion D between input/output vectors is larger than the distortion threshold value 672 inputted from the encoding control unit 622, the amplitude encoding data 633 is outputted with its sign inverted. Also the index 632 is not outputted to the first selector 638, and in place of it, the mean value separation input vector 627 from the mean value separation unit 626 is outputted as it is to the scalar quantization encoding unit 634 and the normalization unit 636. The mean value separation input vector 627 is quantized in the scalar quantization encoding unit 634 based on the frequency band discrimination signal 606, and the generated mean value separation vector encoding data 635 is outputted to the first selector 638. The mean value separation input vector 627 is normalized in the normalization unit 636, and the normalization vector 637 is generated.

The normalization vector 637 as hereinafter described in detail is stored in the code book 629 and used as the normalization output vector 630. In the first selector 638, in accordance with the sign of the amplitude encoding data 633, selection of the index 632 from the inner product vector quantization encoding unit 631 and the mean value separation vector quantization data 635 from the scalar quantization encoding unit 634 is performed. In the block discrimination unit 639, decision of valid block/invalid block is performed from the block discrimination threshold value 671 inputted from the encoding control unit 622, the mean value encoding data 628 and the amplitude encoding data 633, and the block discrimination signal 640 is generated. Regarding invalid block, the mean value encoding data 628 and the amplitude encoding data 633, the index 632 or the mean value separation vector encoding data 635 need not be transmitted.

Referring to FIG. 25, operation of the dynamic vector quantization decoding unit 614 will be described. The second block counter 641 performs count using the block discrimination signal 640 from the dynamic vector quantization encoding unit 611, and generates the frequency band discrimination signal 606. In the mean value decoding unit 642, the amplitude decoding unit 643, the index decoding unit 644 and the scalar quantization decoding unit 645, decoding processing is performed using the frequency band discrimination signal 606. In the second selector 646, in accordance with the polarity of the amplitude decoding data 647 outputted by the amplitude decoding unit 643, discrimination of the index 632 transmitted from the dynamic vector quantization encoding unit 611 and the mean value separation vector encoding data 635 is performed. In the third selector 648, discrimination of valid block/invalid block is performed based on the block discrimination signal 640. In the case of invalid block, zero signal 650 outputted from the zero signal generator 649 is selected.

Referring to FIG. 26, the code book 629 will be described. 10 The code book is constituted by $L_1$ pieces of the fixed code books 651 #1 — #$L_1$ and $L_2$ pieces of the dynamic code books 652 #1 — #$L_2$. If the normalization vector 637 is inputted from the normalization unit, in the fourth selector 653, suitable dynamic code book 652 is selected based on the frequency band discrimination signal 606. In the selected dynamic code book 652, in place of the normalization output vector 630 with low use frequency stored there, the normalization vector 637 is newly stored as the normalization output vector 630, thereby the code book is optimized. These plural fixed code books 651 and the dynamic code books 652 are selected by the fifth selector 654 acting in accordance with the frequency band discrimination signal 606, and outputs the output vector 630 for the vector quantization.

Figure 28:
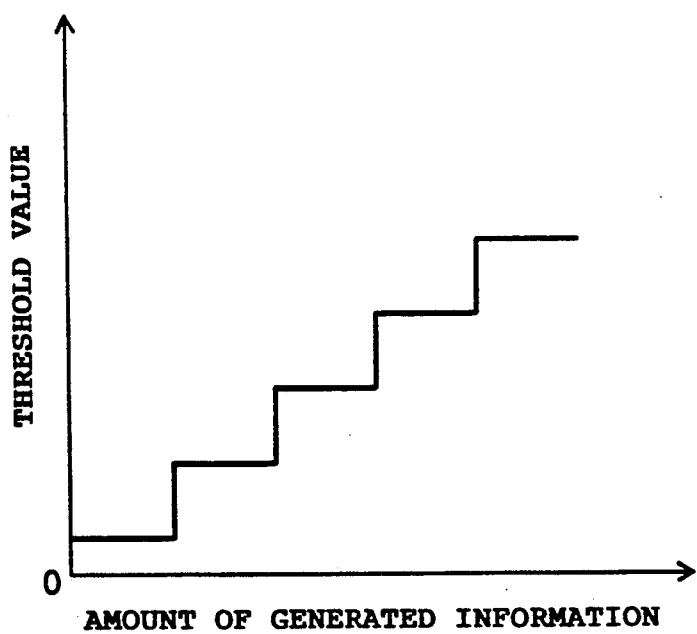
FIG. 28 is a diagram illustrating relation of information generating quantity inputted and threshold value outputted respectively in the block discrimination threshold value table and the distortion threshold value table in FIG. 27.

Referring to FIG. 27, operation of the encoding control unit 622 will be described. In the data read control unit 68, the information generating quantity data 621 is counted thereby pulse signal for the data read start command in the first frame memory 604 and the second frame memory 618 is outputted as the data read signal 605. On the other hand, in the block discrimination threshold value table 669 and the distortion threshold value table 670, a plurality of threshold value tables are provided in space frequency band separation, and prescribed threshold value table is selected by the frequency band discrimination signal 606. As shown in FIG. 28, by the prescribed threshold value table, the block discrimination threshold value 671 and the distortion threshold value 672 are outputted respectively as threshold values corresponding to value of the inputted information generating quantity data 621.

In the embodiment, although the data read signal 605 and the threshold value 612 outputted from the encoding control unit 622 are determined based on the storage quantity of the buffer 620, these output signals may be determined in accordance with the data speed of used circuit or format of the input video signal series 601.

Also in the embodiment, although the distortion threshold value 672 supplied from the encoding control unit 622 is inputted to the inner product vector quantization unit 631 in the dynamic vector quantization encoding unit 611, the distortion threshold value 672 may be taken in the scalar quantization encoding unit 634 and scalar quantization characteristics may be controlled. Also the scalar quantizer in the scalar quantization unit 634 may be constituted by a vector quantizer.

Further, combination together with method of movement compensation for outputting using the frame memory content within the loop also has similar effects.

A fourth embodiment of this invention will be explained with reference to FIGS. 29–32. Referring to FIG. 29, 701 denotes a camera; 702, monitor; 703, high performance dynamic video encoding apparatus (video codec) of $l_1 \times 8$ Kbps to $(l_1 \times 8 + 6.4)$ Kbps coding rate connected to the camera 701 and monitor 703; 704, digital data output of video codec 703; 705, microphone; 706, speaker; 707, high performance voice encoding apparatus (voice codec) of $l_2 \times 8$ Kbps coding rate; 708, digital data output of voice codec 707; 709, transmission control means for multiplexing digital data 704 and 708 to $l \times 8$ Kbps to transmit to the transmission line 710; 710, digital transmission line having the capacity of $l \times 8$ Kbps connected to the transmission control means.

Figure 30:
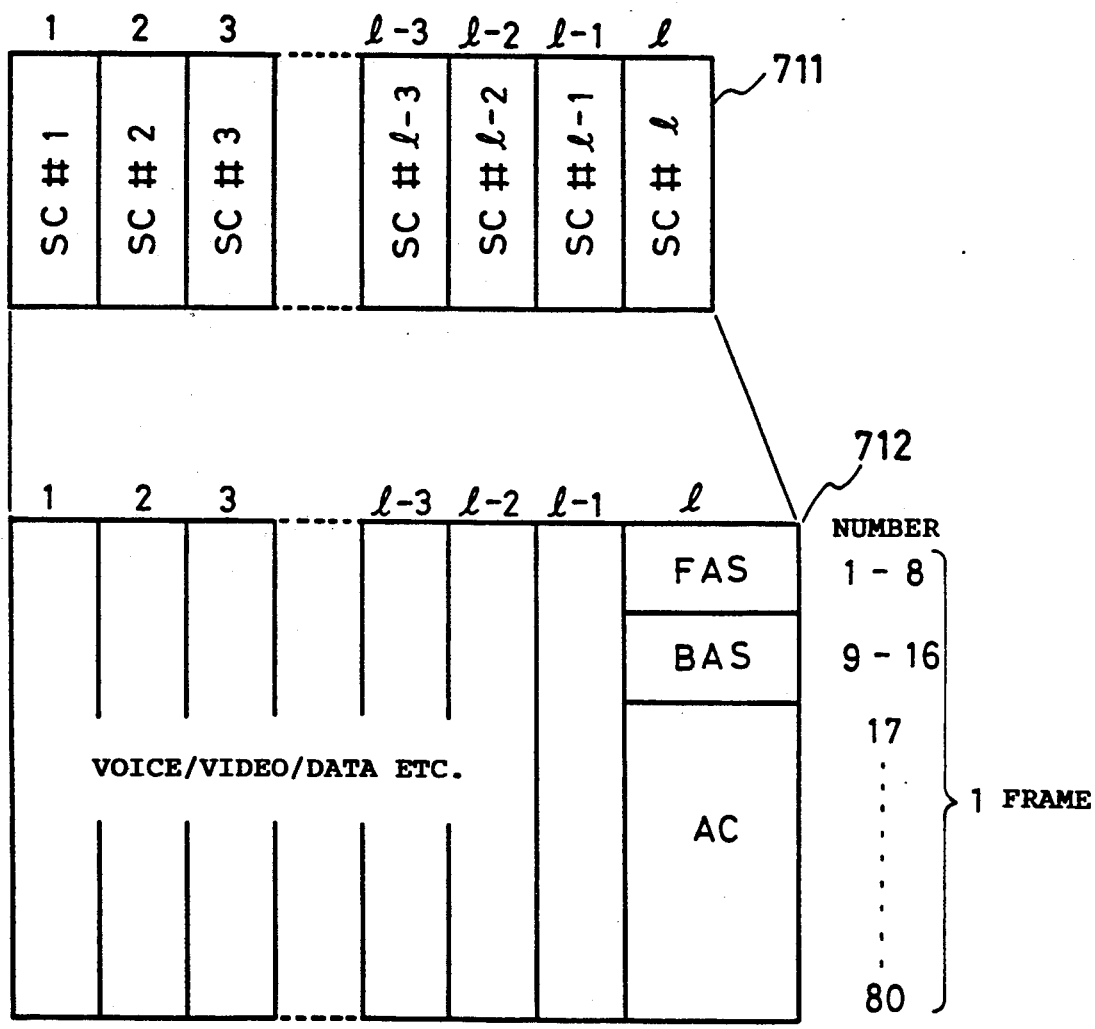
FIG. 30 is a frame format of multimedia data transmission system depending on an embodiment of the present invention.

FIG. 30 illustrates a data transmission frame format for the transmission control means 710 of FIG. 29. In the same figure, 711 denotes basic time slot of 1-bit length having the repetition frequency of 8 kHz; 712, transmission frame comprised of 80 basic time slots 711.

FIG. 31 illustrates a profile of transmission frame to be sent to the $l \times 8$ Kbps line from the transmission control means 710 shown in FIG. 29. In the same figure, 713 is bit string data transmitted to the transmission line.

Operation will then be explained hereunder. FIG. 29 shows an example of applying the present invention to a video communication terminal having the multiplex communication function with $l_1 \times 8$ Kbps to $(l_1 \times 8 + 6.4)$ Kbps video signal and $l_2 \times 8$ Kbps voice signal. $L_1$, $l_2$ are integers equal to or larger than 1 and channel is assigned to the video and voice signals under the relationship of $l = l_1 + l_2 + 1$. Here, the video signal input from the camera 701 is encoded in the video codec 702, from which the digital data 704 of $l_1 \times 8$ Kbps to $(l_1 \times 8 + 6.4)$ Kbps is transmitted. Meanwhile, the voice codec 707 encodes the voice signal input from the microphone 705 and transmits the digital data 708 of $l_2 \times 8$ Kbps. The transmission control means 709 multiplexes the digital data 704 and 708 into $l \times 8$ ( l is integer equal to or larger than 1) to send to the transmission line 710. In the receiving side, operations are conducted in the reverse manner to decode the digital data 704 and 708 in order to output the regenerated video and voice signals from the monitor 701 and speaker 706.

In FIG. 30, the transmission frame format in the transmission control means 709 is explained. Since the basic time slot 711 has the 1-bit length, the repetition frequency $T_s$ of basic time slot becomes as follow under the transmission rate of $1 \times 8$ Kbps.

$$T_s = 1 \times 8 \text{ Kbps}/1 \text{ bit} = 8 \text{ Hz}$$

Therefore, the transmission capacity of each subchannel is given as 8 Kbps and the transmission frame 712 can be formed on the basis of the basic time slot of 8 kHz as in the case of prior art. Accordingly, in case the frame format same as the prior art, for example, is applied in the present invention, the transmission frame 712 can be applied to the line of $1 \times 8$ Kbps even when it is the same. In this case, the first subchannel is used as the service channel and structure of FAS, BAS, AC does not depend on the value of Therefore, any problem does not occur even when the structure of FAS, BAS, AC is the same as that shown in FIG. 8 and FIG. 9 and it makes possible to apply such structure to the $1 \times 8$ Kbps line under the same H/W.

Thereby, in case the $l_1$ bits in the bits are assigned to the video signal in FIG. 29, the bit rate of $l_1 \times 8$ Kbps can be assigned and moreover when the AC is assigned to the video signal, the bit rate of $(l_1 \times 8 + 6.4)$ Kbps can be assigned. In addition, assignment of $l_2$ bits to the voice signal makes possible the assignment of the bit rate of $l_2 \times 8$ Kbps to the voice signal and this bit rate matches the encoding rate of voice codec as is described previously.

FIG. 31 illustrates a profile of a bit string 712. The multiframe format and frame format are same as those of prior art. When the line rate is 56 Kbps, such bit rate can be attained by selecting $l=7$, and when the rate is 32 Kbps, it can be attained by selecting $l=4$.

In above explanation about this embodiment, the bit rate of transmission line 710 is set to $1 \times 8$ Kbps, but the interface rate to the line may be selected to $m \times 8$ Kbps (m is integer $\geq 1$). In this case, it is enough that the dummy data of m-1 bits is properly arranged in the frame 714. In this case, the dummy data and the data from the other transmission line may be ORed and can also be multiplexed by setting the content of dummy data to "1".

Figure 32:
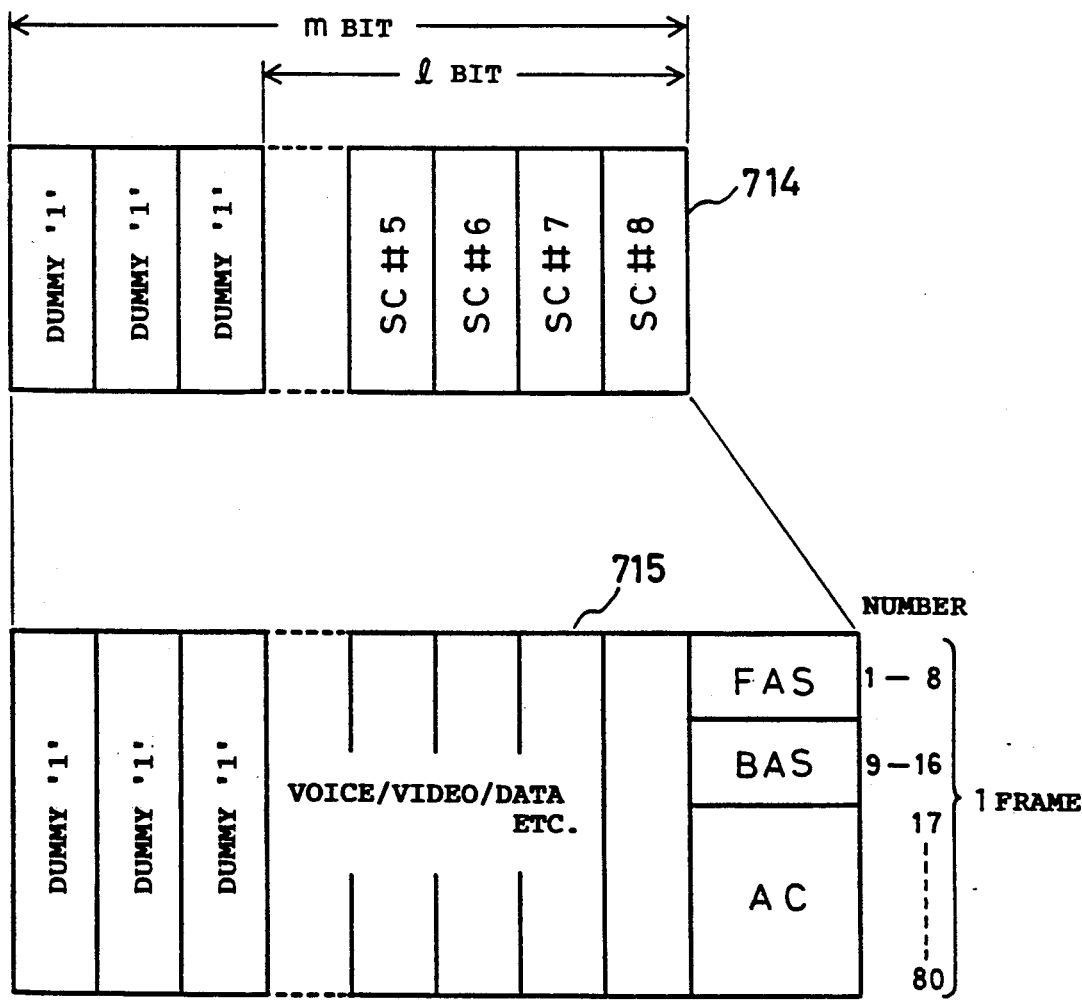
FIG. 32 is a frame format of multimedia data transmission system depending on another embodiment of the present invention.

FIG. 32 is a frame format under this condition, wherein the frame of 1-bit is arranged in the basic frame of m-bit to form the transmission frame 715.

Figure 33:
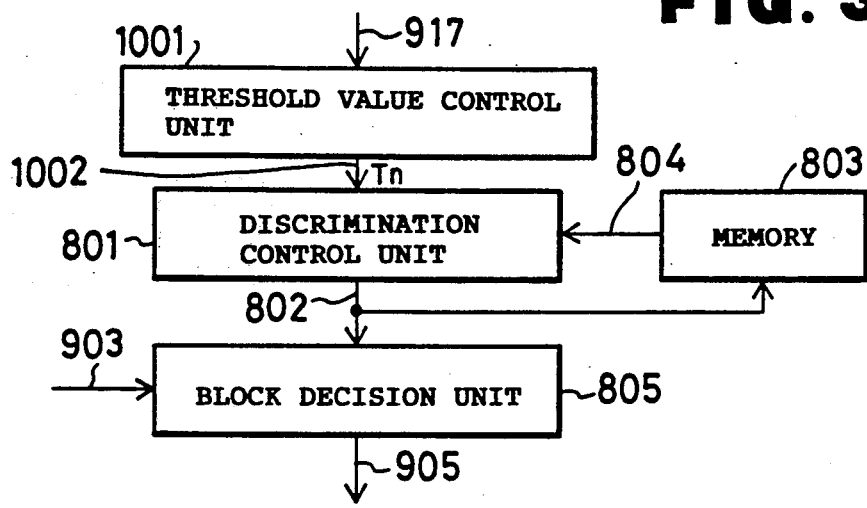
FIG. 33 is a block diagram of an example of the configuration of the block discrimination means in the encoding control system of the present invention.

A fifth embodiment of the present invention will then be explained with reference to FIGS. 33-37. FIG. 33 is an example of configuration of a block discrimination means for executing the encoding control system of the present invention.

Figure 36:
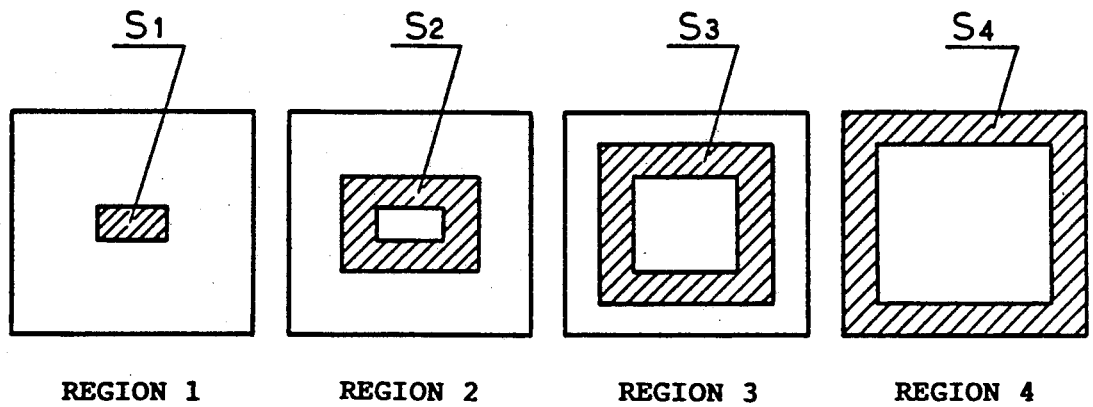
FIG. 36 is a setting example of region.

1001 designates a threshold value control means for outputting a threshold value Th 1002 corresponding to the encoding control parameter 917; 1002, a threshold value Th output from the threshold value control means; 801, a discrimination control means for inputting a parameter S4 representing the threshold value $T_0$ for comparison, threshold values $T_1$, $T_2$, $T_3$, $T_4$ for each region among the region 1, region 2, region 3, region 4 indicated as the hatched regions in FIG. 36 which have been used and the region and determining and outputting a parameter S2 representing the threshold value $T_1$, $T_2$, $T_3$, $T_4$ for the regions used for the current frame, threshold value $T_0$ for comparison and the region depending on comparison between the threshold value Th and the threshold value $T_0$ for comparison. 803 designates a memory for storing the threshold value $T_0$ for comparison, the threshold value $T_1$, $T_2$, $T_3$, $T_4$ for each region and the parameter S representing the region and updating such data for each frame. 805 designates a block decision means for deciding a block depending on a value of threshold values $T_1$, $T_2$, $T_3$, $T_4$ for each region used in the current frame output from the discrimination control means 801 and outputting the block discrimination data $v$905.

Figure 12:
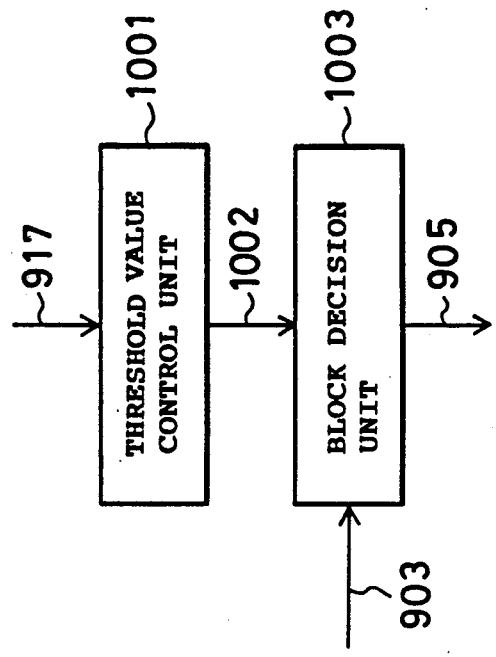
FIG. 12 is a block diagram indicating a configuration of the interframe encoding apparatus shown in FIG. 11.
Figure 13:
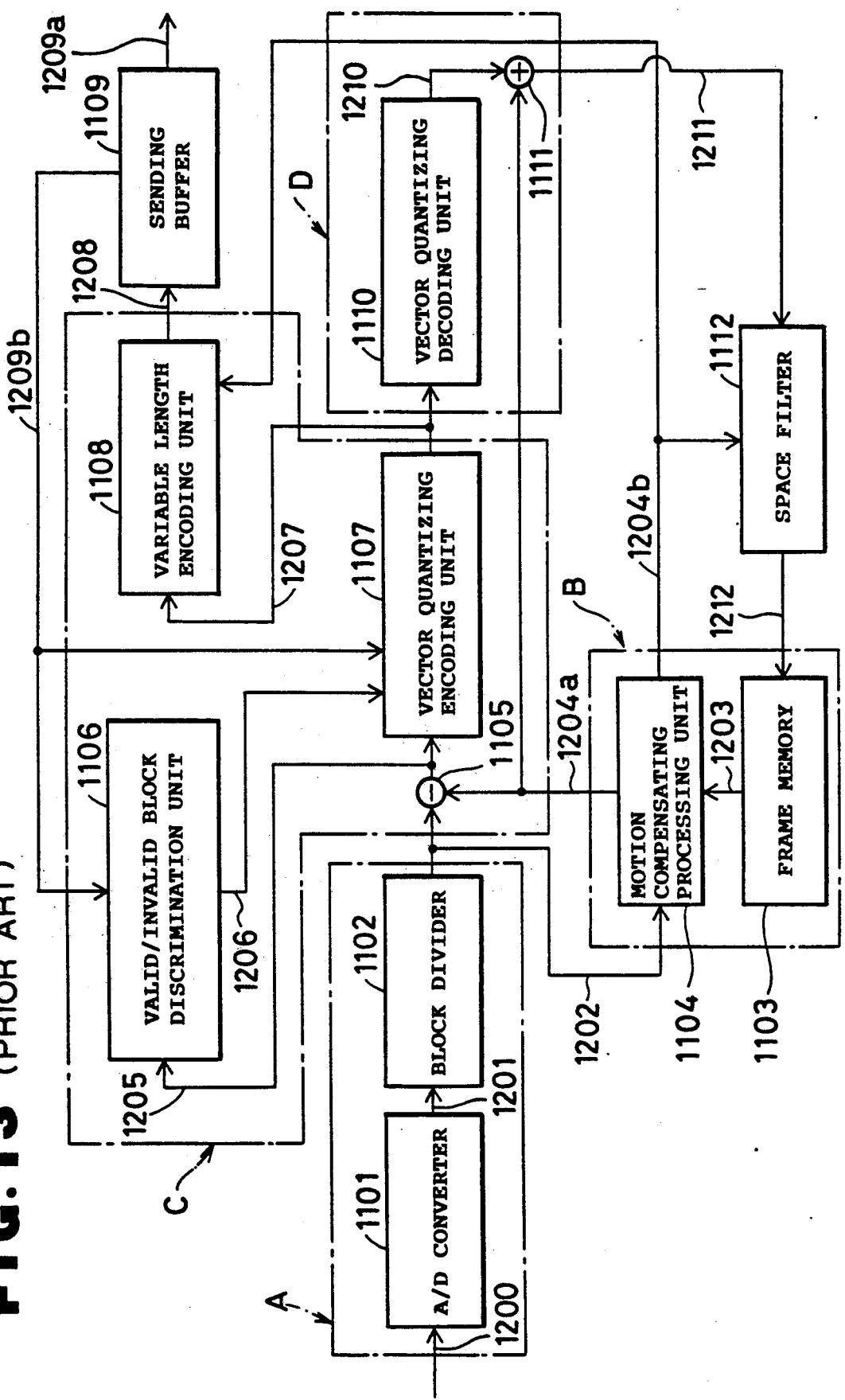
FIG. 13 is a block diagram indicating a configuration of an image encoding transmission apparatus of the prior art.

FIG. 33 corresponds to the block discrimination means 904 in FIG. 12 and therefore the other portions are similar to those in FIG. 12.

Operation will then be explained.

Figure 34:
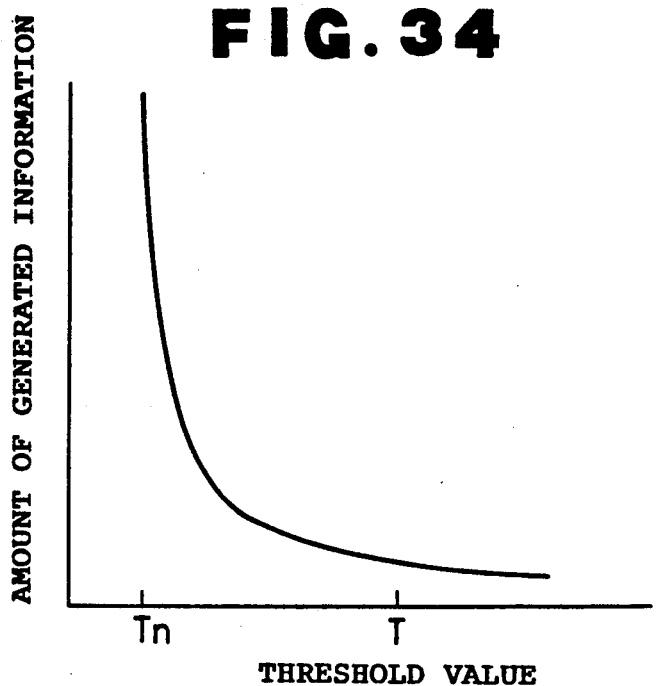
FIG. 34 illustrates relationship between the threshold values and amount of information generated.
Figure 35:
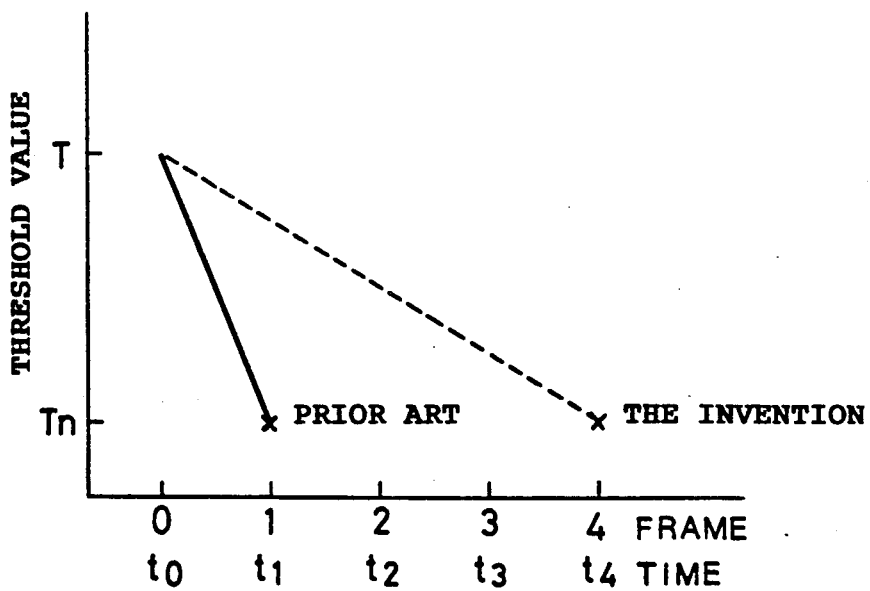
FIG. 35 illustrates relationship between threshold values and time (frame)

If the block discrimination threshold values are all lowered in the same degree in unit of frame in the block discrimination means when an image becomes stationary image, the number of valid blocks, causing a value of block discrimination data $v$ to be set to 1 increases, showing sudden increment in amount of information generated as indicated by a solid line of FIG. 34. Therefore, the threshold value $T_0$ for comparison ($T_0$ represents a threshold value of preceding frame when Tn is larger than $T_0$ or the predetermined threshold value in other cases) is compared with the threshold value Tn 1002 output from the threshold value control means 1001 to suppress sudden increase in amount of information generated. If Tn is smaller than $T_0$, a threshold value of frame as a whole is not lowered to the predetermined value at a time as indicated by a solid line in FIG. 35. Namely, when the frame wherein Tn which is not smaller than $T_0$ becomes smaller than $T_0$ is considered as the first frame, the next frame as the second frame, the next frame as the third frame and the next frame as the fourth frame, the threshold values of the first, second, third and fourth frames are sequentially lowered, as indicated by the dotted line in FIG. 35, approximately to the predetermined value and when the processing for the fourth frame has completed, the threshold old value of the frame has completed, the threshold value of the frame as a whole becomes the predetermined value, so that the threshold value of the frame as a whole is lowered step by step and after the constant period to the predetermined value.

Explanation will be continued with reference to FIG. 33. The discrimination control means 801 updates the threshold values $T_1$, $T_2$, $T_3$, $T_4$ for respective regions used in the block decision means 805 depending on a value of parameter S representing result of comparison between the threshold value Tn 1002 corresponding to the encoding control parameter 917 output from the threshold value control means 1001 and the threshold value $T_0$ for comparison read from the memory 803 and the region, also updates the parameter S representing the threshold value $T_0$ for comparison and the region to be stored in the memory 803 and outputs the value of parameter S representing the threshold values $T_1$, $T_2$, $T_3$, $T_4$ for respective regions, threshold value $T_0$ for comparison and the region. The block decision means 805 decides the block with the threshold values $T_1$, $T_2$, $T_3$, $T_4$ for each region output from the discrimination control means 801 and outputs the block discrimination data $v$905.

Figure 37:
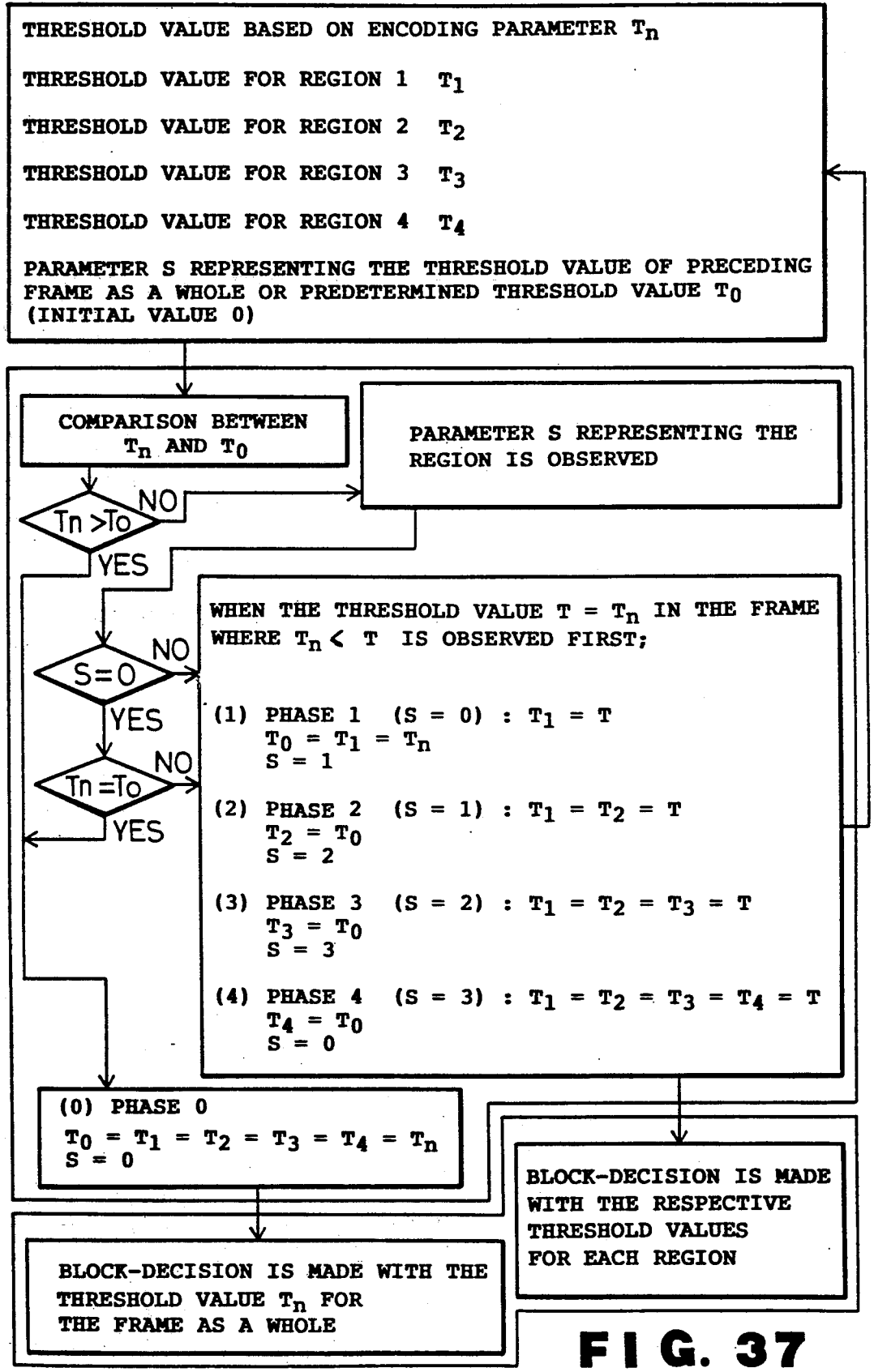
FIG. 37 illustrates flows of processings in the block discrimination means.

Explanation will be continued along with FIG. 37 indicating flows of processing based on an example of structure of the block discrimination means shown in FIG. 33.

First, the threshold value Tn 1002 corresponding to the encoding control parameter 917 output from the threshold value control means 1001 is compared with the threshold value $T_0$ for comparison read from the memory 803. Next, comparison between Tn and $T_0$ provides a result that Tn is not larger than $T_0$, a value of the parameter S representing the region read from the memory 803 is observed. From the result of comparison between Tn and $T_0$ and a value of S, following processings are carried out.

(0) Phase 0

When Tn is larger than $T_0$ and Tn is equal to $T_0$ with a value of S set to 0, the discrimination control means 801 updates all the values of $T_0$, $T_1$, $T_2$, $T_3$, $T_4$ to Tn, outputs 0 as the value of S and stores such values to the memory 803. The block decision means 805 decides the block for the entire part of frame with the threshold value Tn and outputs the block discrimination data 905.

(1) Phase 1

When Tn is smaller than $T_0$ and a value of S is zero, the discrimination control means 801 updates the values of $T_0$, $T_1$ to Tn and a value of S to 1, outputs the values of $T_2$, $T_3$ and $T_4$ directly and stores these values to the memory 803.

The block decision means 805 decides the block for the region 1 with $T_1 = Tn = T_0$ and for the regions 2, 3, 4 with $T_2$, $T_3$, $T_4$ same as the previous phase and outputs the block discrimination data $\nu$905.

(2) Phase 2

When a value of S is 1, the discrimination control means 801 updates the value of $T_2$ to $T_0$ and a value S to 2, directly outputs the values of $T_0$, $T_1$, $T_3$, $T_4$ to store these values to the memory 803. The block decision means 805 decides the block for the region 1+2 with $T_0$, and the block for the regions 3, 4 with $T_2$, $T_4$ like the previous phase, and outputs the block discrimination data $\nu$905.

(3) Phase 3

When a value of S is 2, the discrimination control means 801 updates the value of $T_3$ to $T_0$ and a value of S to 3, directly outputs the values of $T_0$, $T_1$, $T_2$, $T_4$ to store to the memory 803. The block decision means 805 decides the block for the region 1+2+3 with $T_0$ and for the region 4 with $T_4$ like the previous phase and outputs the block discrimination data $\nu$905.

(4) Phase 4

When a value of S is 3, the discrimination control 801 updates the value of $T_4$ to $T_0$ and a value of S to 0 and directly outputs the values of $T_0$, $T_1$, $T_2$, $T_3$ to store to the memory 803. The block decision means 805 decides the block for the frame as a whole with the threshold value of $T_0$ and outputs the block discrimination data $\nu$905.

The processings in the phase 1, phase 2, phase 3 and phase 4 are directed to lower the threshold value of the regions 801 in the phase (1), regions 1+2 in the phase (2), regions 1+2+3 in the phase (3) and the frame as a whole in the phase (4) to the value T under the condition that the threshold value Tn of the frame wherein $Tn < T_0$ is observed first is assumed to T.

In this embodiment, the region is set in such a manner as expanding radially and the period required until the threshold value of the frame as a whole is lowered to the predetermined value is assumed as four frames, as an example, and setting of the region and the period required until the threshold value of the frame as a whole is lowered to the predetermined value can be determined freely.

For instance, it is possible to set the region at random to establish the frame as a whole with m-period (m is a natural number).

Moreover, in the interframe encoding apparatus of FIG. 12, the present invention can also be applied in the mode that the regions which are sequentially designated in accordance with the predetermined sequence synchronized with the sending and receiving are set on the basis of the embodiment, the sequence information representing the process of framing time and the regions other than those designated are sent to the interframe encoding process so that the regions described are sent to the frame encoding process and the entire part of frame is then sent to the frame encoding process after the constant framing time.

A sixth embodiment suitable for an image encoding transmission apparatus of the present invention will be explained with reference to FIGS. 38–44.

Figure 38:
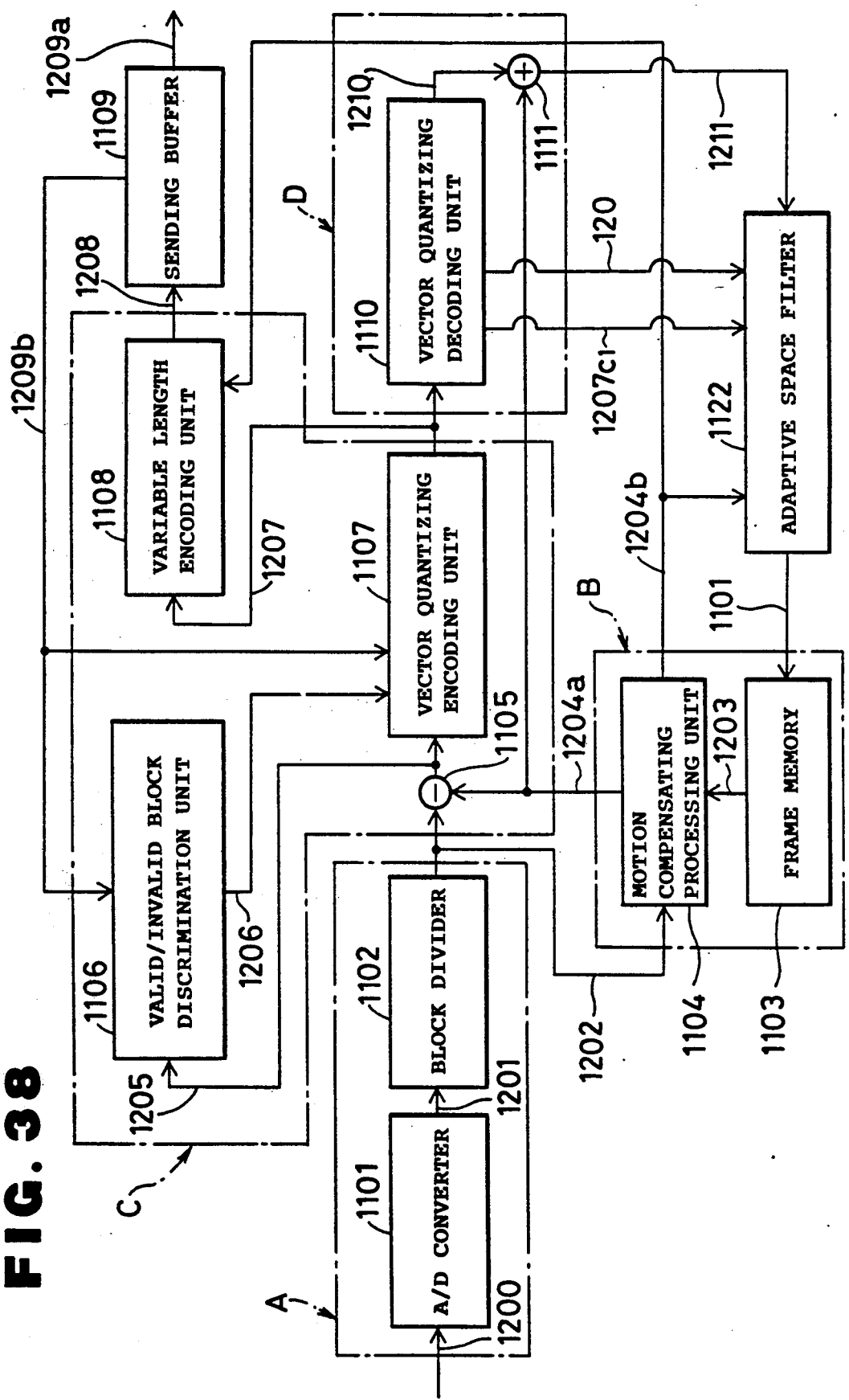
FIG. 38 is a block diagram of an embodiment suitable for an image encoding transmission apparatus of the present invention.

FIG. 38 is a block diagram indicating a configuration of an image encoding transmission apparatus depending on the embodiment of the present invention.

Moreover, FIG. 39 is a detail block diagram of the vector quantizing encoding means.

In these figures, the like elements as those in the prior art of FIG. 1 are given the like numerals and explanation thereof are omitted here.

As shown in these figures, the vector quantizing encoding means 1107 comprises a quantizing control means 1107a for controlling quantizing characteristics based on the decision information 1206 output from the valid/invalid block discrimination means 1106 and amount of information 1209b of send data of the preceding frame stored tentatively to the send buffer 1109, a mean value separation means 1107b for calculating a mean value m of the effective difference vector signal 1207a output from the quantizing control means 1107a and separating a mean value of the difference vector signal 1207a, an inner product vector quantizing means 1107c for vector-quantizing the mean value separating vector signal 1207b2 output from the mean value separating means 1107b and a code book 1107d for storing a plurality of pattern vector.

Therefore, the quantizing control means 1107a directly outputs the difference vector signal 1205 as effective difference vector signal 1207a when the information describe 1206 is valid and or the zero vector as the effective difference vector 1207a when the information is invalid.

The mean value separating means 1107b separates a mean value of the effective difference vector signal 1207 on the basis of the mean value m calculated above. Moreover, the mean value separating means 1107b quantizes the mean value m on the basis of the quantizing characteristic (S1) designated by the quantizing control means 1107a and outputs the mean value quantizing number 1207b1.

This circuit then outputs the means value separating vector 1207b2 output from the mean value separating means 1107b to the internal product vector quantizing means 1107c.

Figure 40:
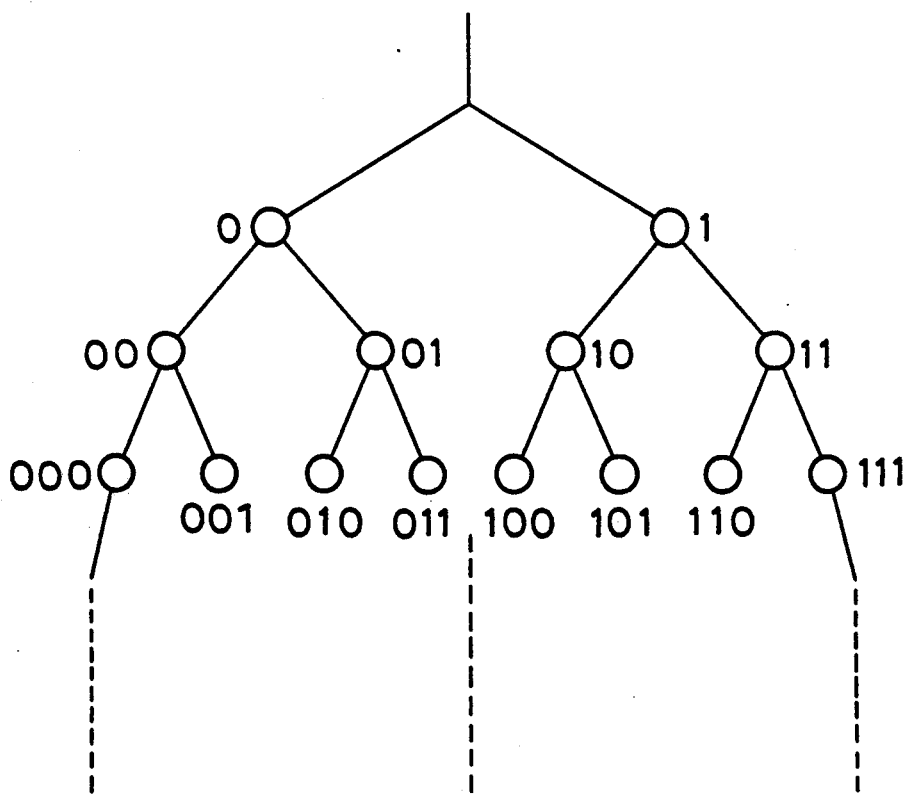
FIG. 40 is a structure of the code book used for vector quantizing encoding and vector quantizing decoding.

Next, the internal product vector quantizing means 1107c selects the pattern vector having the largest internal product by calculation of internal product of the mean value separating vector 1207b2 using a code book 1107d for storing a pattern vector of a plurality of mean value separating and normalizing vectors arranged in the form of tree-structure as shown in FIG. 40.

Figure 41:
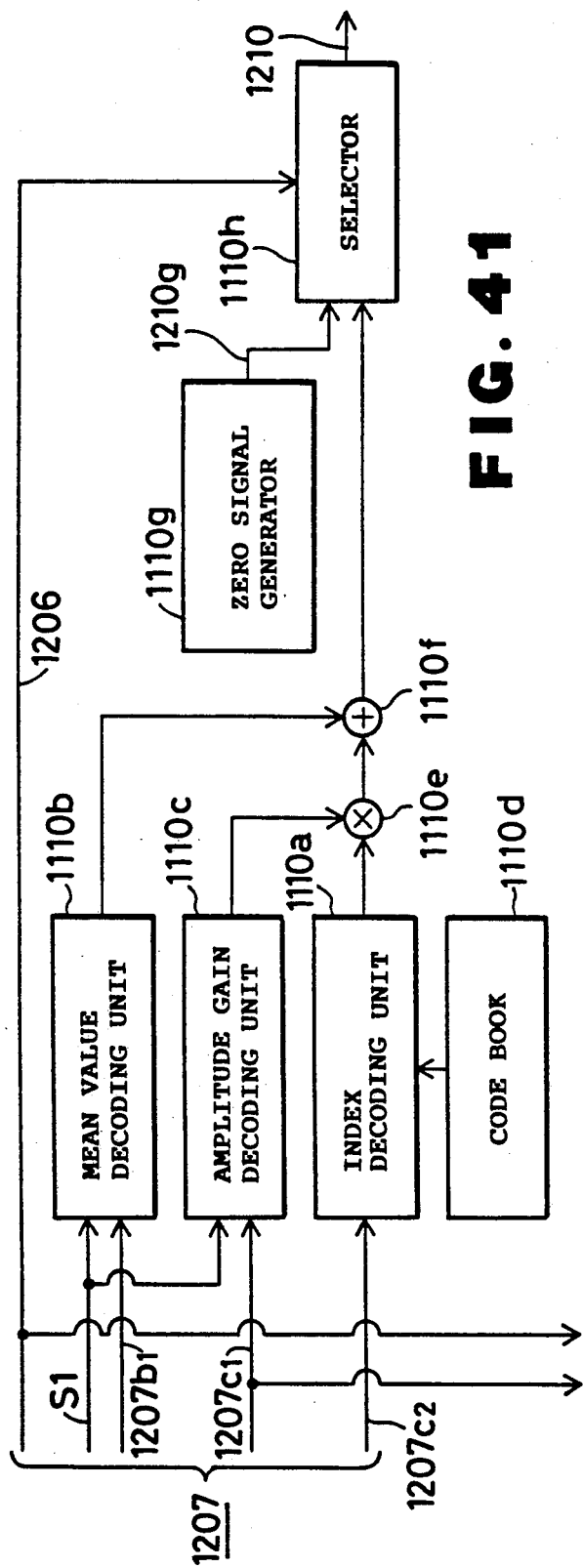
FIG. 41 is a block diagram of the vector quantizing decoding means.

Moreover, the detail block diagrams of the vector quantizing decoding means 1110 is shown in FIG. 41 and the vector quantizing decoding means 1110 comprises a mean value decoding means 1110b for decoding the quantized and decoded mean value m 1207b1 on the basis of the quantization characteristic (S1) output from the quantizing control means 1107a, an amplitude gain decoding means 1110c for decoding the amplitude gain in accordance with the quantization characteristic (S1) and an index decoding means 1110a.

Operations of the embodiment will then be explained. The processes up to generation of difference vector signal 1205 are same as the procedures described previously and explanation thereof is eliminated herein.

The difference vector signal 1205 obtained by the procedures similar to that of prior art is output to the valid/invalid block discrimination means 1106 and vector quantizing encoding means 1107 as in the case of the prior art.

The difference vector 1205 input to the quantizing control means 1107a is subject to adjustment of each element of vector based on the valid/invalid block information 1206.

Namely, for the valid block, a value of the difference vector signal 1205 is directly output to the mean value separating means 1107b as the valid difference vector signal 1207a and for the invalid block, the valid difference vector signal 1207a substituting each element with 0 is output.

The vector quantizing encoding is not applied to the invalid block and therefore the vector quantizing and encoding of the valid block will be described.

The quantizing controlling means 1107a is responsive to the input of amount of information 1209b to be stored in the buffer which is identical to the amount of send information of the preceding frame and periodically outputs, in unit of encoding object block, the quantizing characteristic signal which specifies the quantizing step width based on the amount of information to be stored in the buffer 1209b.

The mean value separating means 1107b calculates the mean value m of the valid difference vector signal 1207a, quantizes such means value based on the quantizing characteristic signal (S1) and outputs as the mean value quantizing number 1207b1, and also separates the mean value of the valid difference vector on the basis of the means value m and then outputs such mean value as the mean value separating vector 1207b2 to the inner product vector quantizing means 1107c.

In the inner product vector quantizing means 1107c, the internal product of the valid difference vector 1207b2 and the pattern vector normalized to a mean value 0 and a magnitude 1 in the code book 1107d is calculated to obtain the index 1207c2 of code vector which gives the maximum internal product and the amplitude gain 1207c1 given by such maximum internal product value in view of the quantization based on the quantizing characteristic signal (S1).

Here, the pattern vector is configurated in the form of tree-structure as shown in FIG. 40 for speed-up of operation during search of code vector (quantizing representative vector) giving the maximum inner product in the vector quantization process so that the higher vectors are designed to become the representative vectors of the lower vectors.

A procedure to select, in each phase, only one code vector giving the larger internal product with the mean value separating vector 1207b2 from a pair of code vectors is sequentially executed from the highest phase to the lowest phase in order to determine the quantizing representative vector of the lowest phase.

In the pattern vectors arranged in the form of binary tree-structure, 0 or 1 is assigned in the direction of branching from respective nodes and a stream of binary number representing a path up to the quantizing representative vector of the lowest stage corresponds to the index 1207c2 of the quantizing representative vector.

Moreover, in accordance with a magnitude of amplitude gain obtained, a new index 1207c2 having truncated the lower bits of index 1207c2 is transmitted.

Therefore, since accuracy of vector quantization is variably controlled in accordance with magnitude of amplitude gain in the vector quantizing and encoding, the amplitude gain quantizing number 1207c1 may be considered as the encoding accuracy.

As described, the encoded vector signal 1207 output from the vector quantizing encoding means 1107 is composed of mean value quantizing number 1207b1, amplitude gain quantizing number 1207c1, index 1207c2, valid/invalid block information 1206 and quantizing characteristic (S1), output to the variable length encoding means 1108, output to the send buffer 1109 after multiplexing with the motion information 1204b and is then output to the communication line as the send information.

Operations of vector quantizing encoding means (D) will be explained on the basis of FIG. 41.

For the valid block, the mean value quantizing number 1207b, amplitude gain quantizing number 1207c and index 1207c2 in the encoded vector signal 1207 are respectively decoded in the mean value decoding means 1110b, amplitude gain decoding means 1110c and index decoding means 1110a, then decoded to the valid difference vector signal 1207a by the multiplication and addition carried out respectively in the multiplier 1110e and adder 1110f and thereafter output as the decoded signal 1210.

Here, the quantizing characteristic signal (S1) which specifies quantization step width is used for the decoding of mean value and amplitude gain.

Meanwhile, for the invalid block, the 0 signal 1210g produced from the 0 signal generator 1110g is output from the selector 1110h, decoded into the decoded valid difference vector signal 1207a and output as the decoded vector signal 1210.

The decoded vector signal 1210 is added to the reference block 1204a in the adder 1111 and is then output as the decoded reproduction signal 1211.

Figures 42, 43:
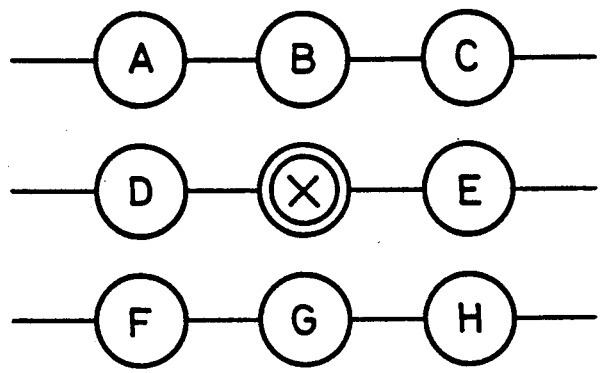
FIG. 42 is illustration for explaining pixel arrangement of and adaptive type space filter.
FIG. 43 a table for explaining an example of smoothing characteristic control of the adaptive type space filter.

Next, FIG. 42 shows arrangement, on the display screen, of the input signal sample pixels for the bi-dimensional space filter in such a case that such bi-dimensional space filter is used as the an adaptive type space filter and the adaptive space filter will be explained hereunder.

Under the condition that the sample value interested to be smoothed and output is designated as X and the adjacent sample pixel values on the bidimensional arrangement for such sample, as A, B, C, D, E, F, G, H sequentially to the right from the left direction, the smoothing process can be executed in accordance with the following formula.

$$\bar{X} = a_1 X + (a_2/4)(B + D + E + G) + (a_3/4)(A + C + F + H)$$
where, $(a_1 + a_2 + a_3 = 1)$ Here, $\overline{X}$ is the interested pixel sample value smoothed, namely a filter output signal sample value, and $a_1$, $a_2$, $a_3$ are smoothing characteristic coefficient for controlling the smoothing characteristic. When the larger the smoothing characteristic coefficient al, the weaker the smoothing effect, and the smaller the coefficient, the stronger the effect.

An example of adaptive controlling method of the adaptive type space filter 1122 will be indicated.

As an adaptive control parameter of the adaptive type space filter 1122, the movement position information 1204b, an amplitude gain quantizing number 1207c1 which indicates the encoding accuracy of encoding object block during the vector quantizing and encoding and a valid/invalid block information 1206 are respectively input to the adaptive type space filter 1122.

In this adaptive type space filter 1122, the filter characteristic is adaptively controlled for each encoding object block, as shown in FIG. 43, on the basis of a degree of encoding accuracy indicated by the amplitude gain quantizing number 1207c1 and the smoothing process is carried out considering the pixels in the encoding object block as the processing unit.

However, in case the movement position information 1204b is "0" and the valid/invalid block information 1206 is invalid block in the motion compensating process, it is required to avoid attenuation in the higher frequency range of the stationary region. Therefore, the smoothing process is not carried out for all encoding object blocks in the motion compensating object block.

An application example of the adaptive type space filter 1122 in such a case that the vector quantizing and encoding method is employed as the block encoding means has been explained in this embodiment, but the adaptive type filter 1122 can also be applied also to the case introducing the conversion encoding method. In this case, the effect similar to that of the above embodiment can also be obtained by using, as the encoding accuracy information, the encoding length after the conversion coefficient quantizing and encoding of the encoding object block for the adaptive control parameter.

In above example, moreover, the adaptive type space filter 1122 is applied to the interframe encoding transmission apparatus, but the similar effect can also be demonstrated also by applying such filter to the frame encoding transmission apparatus.

Figure 44:
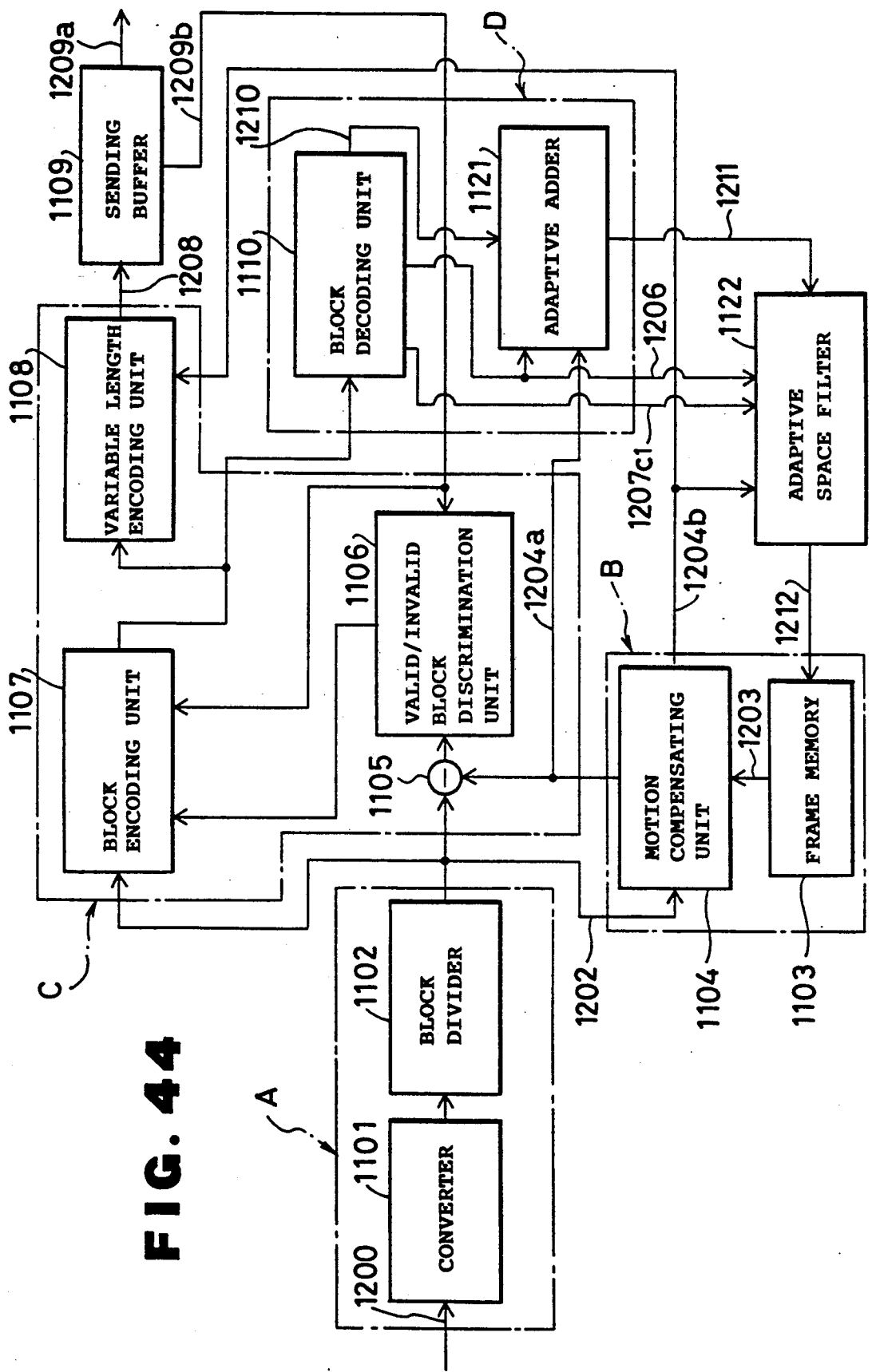
FIG. 44 is a block diagram of an image encoding transmission apparatus depending on another embodiment of the present invention.

FIG. 44 shows a block diagram of the apparatus where the adaptive type space filter 1122 is applied to the frame encoding transmission apparatus as an example of another embodiment of the present invention.

In the case of this embodiment, the block encoding for the valid block is carried out in the frame based on the valid/invalid block information 1206 by the block encoding means 1107.

The adder used as the adaptive adder in this embodiment executes, if the input valid/invalid block information 1206 is the valid block, addition of the frame decoding vector signal 1210 and the reference block 1204a is carried out and meanwhile outputs the input reference block 1204a directly as the decoded reproduction signal for the invalid block. Moreover, such adder controls also the adaptive type space filter 1122 in accordance with the encoding accuracy information.

This embodiment uses the adaptive type space filter 1122 as the filter comprised within the loop but similar effect can also be attained even in case the adaptive type space filter 1122 is applied to the decoding apparatus in the receiving side.

A seventh embodiment of the vector quantizing encoding transmission apparatus of the present invention is described with reference to FIG. 45.

Figure 45:
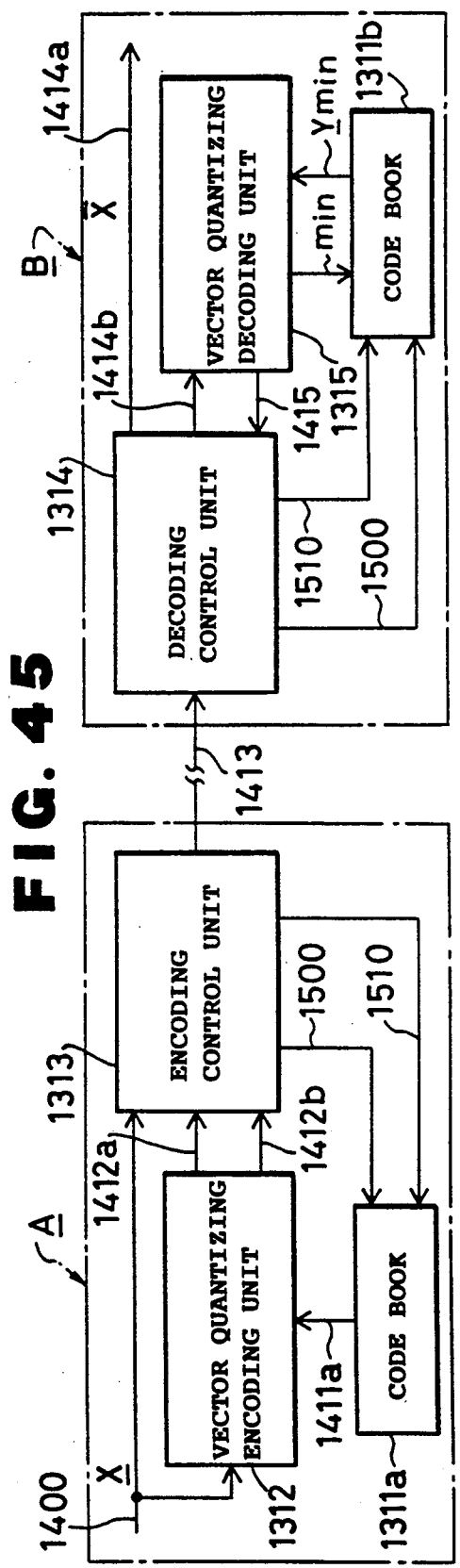
FIG. 45 is a block diagram of the configuration of a vector quantizer depending on an embodiment of the present invention.

FIG. 45 is a block diagram indicating schematic configuration of a vector quantizing encoding transmission apparatus of the present invention.

As shown in the same figure, the transmitting means A of the embodiment of the present invention comprises a code book 1311a which allows random access for the quantizing representative vectors $\underline{Y}_i$, a vector quantizing encoding means 1312 for outputting the index data min 1412a and the minimum distortion value $d_{min}$ 1412b of the quantizing representative vector which is most approximated to the input vector $\underline{X}$ 1400 and an encoding control means 1313 for obtaining selection frequency of each quantizing representative vector in the code book 1311a from the index data min 1412a, comparing said minimum distortion value $d_{min}$ 1412b with the vector update threshold value Tn, rewriting the input vector $\underline{X}$ and quantizing representative vector $\underline{Y}_l$ having lower selection frequency when the minimum distortion value $d_{min}$ is larger than the threshold value Tn, and assigning the index data of each quantizing representative vector in accordance with the selection frequency, while the receiving means B comprises as encoding control means 1314 for recovering the index data control signal 1500 and update representative vector 1510 from the encoded data 1413 receiving and a vector quantizing decoding means 1315 for decoding the index $\underline{Y}_{min}$ 1415 of the quantizing representative vector to be recovered.

Operations will be explained. The input vector $\underline{X}$ 1400 generated in the same way as the prior art is supplied to the vector quantizing encoding means 1312 and simultaneously to the encoding control means 1313.

The vector quantizing encoding means 1312 sends, in the same ways as the prior art using the code book 1311a, the index data min 1412a and the minimum distortion value $d_{min}$ 1412b of the representative vector $\underline{Y}_{min}$ most approximated to the input vector $\underline{X}$ 1400 to the encoding control means 1313.

Next, the encoding control means 1313 compares the minimum distortion value $d_{min}$ 1412b with the vector update threshold Tn preset freely and executes following two kinds of processings according to the result of comparison.

(a) When $d_{min} \leq Tn$

Both processing discrimination signal "0" and the index data min 1412a are output as the encoded data 1413 and transmitted to the receiving side B and "+1" is added to a number of times of selection of the index data min 1412a.

(b) When $d_{min} > Tn$

The index of the quantizing representative vector having the lowest selection degree in the code book 1311a and the input vector $\underline{X}$ 1400 is updated to the new quantizing representative vector $\underline{Y}_l$.

The processing discrimination signal "1", index data l and new quantizing representative vector $\underline{Y}_l$ are output as the encoding data 1413, the quantizing representative vector $\underline{Y}_l$ of index in the code book 1311a is updated to the input vector $\underline{X}$ and the number of times of selection of index l is set to "1".

With repeated execution of the processings described above, the input vector $\underline{X}$ 1400 when the minimum distortion value $d_{min}$ 1412b has exceeded the threshold value Th is updated to the quantizing representative vector $\underline{Y}_l$ having a low selection frequency in the code book 1311a and the code book 1311a is updated corresponding to the input image.

In addition, the index control signal 1500a for rearranging the quantizing representative vectors in the code book 1311a in the sequence of selection frequency on the basis of such frequency is output from the encoding control means 1313 and is rearranged. At the time of code assignment, the shorter code is assigned to the quantizing representative vector having a higher selection frequency.

The decoding control means 1314 executes following two kinds of processings with the processing discrimination signal decoded from the encoding data 1413 transmitted. (a') When the processing discrimination signal is "0":

The index data min 1314a of the quantizing representative vector recovered from the encoded data 1413 is decoded, the vector quantizing representative $\underline{Y}_{min}$ 1415 corresponding to the index data min is read from the code book 1311b in the vector quantizing decoding means 1315 and is output as the decoded vector 1414a and "+1" is added to a number of tires of selection of the index data min 1414b. (b') When the processing discrimination signal is "1":

The index data of the new quantizing representative vector 1510 recovered from the encoded data 1413 and the quantizing representative vector in the code book updated to the new quantizing representative vector is decoded, the new quantizing representative vector 1510 is output as the decoded vector 1414a and a number of times of selection of index data l is set to "1".

With repeated execution of the processings described, the code book 1311b is updated, rearrangement is carried out in the sequence of selection frequency by the code assigning control signal 1510b which is output, based on the selection frequency of the quantizing representative vectors in the code book 1311b, from the encoding control means 1314 like the encoding control means 1313.

Accordingly, matching between the code books in the sending and receiving sides can be attained.

In the following, an eighth embodiment of the present invention is explained with reference to FIGS. 46-50.

Figure 46:
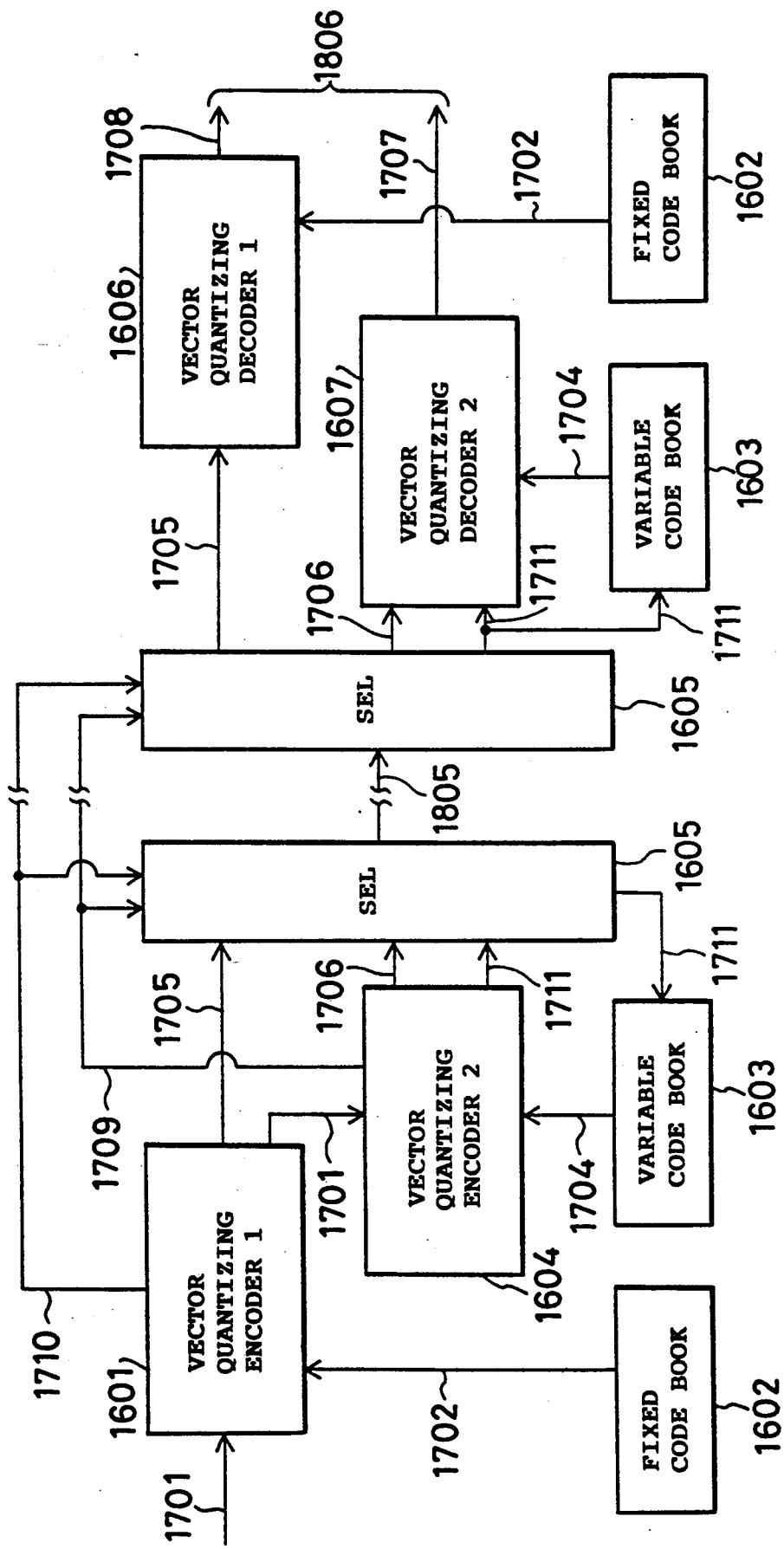
FIG. 46 is a block diagram showing an example of the construction of a vector quantizer according to the present invention.

FIG. 46 is a block diagram showing an example of the construction of a vector quantizer according to the present invention. In the drawing, reference number 1602 designates a fixed code book constructed as that of the prior art; 1603 is a random access variable code book; and 1604 is a second vector quantization encoder.

Next, the function of the vector quantizer is explained.

An input vector $\underline{X}$ 1701 is processed in the vector quantization encoder 1601 by using the fixed code book 1602 just as in the prior art, and is transformed into the index i 1705 of the corresponding representative quantization vector $\underline{Y}_i$ 1607 giving the minimum distortion di. The index is then supplied to a selector 1605.

In FIG. 46, the block size of quantization of the vector quantization encoder 1601 is 4×4. In the vector quantization encoder 1601, a comparison is carried out between the minimum distortion di and a predetermined threshold distortion Ti. Depending on the result of the comparison, the following two types of processing are performed. A selection signal 1710 for distinguishing the type of processing is transmitted to the selector 1605.

Figure 47:
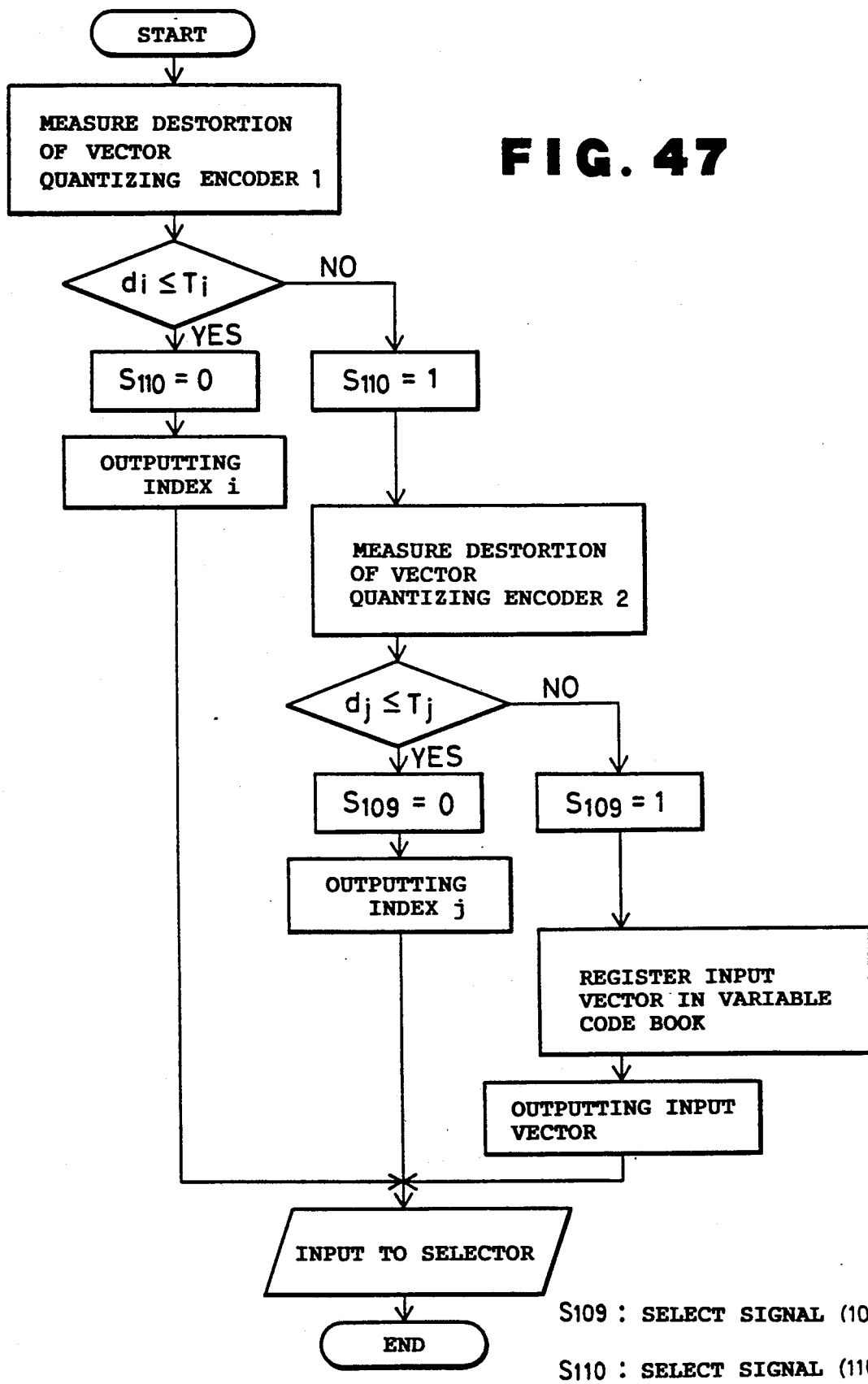
FIG. 47 is a flow chart to explain a coded algorism.
Figure 49:
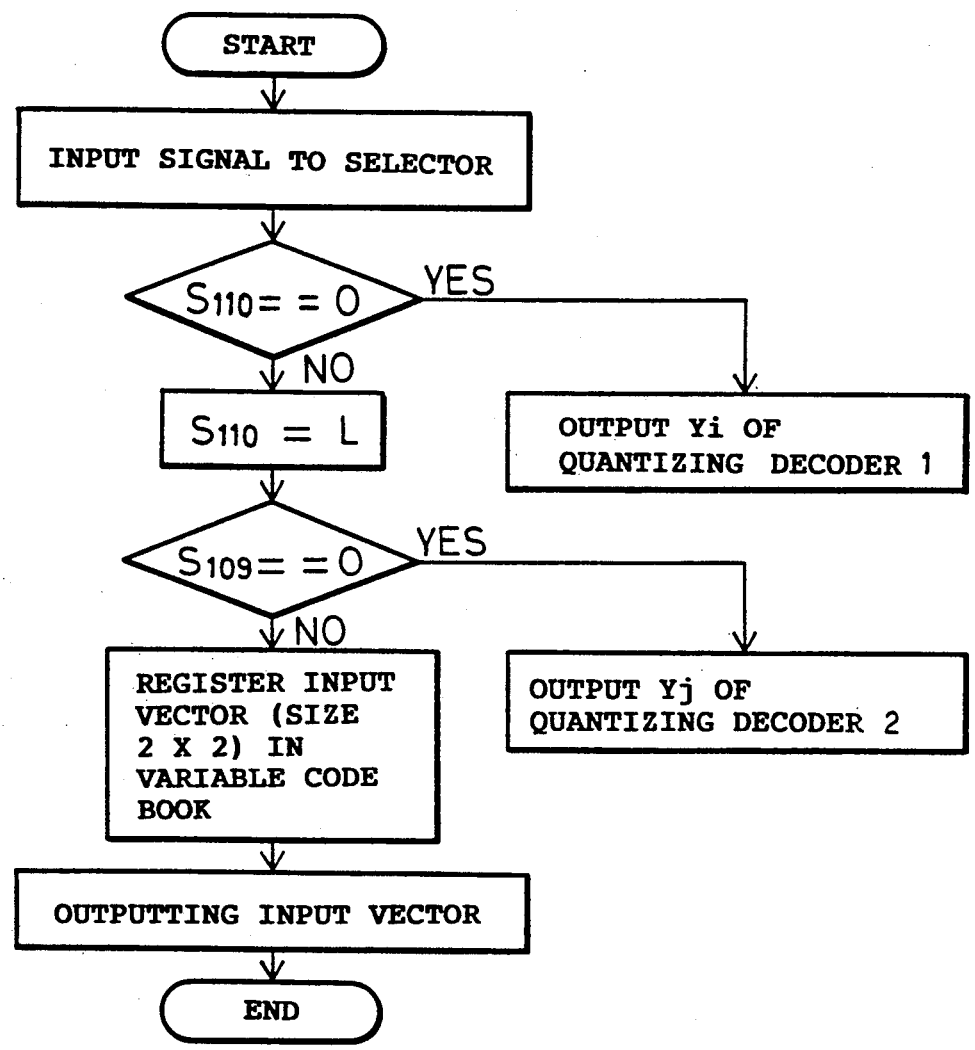
FIG. 49 is a flow chart to explain selection of decoding by use of any vector quantizing decoder in accordance with a select signal.

In the following, the algorism for encoding is explained according to the flow chart shown in FIG. 47.

Process I : in case of $d_i \leq T_i$

The selection signal 1710 is set to '0' and the index i 1705 is supplied to the selector 1605.

Process II : in case of $d_i > T_i$

The selection signal 1710 is set to '1' and the input vector $\underline{X}$ 1701 is transmitted to the vector quantization encoder 1604.

In case of Process II, two successive processings which are explained below are carried out in the vector quantization encoder 1604. Here, the minimum distortion with the input vector is represented as $d_j$, and the block size of quantization of the vector quantization encoder 1604 is 2×2.

Process III : in case of $dj \leq Tj$

The selection signal 1709 is set to '0' and the index j 1709 is supplied to the selector 1605.

Process IV : in case of $dj > Tj$

The selection signal 1709 is setcto '1' and the input vector $\underline{X}'$ 1711 is transmitted to the selector 1605 and is written in the second code book 1603.

Then, the operation of reading and writing of quantization vectors from and to the variable code book 1603 is carried out as shown in FIG. 48.

In the variable code book 1603, quantization vectors having the value of each of the characteristics which are divided into P parts and the corresponding indexes are stored according to the order of frequency. P characteristics are immediately extracted from an input vector and a corresponding quantization vector having components coinciding all with the P characteristics is selected. If there is no corresponding quantization vector to the input vector in the code book, the following operation is carried out.

i) P characteristics are all different from those of the input vector:

If we suppose that input vectors having as the i-th characteristic component $a(i)$ is $\underline{X}(a(i))$ and the quantization vectors in the code book are $\underline{Y}j(a(i))$, a vector $\underline{Y}j$ which minimizes $$dj = \Sigma\ Y_j(a(i)) - X(a(i)) \ldots (*)$$

is chosen to eliminate it and the input vector $\underline{X}$ is written instead.

ii) At least one characteristic coincides with that of the input vector:

Among the set of quantization vectors Y, those vectors whose characteristics coincide with those stored in the code book are selected and the calculation of the relation (*) is carried out for these vectors and $\underline{Y}j$ is similarly selected to be rewritten.

In this way, the reading and writing operation of the quantization vectors in the code book is carried out.

In the decoder, after the encoded data 1805 supplied from the encoder is inputted to the selector 1605, selection operation is carried out according to the selection signal which of the vector quantization decoders 1606 and 1607 is used for decoding. If the vector quantization decoder 1606 is selected, a decoded vector $\underline{Y}_i$ 1708 is extracted from the fixed code book 1602 according to the index i 1705 and is outputted as an output vector (see FIG. 49). On the other hand, if the vector quantization decoder 1607 is selected, a decoded vector $\underline{Y}_j$ 1708 is extracted from the variable code book 1603 according to the index j 1706 or the input vector $\underline{X}'$ 1711 is outputted as it is as a decoded vector 1707. In the latter case, the input vector X' 1711 is at the same time recorded in the variable code book 1603.

The block size of the vector quantization encoder 1601 and 1606 is 4×4, while that of the vector quantization encoder 1606 and 1607 is 2×2. These encoders 1606 and 1607 are composed of four blocks of the size of 2×2. Therefore, when the calculation of distortion is carried out in the vector quantization encoder 1601, and the minimum distortion $d_i$ is larger than the threshold value $T_i$, the original image of the input vector X 1701 (of the block size of 4×4) is divided into four blocks of the size of 2×2, and the calculation of minimum distortion is carried out for each block in the vector quantization encoder 1604. As a result, among the four blocks, the index j 1706 of those blocks which match those in the variable code book 1603 are outputted. On the contrary, if the matching does not succeed because of large distortion, the input vector (2×2 in size) X' 1711 is outputted as it is. During this operation, the fact that a certain block is encoded or not must be memorized as header information of the selection signal 1709.

Figure 50:
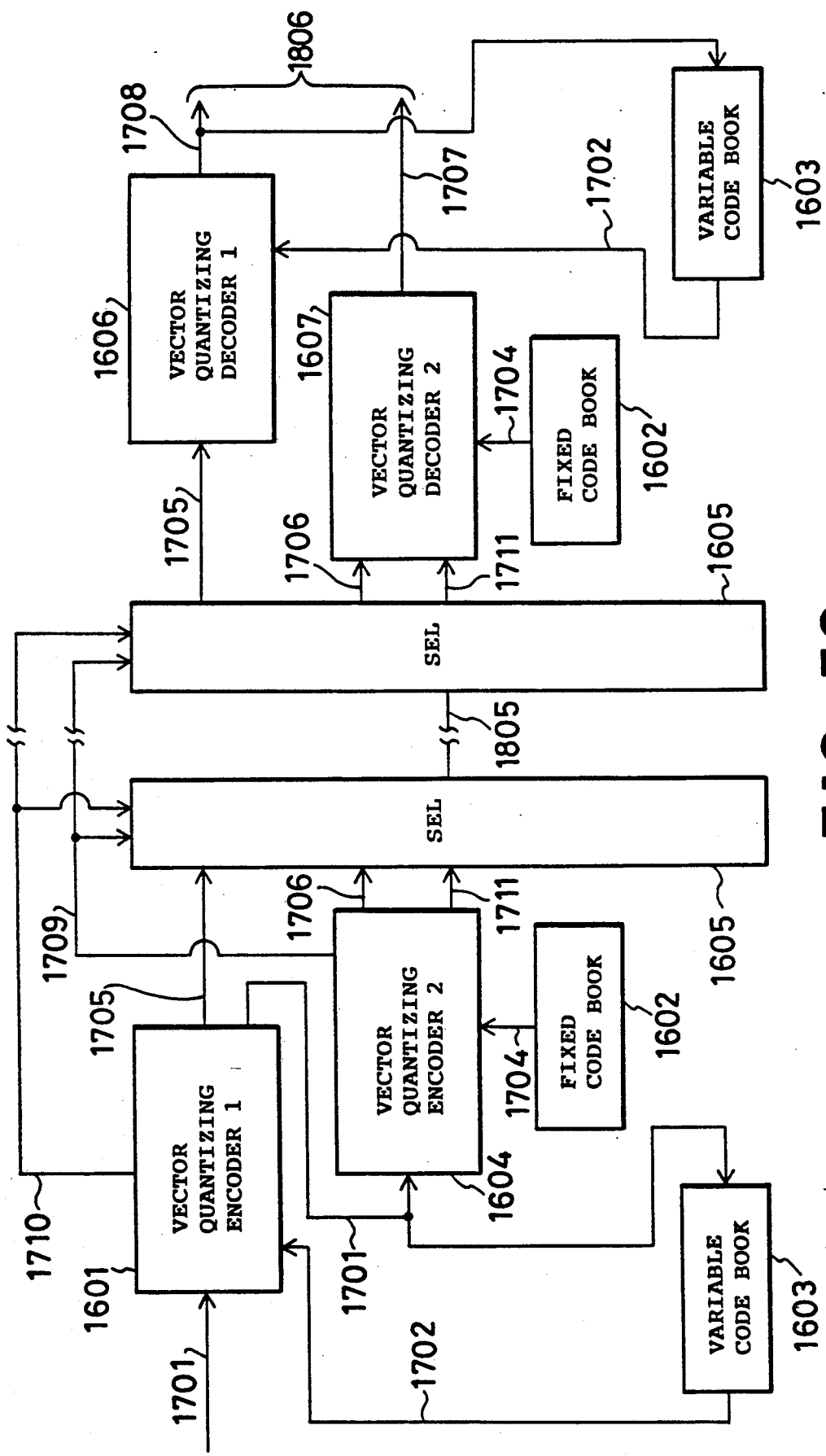
FIG. 50 is a block diagram showing a modified embodiment.

In the example explained above, two vector quantization encoders different in block size are series-connected, and a fixed code book is connected to a first vector quantization encoder and to a first vector quantization decoder, while a variable code book is connected to a second vector quantization encoder and to a second vector quantization decoder. However, in reverse, the variable code book can be connected to the former encoder-decoder and the fixed code book can be connected to the latter encoder-decoder (FIG. 50). In this case, the same effect as the vector quantizer shown in FIG. 46 is obtained.

In the following, a ninth embodiment of the present invention is explained with reference to FIG. 51 and 52.

FIG. 51 is a block diagram showing an example of the construction of a vector quantizer according to the present invention. In the drawing, reference number 1901 designates a vector quantization encode block which vector-quantizes input vectors 1906 and supplies the indexes 1908 of their corresponding representative quantization vectors and corresponding minimum distortions 1909; reference number 1902 is a random access code book memorizing a plurality of representative quantization vectors 1912; reference number 1903 is an encode control block supplying not only an address control signal 1910 which controls the processing of the input vectors according to the magnitude relation between the minimum distortion and the distortion threshold value to renew each quantization vector in the code book, but also a new representative quantization vector 1911 and encoded data 1912; reference number 1904 is a decode control block decoding the encoded data 1912 and supplying the address control signal 1910, the new representative quantization vector 1911 and the index 1913 of the representative quantization vector to be reproduced; and reference number 1905 is a vector quantization decode block supplying a representative quantization vector 1907 corresponding to the index 1903 as a decoded vector 1914.

Next, the function of the vector quantizer is explained.

An input vector X 1906 is processed in the vector quantization encode block by using a code book 1902 just as in the prior art, and the minimum distortion $d_i$ 1909 and the index i 1908 of a representative quantization vector $Y_i$ 1907 giving the minimum distortion $d_i$ 1909 is supplied to the encode control block 1903. In the encode control block 1903, a comparison is carried out between the minimum distortion $d_i$ 1909 and a predetermined threshold distortion T. Depending on the result of the comparison, the following two types of processing are performed.

(1) In case of $d_i < T$

Processing discrimination signal '0' showing that the content of the code book is not renewed and the index 1908 are outputted and transmitted as encoded data 1912 to the decode control block 1904. As shown in FIG. 52, the transmitted indexes are rearranged in the tables, which show their history. In other words, if indexes are at the state 1, the index i transmitted now is put to the head of the table (the value of the pointer is 1) and those indexes whose pointer is smaller than the index i in value in the state 1 (in the drawing, from the index j to the index r) are shifted backward in the table (state 2). In this way, by rearranging the indexes in the table, those indexes which are new and have high probability to be transmitted are put at the forward position of the table, while such indexes as were transmitted in earlier time are put at the backward position in the table.

(2) In case of $d_i \leq T$

By checking the last position of the table, the index transmitted at the earliest time is obtained. In case of the state 2 in FIG. 52, such index is the index z. On the other hand, the input vector X 1906 is taken as a new representative quantization vector 1911, and processing discrimination signal '1' indicating that the content of the code book 1902 is renewed and the new representative quantization vector 1911 are outputted and transmitted as encoded data 1912 to the decode control block 1904. At the same time, the index z is put at the top of the table, which fact is shown in the state 3 of FIG. 52. The representative quantization vector $Y_z$ of the index z is rewritten to the new representative quantization vector 1911 by the address control signal 1910 and the content of the code book 1902 is renewed.

By repeating the steps mentioned above, the input vector whose minimum distortion 1909 first exceeds the distortion threshold T replaces the oldest transmitted representative quantization vector and the content of the code book is renewed.

In the decode control block 1904, the following two processings are carried out by using a processing discrimination signal decoded from the encoded data 1912 transmitted from the encode block 1903.

(1) Processing discrimination signal is '0'

Based on the encoded data 1912, an index i' 1913 of representative quantization vector is decoded, and representative quantization vector 1907 corresponding to said index i' 1913 is read from the code book 1902, and outputted as decoded vector 1914 in the vector quantization decoded block 1905. Further, the transmitted indexes which are same as said encode control block 1903 are rearranged in the table, which show their history.

(2) Processing discrimination signal is '1'

Based on the encoded data 1912, a new representative quantization vector 1911 is decoded and outputted as a decoded vector 1914. Then, the representative quantization vector 1911 is written in the code book 1902 by means of the address control signal 1910 to renew the old one just as in the side of the encode block.

In the example described above, those indexes having a high probability to be transmitted are obtained from the table in which the transmitted indexes are rearranged. If code allocation operation is such that a short code length is allocated to such an index, less information should be transmitted and the encode operation becomes more efficient.

As described, the present invention transmits the input vectors extracted on the basis of the minimum distortion during the vector quantization and also uses in parallel the random access code book which sequentially stores such input vectors as the new quantizing representative vectors and the code book of the prior art to determine the quantizing representative vector which gives the minimum distortion by tree-search. Accordingly, the quantizing error is eased and calculation for search may be executed at a high speed. Further, input vector is converted into scalar quantity based on wave form distortion obtained in vector quantization encoding process by an inner product vector quantization encoder, and code books are updated and the content is utilized as output vector in subsequent encoding processing thereby the vector quantization is performed, or the code books are updated in sequence based on value that the minimum distortion obtained in the quantization process is weighted with amplitude gain and encoding data and decoding interframe difference signal series are obtained, thereby the wave form distortion between the input/output vectors in the interframe vector quantization can be suppressed to definite value or less, and the encoding information generating quantity and the reproduction quantity can be adapted in wide range by varying the threshold value to the wave form distortion.

Still further, the code book depending on the local property of the input image can be produced and updated while being encoded.

Still further, according to the invention, in initial stage vector quantization encoding unit is installed at output stage of a frame memory, and input video signal series is subjected to vector quantization from output vector comprising block image cut from prescribed address of the frame memory and output vector of uniform pattern and output vector of the mean pattern per sample of the past input video signal series, and the initial stage vector quantization encoding signal series and the initial stage vector quantization encoding data are outputted, thereby generation of the valid block in the interframe vector quantization can be suppressed and the encoding information generating quantity can be reduced.

Still further according to the invention, input video signal series is converted into a plurality of frequency band separation input video signal series divided in space frequency band, and accuracy of the encoding processing is changed corresponding to the space frequency of the input video signal series, thereby effective encoding matched with the visual sense characteristics of human beings can be performed, and further the subjective quality of the encoding reproduction image can be improved.

Still further the present invention assures application to the 1×8 Kbps line in the same frame format and thereby provides a small size and economical apparatus, enhancing a degree of flexibility of lines and resulting in the effect that the digital network can be used economically.

Still further, the interframe encoding apparatus using the encoding control system of the present invention allows variable block discrimination threshold values in unit of block in place of lowering in the same degree the block discrimination threshold values when a dynamic image becomes a stationary image in the block discrimination means, and thereby provides the effect the generation of valid block can be suppressed and amount of information generated can also be reduced.

Moreover, the stationary image starts to move during the course of lowering the threshold values, amount of information generated does not suddenly increase and therefore trackability to movement can naturally be improved.

Still further, the image encoding transmission apparatus of the present invention provides the configuration so that an adaptive type space filter is arranged within the image encoding transmission apparatus and the smoothing characteristic of the adaptive type space filter is applicably controlled in unit of block on the basis of the encoding accuracy, motion vector information and valid/invalid block information, to eliminate encoding noise without lowering resolution of the decoded image and also provides an effect of assuring decoded image quality.

Still further, the present invention updates the input vector with the quantizing representative vector having a low selection frequency in the code book as the new quantizing representative vector on the basis of the minimum distortion during the vector quantization in order to update the code book in accordance with the sending image, and thereby alleviates quantizing error and improves quality.

Moreover, since the quantizing representative vector having higher selection frequency is given the index data of shorter code length in the code assignment, encoding efficiency can also be improved.

Still further, according to the present invention, not only a random access variable code book which transmits those input vectors extracted from those based on the minimum distortion at the vector quantization and such input vectors are sequentially stored as new representative quantization vectors, but also the fixed code book of the prior art are used. In addition, two vector quantization encoders different in block size are series-connected. Accordingly, the quantization error is reduced and the production of information is remarkably reduced. Furthermore, a second vector quantization encoder connected to the variable code book permits a small setting value of the distortion threshold Ti of the first vector quantization encoder connected to the fixed code book, thereby obtaining improvement of the S/N ratio and the quality of images. Since each of the quantization vectors is arranged so that the structure of the variable code book can be distinguished for each characteristic, the number of matching operations can be reduced by detecting the characteristic of the input vector once, thereby realizing the high speed searching operation.

Still further, according to the present invention, a vector quantizer is random accessible and is constructed so that a specific vector is extracted from the input ones based on the minimum distortion and is transmitted to replace the oldest representative quantization vector among those stored in the code book as a new representative quantization vector, thereby renewing the content of the code book. Accordingly, quantization error becomes smaller and a code book suitable for an information source is automatically produced. Furthermore, the vector quantizer is able to fully follow the change of the input vector and the quality of the vector to be transmitted is improved.

What is claimed is:

1. An input vector quantizer for encoding digital signals with high efficiency for transmission between transmitting and receiving sides and wherein a first codebook of fixed contents is included at each of said transmitting and receiving sides, said vector quantizer comprising one or more random access second codebooks having a learning function and being connected to the intermediate hierarchy of said first codebook, means for transmitting input vector and deciding information for matching of codebooks in the transmitting and receiving sides, and a means for executing, at a high speed, vector quantization through parallel use of said first codebook and said random access one or more second codebooks in a tree-searched minimum distortion process for sequentially storing said input vectors, as the new quantizing representative vectors into said one or more second codebooks when the minimum distortion in the tree-searched vector quantization is larger than a threshold value, and for simultaneously erasing the old quantizing representative vectors previously stored in said one or more second codebooks.

2. An input vector quantizer as set forth in claim 1, said input vector quantizer further comprising:

a mean value separation unit for converting the prescribed frequency band interframe difference signal into vector and separating mean value and for performing scalar quantization encoding to the mean value and outputting the mean value separation input vector and the mean value encoding data;

code books including a fixed code book for storing a plurality of normalization output vectors with mean "0" and magnitude "1" and a dynamic code book for storing normalization output by normalizing the mean value separation input vector as normalization output and having the storage content updated at any time;

an inner product vector quantization encoding unit for calculating inner product of the mean value separation input vector supplied from said means value separation unit with each normalization output vector stored in the fixed code book and the dynamic code book of said code books and detecting the normalization output vector to give the maximum inner product being "0" or more, and for outputting amplitude encoding data defined by value of the maximum inner product and index for discriminating the normalization output vector to give the maximum inner product if distortion estimated based on amount of the mean value separation input vector and amount of the maximum inner product is less than the distortion threshold value transmitting from said encoding control unit, and for inverting sign of the amplitude encoding data and outputting it and outputting the mean value separation input vector from said mean value separation unit as it is in place of the index if the distortion is larger than the distortion threshold value;

scalar quantization encoding unit for performing scalar quantization of the mean value separation input vector per sample supplied from said inner product vector quantization encoding unit and generating the mean value separation vector encoding data;

a selector for selecting the index and the mean value separation vector quantization data by the amplitude encoding data;

a block counter for counting the prescribed frequency band interframe difference signal in block unit and generating band discrimination signal;

a block discrimination unit for performing decision of significant block/insignificant block using the block discrimination threshold value transmitted from said encoding control unit and outputting the block discrimination signal; and a normalization unit for normalizing the mean value separation input vector from said inner product vector quantization encoding unit and generating the normalization output vector and outputting it to the dynamic code book in said code books;

wherein as the prescribed frequency band encoding data, for said significant block, the block discrimination signal, the mean value encoding data, the amplitude encoding data and one of the index selected by said selector or the mean value separation vector encoding data are outputted, and for said insignificant block, only the block discrimination signal is outputted.

3. Learning-type vector quantizer as claimed in claim 1, wherein, in order to search rapidly and precisely a representative quantization vector in the variable code book used in a vector quantizer, characteristics of the representative quantization vectors are classified in several groups, a region is prepared in the code book for each characteristic; and the representative quantization vectors having the same characteristics are arranged according to the order of frequency, so that registration and renewal of the representative quantization vectors in the code book is carried out effectively.

4. An interframe vector quantization encoding and decoding apparatus comprising:

a frame memory for storing video signals corresponding to at least one frame;

a subtractor for subtracting interframe forecast video signal series read from said frame memory to input video signal series and obtaining interframe difference signal series;

a vector quantization encoding and decoding unit for selectively performing scalar quantization or vector quantization of an input vector based on wave form distortion calculated in a process where the mean value separation of the input vector, obtained by blocking the interframe forecast video signal, is subjected to vector encoding quantization by an inner product vector quantization encoder if the wave form distortion is larger than threshold value and updating code books in sequence and used to perform subsequent encoding and decoding operation, or for updating the code books in sequence based on the value that the minimum distortion, obtained in the quantization process of performing mean value separation normalization vector quantization, is weighted by amplitude gain and performing the encoding and decoding operation and obtaining the encoding data and the decoding interframe difference signal series;

an adder for adding the decoding difference signal series to the interframe forecast video signal series and outputting the decoding video signal series to said frame memory;

a variable length encoding unit for converting the encoding data into variable length encoding and outputting variable length encoding data;

a transmission buffer for storing the variable length encoding data temporarily and smoothing the amount of generating information and outputting it as transmission data at a constant speed and also estimating the amount of generating information in one frame unit; and an encoding control unit for generating encoding control parameters to perform adaptive control of operation of said vector quantization encoding and decoding unit based on the amount of generating information in one frame unit.

5. An interframe vector quantization encoding and decoding apparatus as set forth in claim 4, wherein input vector obtained in blocking of the input video signal series by the first stage vector quantizer is quantized by a plurality of output vectors which are cut out of prescribed address of said frame memory and outputted from code books, and if the minimum distortion obtained in the quantization process exceeds the quantization threshold value, first stage mean value estimated by a mean value calculating unit is interpolated and content of the code books is updated and the first stage mean value interporated is outputted as first stage vector quantization decoding series to said subtractor and said adder, and also a first stage vector quantization encoding and decoding unit for adding the first stage mean value to a first stage index for discrimination of the output vectors and outputting the first stage vector quantization encoding data to said variable length encoding unit is installed at output stage of said frame memory.

6. An interframe vector quantizer comprising:
a band dividing unit for converting input video signal series into a plurality of frequency band separation input video signal series divided per space frequency band;
a first frame memory for storing one frame of the frequency band separation input video signal series outputted from said band dividing unit, and for outputting one frame of prescribed frequency band input video signal series in time division;
a second frame memory for supplying frame delay to prescribed frequency band decoding video signal series outputted by an adder hereinafter described and for generating prescribed frequency band interframe forecast signal;
a subtractor for subtracting prescribed frequency band interframe forecast signal outputted by said second frame memory from prescribed frequency band input video signal series outputted by said first frame memory and for generating prescribed frequency band interframe difference signal;
a dynamic vector quantization encoding unit for performing dynamic vector quantization encoding of prescribed frequency band interframe difference signal outputted by said subtractor in accuracy corresponding to level of space frequency and for generating prescribed frequency band encoding data;
an encoding control unit for controlling write/read of said first frame memory and said second frame memory and for controlling vector quantization characteristics of said dynamic vector quantization encoding unit;
a dynamic vector quantization decoding unit for converting prescribed frequency band encoding data generated in said dynamic vector quantization encoding unit into prescribed frequency band interframe decoding difference signal;

an adder for adding prescribed frequency band interframe decoding difference signal from said dynamic vector quantization decoding unit to prescribed frequency band interframe forecast signal from said second frame memory and for generating prescribed frequency band decoding video signal series and inputting it to said second frame memory;
a variable length encoding unit for performing variable length encoding of prescribed frequency band encoding data outputted by said dynamic vector quantization encoding unit;
a buffer for temporarily storing data subjected to variable length encoding from said variable length encoding unit; and
a line interface for transmitting the variable length encoded data outputted from said buffer as transmission signal.

7. A multimedia data transmission system for transmitting data between a sending side and a receiving side comprising:
a means for configuring transmission frames of 80/160/320/480/560-bit lengths having the repetition frequency of 100 Hz uniformly collecting 80 basic time slots, specified without relation to the transmission rate, of 1/2/4/6/7-bit lengths having the repetition frequency of 8 kHz corresponding to the transmission rate of 8/16/32/48/56 Kbps,
a means for configuring a multiframe by uniformly collecting 16 transmission frames without relation to the transmission rate,
a means for multiplexing a multimedia data, in every basic time slot, transmission frame or multiframe having a code transmission rate which is an integer multiple of 8 Kbps or matching said transmission frames or multiframe, and
a communication control means for notifying the receiving side by arranging and transmitting a synchronous code for identifying the partition of the transmission frames and the multiframes and bit assigning information indicating the bit assignment of multimedia data to a predetermined bit in the basic time slot.

8. A multimedia data transmission system according to claim 7, wherein the number of basic time slots in the transmission frame and the number of transmission frames in the multiframe are set to constant values independent of the transmission rates of 8/16/32/48/56 Kbps and the additional information including synchronous code and bit assigning information is set to a common value corresponding all transmission rates with the same control means.

9. A multimedia data transmission system according to claim 7, wherein a bit rate for interface is fixed to 64 Kbps in the transmission path having the transmission rate of 8/16/32/48/56 Kbps and the same transmission path interface is used, not depending on the transmission rate of 32/48/56 Kbps, with a means for converting the transmission rate to the interface bit rate through matching of transmission rate by adding dummy bit of 7/6/4/2/1-bit lengths to 8/16/32/48/56 Kbps for each basic time slots and a means for extracting only the valid bits by eliminating dummy bits with a timing signal of 8 kHz synchronized with the partition of basic time slot obtained from periodicity of dummy bit in the receiving side or the basic time slot supplied from the interface.

10. In an interframe encoding apparatus for encoding, with high performance, a series of input video signals introducing conditional replenishment in unit of block, an encoding control system characterized in that a means is provided for controlling a threshold value to be applied to the entire part of frame so that, in case a predetermined value which is smaller than a block discriminating threshold value already used once is to be set as a new block discriminating threshold value in the process as a controlling a block discriminating threshold value for executing said conditional replenishment in unit of frame, a new block threshold value is set to a value which is reduced step by step, while sequentially widening the region within the frame to which said threshold value is applied, and such threshold value is finally set to said predetermined value.

11. An encoding system comprising means for executing sequential frame encoding of selected regions of the frame to which a new block discrimination threshold value is applied, such that the area covered by said sequential frame encoding is enlarged up to the region sequentially designated in a predetermined sequence synchronized by the sending and receiving, signals means for setting said selected regions in unit portions of the frame so that the entire frame as a whole is subjected to sequential frame encoding after a selected sequence of said selected regions representing a constant total framing time, and means for transmitting the sequence information indicating passage of such total frame time for each frame and for periodically executing a frame/interframe mixed encoding mode for the interframe encoding of the regions of said frame other than said selected regions, wherein said frame/interframe mixed encoding mode and the interframe encoding mode using threshold value control are switched applicably.

12. An image encoding transmission apparatus with motion compensating processing of sequential frames comprising:
- a preprocessing means for reading a dynamic image signal for each frame, producing a pixel signal through A/D conversion, forming blocks each of which is formed by a predetermined number of adjacent pixels on the image and generating image vector signal consisting of pixel signal groups for each block,
- a motion compensating means for generating a plurality of reference blocks with reference to the current block unit from a reproduced signal of the previous frame and detecting a motion vector of the image vector signal by searching the reference block which is most approximated to the image vector signal,
- a vector quantizing encoding means for compressing and encoding such image vector signal on the basis of the searched reference block and motion vector by utilizing correlation between frames,
- a second buffer for sending, frame by frame, the encoded image vector signal to the transmission line, and
- a vector quantizing decoding means for decoding the image vector signal encoded in the vector quantizing encoding means and generating reproduced signal by adding the vector signal of reference block searched to the obtained decoded vector signal, characterized by further comprising;
- an encoding accuracy control means for changing the encoding accuracy of the vector quantizing encoding means at the predetermined period in accordance with the amount of send encoding information of the encoded image vector signal to be temporarily stored in the send buffer,
- an adaptive spatial filter for executing a smoothing process of the reproduced signal to use pixel values including, at a predetermined ratio, pixel values approximated to each pixel value of the reproduced signal, and
- a smoothing characteristic control means for controlling ON/OFF conditions of smoothing process of the adaptive spatial filter on the basis of the motion vector, enhancing a degree of smoothing operation of adaptive spatial filter in case the encoding accuracy is low and lowering the degree of smoothing operation in case the encoding accuracy is high.

13. A vector quantizing encoding and transmission apparatus for encoding and transmitting data between transmitting and receiving sides comprising:
- a preprocessing means for reading a video signal, forming blocks, each of which is comprised of a specified number of adjacent pixels of image and generating input vector to output it,
- a codebook for previously storing a plurality of the representative vector for quantization which is a pattern of input vector for given predetermined index data, and
- a vector quantizing encoding means for selecting the representative vector for quantization which is most approximated to the input vector from the codebook and outputting the index data of representative vector for quantization as the video transmitting data, said apparatus further comprising;
- an encoding control means for measuring selection frequency of representative vector for quantization, executing code assigning control to assign a short code length index data sequentially to the vectors from the representative vector for quantization having a high selection frequency depending on the result of measurement, comparing a minimum distortion value of the representative vector for quantization selected at the time of vector quantization and the input vector with a threshold value for vector update, and rewriting the input vector, when said minimum distortion value is larger than the threshold value, to the representative vector for quantization with low selection frequency to send update discrimination information, index data and update representative vector, and
- a decoding control means for rewriting the representative vector for quantization of codebook in the receiving side in accordance with the update discrimination information received, measuring selection frequency of the representative vector for quantization from the index data received and assigning a short index data sequentially from the representative vector for quantization with high selection frequency on the basis of the result of measurement, wherein
  the index data of representative vector for quantization and the representative vector for quantization in the codebook are updated in accordance with the transmitting image.

14. Learning-type vector quantizer for effectively encoding digital signals of an input image, wherein it comprises an upstream fixed codebook composed of a plurality of representative quantization vectors, a downstream random access variable codebook and encoder-decoders for vector-quantization operation different in block size connected respectively to each codebook, so that, if no encode operation is carried out in an upstream vector quantization encoder, effective vector quantization operation is carried out in a downstream vector quantization encoder using a predetermined threshold value on the input image divided into pieces by reducing the production of information.

15. Learning-type vector quantizer as claimed in claim 14, wherein the vector quantization operation is carried out effectively by connecting the variable code book to the upstream vector quantization encoder and the fixed code book to the downstream vector quantization encoder, while reducing the production of information.

16. Learning-type vector quantizer as claimed in claim 15, wherein based on the selection frequency of a representative quantization vector obtained by the rearrangement of the indexes, a code allocation operation is carried out in which a shorter code length is allocated to a representative quantization vector having a higher probability to be selected.

17. Learning-type vector quantizer for encoding data for transmission between a transmission side and a reception side, wherein at the time of vector quantization of input vectors using a plurality of representative quantization vectors stored in a random access code book, representative quantization vectors having indexes selected from the code book are rearranged according to the order of the selection, and when the minimum distortion at the time of the vector quantization for an input vector is larger than a predetermined value, the input vector is taken as the representative quantization vector and the latter replaces the oldest selected representative quantization vector derived from the rearrangement of the indexes to form a code book having a learning function, and in order to make the code books at the transmission side and the reception side the same, the input vector is transmitted to the reception side from the transmission side to carry out vector quantization using the newly formed code book.

* * * * *

UNITED STATES PATENT AND TRADEMARK OFFICE
CERTIFICATE OF CORRECTION

PATENT NO. : 5,194,950

DATED : March 16, 1993

INVENTOR(S) : Murakami et al.

It is certified that error appears in the above-identified patent and that said Letters Patent is hereby corrected as shown below:

Col. 3, line 26, " 'hereby" should be --thereby--.

Col. 4, line 44, "V" should be --v--.

Col. 5, line 3, "m" should be --m̂--.

Col. 20, line 43, "means" should be --mean--.

Col. 20, line 59, "means" should be --mean--.

Col. 20, line 61, "means" should be --mean--.

UNITED STATES PATENT AND TRADEMARK OFFICE
CERTIFICATE OF CORRECTION

PATENT NO. : 5,194,950

DATED : March 16, 1993

INVENTOR(S) : Murakami et al.

It is certified that error appears in the above-identified patent and that said Letters Patent is hereby corrected as shown below:

Col. 21, line 22, "$(I \neq i)$" should be --$(\forall \neq i)$--

Col. 22, line 68, "$s$" should be --$\underline{s}$--.

Col. 27, line 36, "inputted" should be --inputted,--.

Col. 31, line 41, delete "10" and insert a period.

Col. 31, line 59, "68" should be --668--.

Col. 32, line 54, "$L_1$" should be --$l_1$--.

Col. 32, line 63, after "8" insert --Kbps--.

UNITED STATES PATENT AND TRADEMARK OFFICE
CERTIFICATE OF CORRECTION

PATENT NO. : 5,194,950

DATED : March 16, 1993

INVENTOR(S) : Murakami et al.

It is certified that error appears in the above-identified patent and that said Letters Patent is hereby corrected as shown below:

Col. 33, line 18, after "of" insert --1.-- and do not start a new paragraph.

Col. 39, line 5, "al" should be --$a_1$--.

Col. 47, line 43 (Claim 1), "means" should be --mean--.

Col. 51, line 21 (Claim 11), delete "the" and "receiving, signals" should be --receiving signals,--.

Signed and Sealed this

Eighteenth Day of January, 1994

Attest:

BRUCE LEHMAN

*Attesting Officer*  *Commissioner of Patents and Trademarks*